US012803590B2

(12) United States Patent
Chen et al.

(10) Patent No.: US 12,803,590 B2
(45) Date of Patent: Nov. 17, 2026

(54) ULTRA-HIGH RELIABILITY (UHR) SIGNALING DESIGN

(71) Applicant: QUALCOMM Incorporated, San Diego, CA (US)

(72) Inventors: Jialing Li Chen, San Diego, CA (US); Sameer Vermani, San Diego, CA (US); Lin Yang, San Diego, CA (US); Bin Tian, San Diego, CA (US); Youhan Kim, Saratoga, CA (US)

(73) Assignee: QUALCOMM Incorporated, San Diego, CA (US)

(*) Notice: Subject to any disclaimer, the term of this patent is extended or adjusted under 35 U.S.C. 154(b) by 17 days.

(21) Appl. No.: 18/765,031

(22) Filed: Jul. 5, 2024

(65) Prior Publication Data

US 2026/0012288 A1 Jan. 8, 2026

(51) Int. Cl.
*H04L 1/00* (2006.01)
*H03M 13/11* (2006.01)

(52) U.S. Cl.
CPC ....... *H03M 13/1102* (2013.01); *H04L 1/0041* (2013.01); *H04L 1/0056* (2013.01); *H04L 1/0057* (2013.01)

(58) Field of Classification Search
CPC ......... H04L 1/003; H04L 1/0005; H04L 1/08; H04L 1/0011; H04L 1/0041; H04L 1/0056; H04L 1/0057; H04L 1/0061; H03M 13/03; H03M 13/1102; H03M 13/2906
See application file for complete search history.

(56) References Cited

U.S. PATENT DOCUMENTS

2012/0051312 A1 3/2012 Noh et al.
2019/0036583 A1 1/2019 Cherian et al.
2021/0045151 A1* 2/2021 Chen .................. H04L 27/2602
(Continued)

OTHER PUBLICATIONS

Chen A (Qualcomm)., et al., "Unequal Modulation in MIMO TxBP and New MCS for 11bn", IEEE 802.11-24/0498r0, 11-24-0498-00-00BN-Unequal-Modulation-In-MIMO-TXBP-and-New-MCS-for-11BN, IEEE-SA Mentor, Piscataway, NJ, USA, vol. 802.11 UHR, 802.11bn, Mar. 12, 2024, pp. 1-35, XP068276080, pp. 1-35, The Whole Document.
(Continued)

*Primary Examiner* — Shelly A Chase
(74) *Attorney, Agent, or Firm* — Holland & Hart LLP

(57) ABSTRACT

This disclosure provides methods, components, devices, and systems for ultra-high reliability (UHR) signaling design. Some aspects more specifically relate to an access point (AP) transmitting a frame including a user info field to a wireless station (STA), where the user info field supports UHR parameters. The user info field may include a subfield indicating a coding scheme for communications, where the subfield includes at least two bits to support at least three coding scheme options. Additionally, or alternatively, the AP may transmit a trigger frame indicating for one or more STAs to communicate via distributed resource units (RUs). The AP may arrange the user info fields in the trigger frame to implicitly indicate respective global cyclic shift delay (CSD) indexes to the STAs. A STA receiving the trigger frame may determine a global CSD index corresponding to the STA according to the order of the user info fields.

14 Claims, 15 Drawing Sheets

(56) References Cited

U.S. PATENT DOCUMENTS

| | | | |
|---|---|---|---|
| 2023/0069075 A1 | 3/2023 | Yang et al. | |
| 2023/0124579 A1 | 4/2023 | Yang et al. | |
| 2024/0048271 A1 | 2/2024 | Fang et al. | |
| 2024/0064811 A1 | 2/2024 | Klein et al. | |
| 2024/0204907 A1 | 6/2024 | Song et al. | |
| 2024/0283561 A1* | 8/2024 | Song | H04L 67/60 |
| 2025/0031255 A1 | 1/2025 | Hou et al. | |
| 2026/0012320 A1 | 1/2026 | Chen et al. | |
| 2026/0012853 A1 | 1/2026 | Chen et al. | |
| 2026/0012854 A1 | 1/2026 | Chen et al. | |

OTHER PUBLICATIONS

Partial International Search Report PCT/US2025/033788 ISA/EPO Oct. 16, 2025 (2405542WO).
Chen A., et al., (QUALCOMM): "Unequal Modulation in MIMO TxBF and New MCS for llbn", IEEE 802.11-24/0498r0, IEEE-SA Mentor, Piscataway, NJ USA, vol. 802.11 UHR, 802.llbn, Mar. 12, 2024, pp. 1-35, XP068276080.
International Search Report and Written Opinion—PCT/US2025/033788—ISA/EPO—Dec. 23, 2025 (2405542WO).

* cited by examiner

1100

1300

ULTRA-HIGH RELIABILITY (UHR) SIGNALING DESIGN

TECHNICAL FIELD

This disclosure relates generally to wireless communication and, more specifically, to ultra-high reliability (UHR) signaling design.

DESCRIPTION OF THE RELATED TECHNOLOGY

Wireless communication networks may include various types of wireless communication devices including network entities (such as wireless access points (AP) or base stations (BS)), client devices (such as wireless stations (STAs) or user equipment (UEs)), and other wireless nodes. These wireless communication devices may communicate with one another via a variety of technologies and wireless communication protocols, including wireless local area network (WLAN) or Wi-Fi-based protocols or cellular (such as 4G, 5G, or 6G)-based protocols. The wireless communication networks may be capable of supporting communication with multiple users by sharing the available system resources (such as time, frequency, and spatial resources). To enable features or provide improved performance, the wireless communication devices may employ technologies such as orthogonal frequency divisional multiple access (OFDMA), multi-user Multiple-Input Multiple-Output (MU-MIMO), spatial multiplexing, and beamforming. For greater inter-operability, the wireless communication networks may support backwards compatibility (such as supporting legacy wireless communication devices) as well as forward compatibility (such as supporting communication with wireless communication devices compatible with next-generation wireless communication standards).

SUMMARY

The systems, methods, and devices of this disclosure each have several innovative aspects, no single one of which is solely responsible for the desirable attributes disclosed herein.

One innovative aspect of the subject matter described in this disclosure can be implemented in a first wireless communication device. The first wireless communication device may include a processing system that includes processor circuitry and memory circuitry that stores code. The processing system may be configured to cause the first wireless communication device to receive, via a subfield of a user info field associated with the first wireless communication device, information indicative of a coding scheme for communication between the first wireless communication device and a second wireless communication device, the subfield including at least two bits supporting at least three coding scheme options. The processing system may be further configured to cause the first wireless communication device to communicate with the second wireless communication device in accordance with the coding scheme.

Another innovative aspect of the subject matter described in this disclosure can be implemented in a method for wireless communication by a first wireless communication device. The method may include receiving, via a subfield of a user info field associated with the first wireless communication device, information indicative of a coding scheme for communication between the first wireless communication device and a second wireless communication device, the subfield including at least two bits supporting at least three coding scheme options. The method may further include communicating with the second wireless communication device in accordance with the coding scheme.

Another innovative aspect of the subject matter described in this disclosure can be implemented in a first wireless communication device. The first wireless communication device may include means for receiving, via a subfield of a user info field associated with the first wireless communication device, information indicative of a coding scheme for communication between the first wireless communication device and a second wireless communication device, the subfield including at least two bits supporting at least three coding scheme options. The first wireless communication device may further include means for communicating with the second wireless communication device in accordance with the coding scheme.

Another innovative aspect of the subject matter described in this disclosure can be implemented in a non-transitory computer-readable medium storing code for wireless communication. The code may include instructions executable by one or more processors to receive, via a subfield of a user info field associated with the first wireless communication device, information indicative of a coding scheme for communication between the first wireless communication device and a second wireless communication device, the subfield including at least two bits supporting at least three coding scheme options. The code may include instructions further executable by the one or more processors to communicate with the second wireless communication device in accordance with the coding scheme.

In some examples of the method, first wireless communication devices, and non-transitory computer-readable medium described herein, the at least three coding scheme options include a binary convolutional coding (BCC) scheme, a 2× low-density parity-check (LDPC) coding scheme, and another LDPC coding scheme.

Some examples of the method, first wireless communication devices, and non-transitory computer-readable medium described herein may further include operations, features, means, or instructions for receiving, via one or more subfields of the user info field, further information indicative of one or both of a transmission mode and a modulation pattern, the one or more subfields including at least the subfield, where the communicating may be further in accordance with the one or both of the transmission mode and the modulation pattern.

Some examples of the method, first wireless communication devices, and non-transitory computer-readable medium described herein may further include operations, features, means, or instructions for receiving, via one or more subfields of the user info field, further information indicative of one or more of a quantity of spatial streams, a transmission mode, and a modulation pattern, the one or more subfields being distinct from the subfield, where the transmission mode indicates beamformed transmission, non-beamformed transmission, equal modulation (EQM), unequal modulation (UEQM), or any combination thereof, and where the communicating may be further in accordance with the one or more of the quantity of spatial streams, the transmission mode, and the modulation pattern.

Another innovative aspect of the subject matter described in this disclosure can be implemented in a first wireless communication device. The first wireless communication device may include a processing system that includes processor circuitry and memory circuitry that stores code. The processing system may be configured to cause the first wireless communication device to receive a trigger frame including a set of multiple user info fields associated with a set of multiple respective wireless communication devices including at least the first wireless communication device, an order of the set of multiple user info fields in the trigger frame indicative of respective global cyclic shift delay (CSD) indexes for the set of multiple respective wireless communication devices in accordance with the set of multiple respective wireless communication devices being associated with one or more distributed resource units (dRUs). The processing system may be further configured to cause the first wireless communication device to transmit a trigger-based (TB) physical layer protocol data unit (PPDU) in accordance with the trigger frame and transmit a signal via at least one dRU of the one or more dRUs in accordance with a first global CSD index, of the respective global CSD indexes, associated with the first wireless communication device in accordance with the order of the set of multiple user info fields.

Another innovative aspect of the subject matter described in this disclosure can be implemented in a method for wireless communication by a first wireless communication device. The method may include receiving a trigger frame including a set of multiple user info fields associated with a set of multiple respective wireless communication devices including at least the first wireless communication device, an order of the set of multiple user info fields in the trigger frame indicative of respective global CSD indexes for the set of multiple respective wireless communication devices in accordance with the set of multiple respective wireless communication devices being associated with one or more dRUs. The method may further include transmitting a TB PPDU in accordance with the trigger frame and transmitting a signal via at least one dRU of the one or more dRUs in accordance with a first global CSD index, of the respective global CSD indexes, associated with the first wireless communication device in accordance with the order of the set of multiple user info fields.

Another innovative aspect of the subject matter described in this disclosure can be implemented in a first wireless communication device. The first wireless communication device may include means for receiving a trigger frame including a set of multiple user info fields associated with a set of multiple respective wireless communication devices including at least the first wireless communication device, an order of the set of multiple user info fields in the trigger frame indicative of respective global CSD indexes for the set of multiple respective wireless communication devices in accordance with the set of multiple respective wireless communication devices being associated with one or more dRUs. The first wireless communication device may further include means for transmitting a TB PPDU in accordance with the trigger frame and means for transmitting a signal via at least one dRU of the one or more dRUs in accordance with a first global CSD index, of the respective global CSD indexes, associated with the first wireless communication device in accordance with the order of the set of multiple user info fields.

Another innovative aspect of the subject matter described in this disclosure can be implemented in a non-transitory computer-readable medium storing code for wireless communication. The code may include instructions executable by one or more processors to receive a trigger frame including a set of multiple user info fields associated with a set of multiple respective wireless communication devices including at least the first wireless communication device, an order of the set of multiple user info fields in the trigger frame indicative of respective global CSD indexes for the set of multiple respective wireless communication devices in accordance with the set of multiple respective wireless communication devices being associated with one or more dRUs. The code may include instructions further executable by the one or more processors to transmit a TB PPDU in accordance with the trigger frame and transmit a signal via at least one dRU of the one or more dRUs in accordance with a first global CSD index, of the respective global CSD indexes, associated with the first wireless communication device in accordance with the order of the set of multiple user info fields.

In some examples of the method, first wireless communication devices, and non-transitory computer-readable medium described herein, a combination of the order of the set of multiple user info fields in the trigger frame and one or both of distribution bandwidth information or a value of a global CSD information subfield may be indicative of the respective global CSD indexes for the set of multiple respective wireless communication devices.

Another innovative aspect of the subject matter described in this disclosure can be implemented in a first wireless communication device. The first wireless communication device may include a processing system that includes processor circuitry and memory circuitry that stores code. The processing system may be configured to cause the first wireless communication device to transmit, via a subfield of a user info field associated with a second wireless communication device, information indicative of a coding scheme for communication between the first wireless communication device and the second wireless communication device, the subfield including at least two bits supporting at least three coding scheme options. The processing system may be further configured to cause the first wireless communication device to communicate with the second wireless communication device in accordance with the coding scheme.

Another innovative aspect of the subject matter described in this disclosure can be implemented in a method for wireless communication by a first wireless communication device. The method may include transmitting, via a subfield of a user info field associated with a second wireless communication device, information indicative of a coding scheme for communication between the first wireless communication device and the second wireless communication device, the subfield including at least two bits supporting at least three coding scheme options. The method may further include communicating with the second wireless communication device in accordance with the coding scheme.

Another innovative aspect of the subject matter described in this disclosure can be implemented in a first wireless communication device. The first wireless communication device may include means for transmitting, via a subfield of a user info field associated with a second wireless communication device, information indicative of a coding scheme for communication between the first wireless communication device and the second wireless communication device, the subfield including at least two bits supporting at least three coding scheme options. The first wireless communication device may further include means for communicating with the second wireless communication device in accordance with the coding scheme.

Another innovative aspect of the subject matter described in this disclosure can be implemented in a non-transitory computer-readable medium storing code for wireless communication. The code may include instructions executable by one or more processors to transmit, via a subfield of a user info field associated with a second wireless communication device, information indicative of a coding scheme for communication between the first wireless communication device and the second wireless communication device, the subfield including at least two bits supporting at least three coding scheme options. The code may include instructions further executable by the one or more processors to communicate with the second wireless communication device in accordance with the coding scheme.

In some examples of the method, first wireless communication devices, and non-transitory computer-readable medium described herein, the at least three coding scheme options include a BCC scheme, a 2×LDPC coding scheme, and another LDPC coding scheme.

Some examples of the method, first wireless communication devices, and non-transitory computer-readable medium described herein may further include operations, features, means, or instructions for transmitting, via a second subfield of a second user info field associated with a third wireless communication device, second information indicative of a second coding scheme for communication between the first wireless communication device and the third wireless communication device, the second subfield including one bit supporting two coding scheme options in accordance with a resource unit (RU) size for the communication between the first wireless communication device and the third wireless communication device satisfying a threshold RU size.

Some examples of the method, first wireless communication devices, and non-transitory computer-readable medium described herein may further include operations, features, means, or instructions for transmitting, via one or more subfields of the user info field, further information indicative of one or both of a transmission mode and a modulation pattern, the one or more subfields including at least the subfield, where the communicating may be further in accordance with the one or both of the transmission mode and the modulation pattern.

Some examples of the method, first wireless communication devices, and non-transitory computer-readable medium described herein may further include operations, features, means, or instructions for transmitting, via one or more subfields of the user info field, further information indicative of one or more of a quantity of spatial streams, a transmission mode, and a modulation pattern, the one or more subfields being distinct from the subfield, where the transmission mode indicates beamformed transmission, non-beamformed transmission, EQM, UEQM, or any combination thereof, and where the communicating may be further in accordance with the one or more of the quantity of spatial streams, the transmission mode, and the modulation pattern.

Another innovative aspect of the subject matter described in this disclosure can be implemented in a first wireless communication device. The first wireless communication device may include a processing system that includes processor circuitry and memory circuitry that stores code. The processing system may be configured to cause the first wireless communication device to transmit a trigger frame including a set of multiple user info fields associated with a set of multiple respective wireless communication devices, an order of the set of multiple user info fields in the trigger frame indicative of respective global CSD indexes for the set of multiple respective wireless communication devices in accordance with the set of multiple respective wireless communication devices being associated with one or more dRUs. The processing system may be further configured to cause the first wireless communication device to receive a set of multiple TB PPDUs corresponding to the set of multiple respective wireless communication devices in accordance with the trigger frame and receive one or more signals from the set of multiple respective wireless communication devices via the one or more dRUs in accordance with the respective global CSD indexes.

Another innovative aspect of the subject matter described in this disclosure can be implemented in a method for wireless communication by a first wireless communication device. The method may include transmitting a trigger frame including a set of multiple user info fields associated with a set of multiple respective wireless communication devices, an order of the set of multiple user info fields in the trigger frame indicative of respective global CSD indexes for the set of multiple respective wireless communication devices in accordance with the set of multiple respective wireless communication devices being associated with one or more dRUs. The method may further include receiving a set of multiple TB PPDUs corresponding to the set of multiple respective wireless communication devices in accordance with the trigger frame and receiving one or more signals from the set of multiple respective wireless communication devices via the one or more dRUs in accordance with the respective global CSD indexes.

Another innovative aspect of the subject matter described in this disclosure can be implemented in a first wireless communication device. The first wireless communication device may include means for transmitting a trigger frame including a set of multiple user info fields associated with a set of multiple respective wireless communication devices, an order of the set of multiple user info fields in the trigger frame indicative of respective global CSD indexes for the set of multiple respective wireless communication devices in accordance with the set of multiple respective wireless communication devices being associated with one or more dRUs. The first wireless communication device may further include means for receiving a set of multiple TB PPDUs corresponding to the set of multiple respective wireless communication devices in accordance with the trigger frame and means for receiving one or more signals from the set of multiple respective wireless communication devices via the one or more dRUs in accordance with the respective global CSD indexes.

Another innovative aspect of the subject matter described in this disclosure can be implemented in a non-transitory computer-readable medium storing code for wireless communication. The code may include instructions executable by one or more processors to transmit a trigger frame including a set of multiple user info fields associated with a set of multiple respective wireless communication devices, an order of the set of multiple user info fields in the trigger frame indicative of respective global CSD indexes for the set of multiple respective wireless communication devices in accordance with the set of multiple respective wireless communication devices being associated with one or more dRUs. The code may include instructions further executable by the one or more processors to receive a set of multiple TB PPDUs corresponding to the set of multiple respective wireless communication devices in accordance with the trigger frame and receive one or more signals from the set of multiple respective wireless communication devices via the one or more dRUs in accordance with the respective global CSD indexes.

In some examples of the method, first wireless communication devices, and non-transitory computer-readable medium described herein, a combination of the order of the set of multiple user info fields in the trigger frame and one or both of distribution bandwidth information or a value of a global CSD information subfield may be indicative of the respective global CSD indexes for the set of multiple respective wireless communication devices.

Some examples of the method, first wireless communication devices, and non-transitory computer-readable medium described herein may further include operations, features, means, or instructions for assigning a first global CSD index to a second wireless communication device of the set of multiple respective wireless communication devices, where a first user info field, of the set of multiple user info fields, associated with the second wireless communication device may be arranged in accordance with the first global CSD index.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
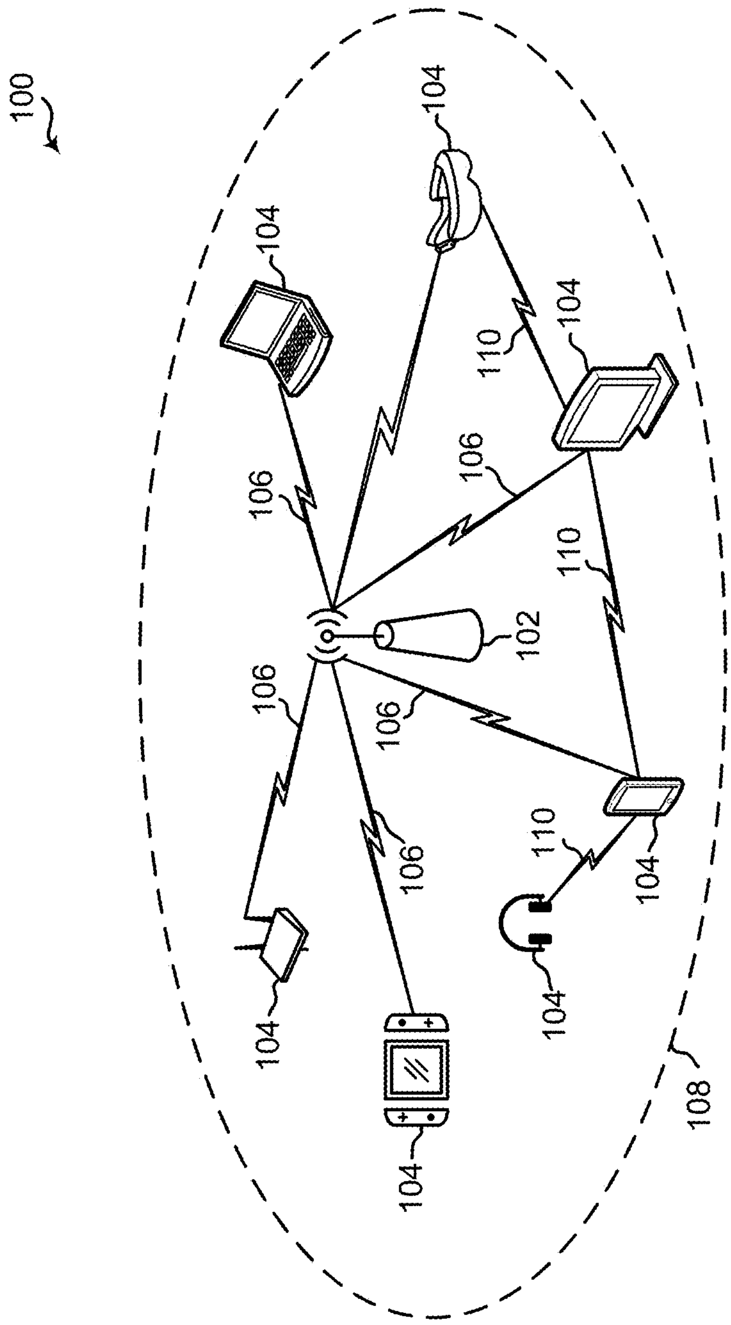
FIG. 1 shows a pictorial diagram of an example wireless communication network.

The following description is directed to some particular examples for the purposes of describing innovative aspects of this disclosure. However, a person having ordinary skill in the art will readily recognize that the teachings herein can be applied in a multitude of different ways. Some or all of the described examples may be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G, 5G (New Radio (NR)) or 6G standards promulgated by the 3rd Generation Partnership Project (3GPP), among others.

The described examples can be implemented in any suitable device, component, system or network that is capable of transmitting and receiving RF signals according to one or more of the following technologies or techniques: code division multiple access (CDMA), time division multiple access (TDMA), orthogonal frequency division multiplexing (OFDM), frequency division multiple access (FDMA), orthogonal FDMA (OFDMA), single-carrier FDMA (SC-FDMA), spatial division multiple access (SDMA), rate-splitting multiple access (RSMA), multi-user shared access (MUSA), single-user (SU) multiple-input multiple-output (MIMO) and multi-user (MU)-MIMO (MU-MIMO). The described examples also can be implemented using other wireless communication protocols or RF signals suitable for use in one or more of a wireless personal area network (WPAN), a wireless local area network (WLAN), a wireless wide area network (WWAN), a wireless metropolitan area network (WMAN), a non-terrestrial network (NTN), or an internet of things (IoT) network.

Some wireless communication networks may support ultra-high reliability (UHR) communications. UHR communications may support additional parameters and signaling flexibility as compared to extremely high throughput (EHT) communications. For example, UHR may support additional modulation and coding scheme (MCS) values, coding schemes, modulation techniques, spatial flexibility, distributed resource unit (RU) signaling, or any combination thereof as compared to EHT.

Various aspects relate generally to UHR signaling design to support UHR parameters. Some aspects more specifically relate to user info field design for UHR. In some examples, an access point (AP) may transmit a frame including one or more user info fields associated with one or more wireless stations (STAs). To support UHR parameters, a user info field may include a subfield indicating a coding scheme for UHR communications for a corresponding STA. The subfield may include at least two bits to support at least three coding scheme options. For example, the subfield may support indicating a binary convolutional coding (BCC) scheme, a 2× low-density parity-check (LDPC) coding scheme, or another LDPC coding scheme. In some examples, the 2×LDPC coding scheme may support a relatively larger nominal codeword size than the other LDPC coding scheme. Additionally, or alternatively, the user info field may indicate an MCS value, a spatial configuration, a quantity of spatial streams, a modulation pattern, a transmit beamforming configuration, or any combination thereof for the corresponding STA. In some examples, the UHR signaling design may leverage implicit relationships between UHR parameters. For example, UHR communications modulated using unequal modulation (UEQM) may be beamformed communications encoded according to an LDPC coding scheme. The UHR signaling design may support user info subfields based on this relationship between UEQM, transmit beamforming, and LDPC coding. Additionally, or alternatively, an AP may transmit a trigger frame to one or more STAs configuring the STAs for dRU operation. The AP may arrange the user info fields in the trigger frame to implicitly indicate respective global cyclic shift delay (CSD) indexes to the corresponding STAs. For example, a STA receiving the trigger frame may determine a global CSD index assigned to the STA according to a location of the STA's user info field in the trigger frame. The STA may use the assigned global CSD index for uplink signaling via a dRU for the STA.

Particular aspects of the subject matter described in this disclosure can be implemented to realize one or more of the following potential advantages. In some examples, by using a two-bit subfield indicating a coding scheme, the described techniques can be used to improve coding flexibility for UHR communications. For example, the two-bit coding subfield may support relatively more coding schemes than a 1-bit coding subfield (such as in EHT signaling). Additionally, or alternatively, by leveraging implicit relationships between UHR parameters, the AP and STAs may reduce a signaling overhead associated with UHR signaling. For example, if the AP includes an indication of UEQM in a user info field, the AP may refrain from using additional bits to indicate beamforming information or coding information based on UEQM corresponding to transmit beamforming and LDPC coding. In some examples, by using the order of user info fields in a trigger frame for dRU to implicitly indicate global CSD indexes, the described techniques can be used to improve a signaling overhead associated with dRU allocation. For example, rather than include additional bits to indicate global CSD indexes, the AP may arrange the user info fields to implicitly indicate the global CSD indexes, reducing the signaling overhead and improving the coordination between the AP and STAs performing dRU communications. The UHR signaling designs may improve coordination between devices, such as between the AP and one or more STAs, by supporting communication of additional UHR parameters and features.

FIG. 1 shows a pictorial diagram of an example wireless communication network 100. According to some aspects, the wireless communication network 100 can be an example of a wireless local area network (WLAN) such as a Wi-Fi network. For example, the wireless communication network 100 can be a network implementing at least one of the IEEE 802.11 family of wireless communication protocol standards, such as defined by the IEEE 802.11-2020 specification or amendments thereof (including, but not limited to, 802.11ay, 802.11ax (also referred to as Wi-Fi 6), 802.11az, 802.11ba, 802.11bc, 802.11bd, 802.11be (also referred to as Wi-Fi 7), 802.11bf, and 802.11bn (also referred to as Wi-Fi 8)) or other WLAN or Wi-Fi standards, such as that associated with the Integrated Millimeter Wave (IMMW) study group. In some other examples, the wireless communication network 100 can be an example of a cellular radio access network (RAN), such as a 5G or 6G RAN that implements one or more cellular protocols such as those specified in one or more 3GPP standards. In some other examples, the wireless communication network 100 can include a WLAN that functions in an interoperable or converged manner with one or more cellular RANs to provide greater or enhanced network coverage to wireless communication devices within the wireless communication network 100 or to enable such devices to connect to a cellular network's core, such as to access the network management capabilities and functionality offered by the cellular network core. In some other examples, the wireless communication network 100 can include a WLAN that functions in an interoperable or converged manner with one or more personal area networks, such as a network implementing Bluetooth or other wireless technologies, to provide greater or enhanced network coverage or to provide or enable other capabilities, functionality, applications or services.

The wireless communication network 100 may include numerous wireless communication devices including a wireless AP 102 and any number of STAs 104. While only one AP 102 is shown in FIG. 1, the wireless communication network 100 can include multiple APs 102 (for example, in an extended service set (ESS) deployment, enterprise network or AP mesh network), or may not include any AP at all (for example, in an independent basic service set (IBSS) such as a peer-to-peer (P2P) network or other ad hoc network). The AP 102 can be or represent various different types of network entities including, but not limited to, a home networking AP, an enterprise-level AP, a single-frequency AP, a dual-band simultaneous (DBS) AP, a tri-band simultaneous (TBS) AP, a standalone AP, a non-standalone AP, a software-enabled AP (soft AP), and a multi-link AP (also referred to as an AP multi-link device (MLD)), as well as cellular (such as 3GPP, 4G LTE, 5G or 6G) base stations or other cellular network nodes such as a Node B, an evolved Node B (eNB), a gNB, a transmission reception point (TRP) or another type of device or equipment included in a radio access network (RAN), including Open-RAN (O-RAN) network entities, such as a central unit (CU), a distributed unit (DU) or a radio unit (RU).

Each of the STAs 104 also may be referred to as a mobile station (MS), a mobile device, a mobile handset, a wireless handset, an access terminal (AT), a user equipment (UE), a subscriber station (SS), or a subscriber unit, among other examples. The STAs 104 may represent various devices such as mobile phones, other handheld or wearable communication devices, netbooks, notebook computers, tablet computers, laptops, Chromebooks, augmented reality (AR), virtual reality (VR), mixed reality (MR) or extended reality (XR) wireless headsets or other peripheral devices, wireless earbuds, other wearable devices, display devices (for example, TVs, computer monitors or video gaming consoles), video game controllers, navigation systems, music or other audio or stereo devices, remote control devices, printers, kitchen appliances (including smart refrigerators) or other household appliances, key fobs (for example, for passive keyless entry and start (PKES) systems), Internet of Things (IoT) devices, and vehicles, among other examples.

A single AP 102 and an associated set of STAs 104 may be referred to as an infrastructure basic service set (BSS), which is managed by the respective AP 102. FIG. 1 additionally shows an example coverage area 108 of the AP 102, which may represent a basic service area (BSA) of the wireless communication network 100. The BSS may be identified by STAs 104 and other devices by a service set identifier (SSID), as well as a basic service set identifier (BSSID), which may be a medium access control (MAC) address of the AP 102. The AP 102 may periodically broadcast beacon frames ("beacons") including the BSSID to enable any STAs 104 within wireless range of the AP 102 to "associate" or re-associate with the AP 102 to establish a respective communication link 106 (hereinafter also referred to as a "Wi-Fi link"), or to maintain a communication link 106, with the AP 102. For example, the beacons can include an identification or indication of a primary channel used by the respective AP 102 as well as a timing synchronization function (TSF) for establishing or maintaining timing synchronization with the AP 102. The AP 102 may provide access to external networks to various STAs 104 in the wireless communication network 100 via respective communication links 106.

To establish a communication link 106 with an AP 102, each of the STAs 104 is configured to perform passive or active scanning operations ("scans") on frequency channels in one or more frequency bands (for example, the 2.4 GHZ, 5 GHZ, 6 GHz, 45 GHz, or 60 GHz bands). To perform passive scanning, a STA 104 listens for beacons, which are transmitted by respective APs 102 at periodic time intervals referred to as target beacon transmission times (TBTTs). To perform active scanning, a STA 104 generates and sequentially transmits probe requests on each channel to be scanned and listens for probe responses from APs 102. Each STA 104 may identify, determine, ascertain, or select an AP 102 with which to associate in accordance with the scanning information obtained through the passive or active scans, and to perform authentication and association operations to establish a communication link 106 with the selected AP 102. The selected AP 102 assigns an association identifier (AID) to the STA 104 at the culmination of the association operations, which the AP 102 uses to track the STA 104.

As a result of the increasing ubiquity of wireless networks, a STA 104 may have the opportunity to select one of many BSSs within range of the STA 104 or to select among multiple APs 102 that together form an ESS including multiple connected BSSs. For example, the wireless communication network 100 may be connected to a wired or wireless distribution system that may enable multiple APs 102 to be connected in such an ESS. As such, a STA 104 can be covered by more than one AP 102 and can associate with different APs 102 at different times for different transmissions. Additionally, after association with an AP 102, a STA 104 also may periodically scan its surroundings to find a more suitable AP 102 with which to associate. For example, a STA 104 that is moving relative to its associated AP 102 may perform a "roaming" scan to find another AP 102 having more desirable network characteristics such as a greater received signal strength indicator (RSSI) or a reduced traffic load.

In some examples, STAs 104 may form networks without APs 102 or other equipment other than the STAs 104 themselves. One example of such a network is an ad hoc network (or wireless ad hoc network). Ad hoc networks may alternatively be referred to as mesh networks or P2P networks. In some examples, ad hoc networks may be implemented within a larger network such as the wireless communication network 100. In such examples, while the STAs 104 may be capable of communicating with each other through the AP 102 using communication links 106, STAs 104 also can communicate directly with each other via direct wireless communication links 110. Additionally, two STAs 104 may communicate via a direct wireless communication link 110 regardless of whether both STAs 104 are associated with and served by the same AP 102. In such an ad hoc system, one or more of the STAs 104 may assume the role filled by the AP 102 in a BSS. Such a STA 104 may be referred to as a group owner (GO) and may coordinate transmissions within the ad hoc network. Examples of direct wireless communication links 110 include Wi-Fi Direct connections, connections established by using a Wi-Fi Tunneled Direct Link Setup (TDLS) link, and other P2P group connections.

In some networks, the AP 102 or the STAs 104, or both, may support applications associated with high throughput or low-latency requirements, or may provide lossless audio to one or more other devices. For example, the AP 102 or the STAs 104 may support applications and use cases associated with ultra-low-latency (ULL), such as ULL gaming, or streaming lossless audio and video to one or more personal audio devices (such as peripheral devices) or AR/VR/MR/XR headset devices. In scenarios in which a user uses two or more peripheral devices, the AP 102 or the STAs 104 may support an extended personal audio network enabling communication with the two or more peripheral devices. Additionally, the AP 102 and STAs 104 may support additional ULL applications such as cloud-based applications (such as VR cloud gaming) that have ULL and high throughput requirements.

As indicated above, in some implementations, the AP 102 and the STAs 104 may function and communicate (via the respective communication links 106) according to one or more of the IEEE 802.11 family of wireless communication protocol standards. These standards define the WLAN radio and baseband protocols for the physical (PHY) and MAC layers. The AP 102 and STAs 104 transmit and receive wireless communications (hereinafter also referred to as "Wi-Fi communications" or "wireless packets") to and from one another in the form of PHY protocol data units (PPDUs).

Each PPDU is a composite structure that includes a PHY preamble and a payload that is in the form of a PHY service data unit (PSDU). The information provided in the preamble may be used by a receiving device to decode the subsequent data in the PSDU. In instances in which a PPDU is transmitted over a bonded or wideband channel, the preamble fields may be duplicated and transmitted in each of multiple component channels. The PHY preamble may include both a legacy portion (or "legacy preamble") and a non-legacy portion (or "non-legacy preamble"). The legacy preamble may be used for packet detection, automatic gain control and channel estimation, among other uses. The legacy preamble also may generally be used to maintain compatibility with legacy devices. The format of, coding of, and information provided in the non-legacy portion of the preamble is associated with the particular IEEE 802.11 wireless communication protocol to be used to transmit the payload.

The APs 102 and STAs 104 in the wireless communication network 100 may transmit PPDUs over an unlicensed spectrum, which may be a portion of spectrum that includes frequency bands traditionally used by Wi-Fi technology, such as the 2.4 GHZ, 5 GHZ, 6 GHZ, 45 GHz, and 60 GHz bands. Some examples of the APs 102 and STAs 104 described herein also may communicate in other frequency bands that may support licensed or unlicensed communications. For example, the APs 102 or STAs 104, or both, also may be capable of communicating over licensed operating bands, where multiple operators may have respective licenses to operate in the same or overlapping frequency ranges. Such licensed operating bands may map to or be associated with frequency range designations of FR1 (410 MHz-7.125 GHZ), FR2 (24.25 GHz-52.6 GHz), FR3 (7.125 GHz-24.25 GHz), FR4a or FR4-1 (52.6 GHz-71 GHz), FR4 (52.6 GHz-114.25 GHz), and FR5 (114.25 GHz-300 GHz).

Each of the frequency bands may include multiple subbands and frequency channels (also referred to as subchannels). The terms "channel" and "subchannel" may be used interchangeably herein, as each may refer to a portion of frequency spectrum within a frequency band (for example, a 20 MHz, 40 MHz, 80 MHz, or 160 MHz portion of frequency spectrum) via which communication between two or more wireless communication devices can occur. For example, PPDUs conforming to the IEEE 802.11n, 802.11ac, 802.11ax, 802.11be and 802.11bn standard amendments may be transmitted over one or more of the 2.4 GHz, 5 GHZ, or 6 GHz bands, each of which is divided into multiple 20 MHz channels. As such, these PPDUs are transmitted over a physical channel having a minimum bandwidth of 20 MHz, but larger channels can be formed through channel bonding. For example, PPDUs may be transmitted over physical channels having bandwidths of 40 MHz, 80 MHz, 160 MHz, 240 MHZ, 320 MHz, 480 MHz, or 640 MHz by bonding together multiple 20 MHz channels.

An AP 102 may determine or select an operating or operational bandwidth for the STAs 104 in its BSS and select a range of channels within a band to provide that operating bandwidth. For example, the AP 102 may select sixteen 20 MHz channels that collectively span an operating bandwidth of 320 MHz. Within the operating bandwidth, the AP 102 may typically select a single primary 20 MHz channel on which the AP 102 and the STAs 104 in its BSS monitor for contention-based access schemes. In some examples, the AP 102 or the STAs 104 may be capable of monitoring only a single primary 20 MHz channel for packet detection (for example, for detecting preambles of PPDUs). Conventionally, any transmission by an AP 102 or a STA 104 within a BSS must involve transmission on the primary 20 MHz channel. As such, in conventional systems, the transmitting device must contend on and win a TXOP on the primary channel to transmit anything at all. However, some APs 102 and STAs 104 supporting ultra-high reliability (UHR) communications or communication according to the IEEE 802.11bn standard amendment can be configured to operate, monitor, contend and communicate using multiple primary 20 MHz channels. Such monitoring of multiple primary 20 MHz channels may be sequential such that responsive to determining, ascertaining or detecting that a first primary 20 MHz channel is not available, a wireless communication device may switch to monitoring and contending using a second primary 20 MHz channel. Additionally, or alternatively, a wireless communication device may be configured to monitor multiple primary 20 MHz channels in parallel. In some examples, a first primary 20 MHz channel may be referred to as a main primary (M-Primary) channel and one or more additional, second primary channels may each be referred to as an opportunistic primary (O-Primary) channel. For example, if a wireless communication device measures, identifies, ascertains, detects, or otherwise determines that the M-Primary channel is busy or occupied (such as due to an overlapping BSS (OBSS) transmission), the wireless communication device may switch to monitoring and contending on an O-Primary channel. In some examples, the M-Primary channel may be used for beaconing and serving legacy client devices and an O-Primary channel may be specifically used by non-legacy (for example, UHR- or IEEE 802.11bn-compatible) devices for opportunistic access to spectrum that may be otherwise under-utilized.

The AP 102 and the STAs 104 of the wireless communication network 100 may implement technologies, protocols or procedures compliant with current and future generations of the IEEE 802.11 family of wireless communication protocol standards, such as Extremely High Throughput (EHT) operation defined by the IEEE 802.11be standard amendment and Ultra-High Reliability (UHR) operation defined by the IEEE 802.11bn standard amendments, to enable additional capabilities or features relative to previous generations, such as devices supporting only legacy operation such as Very High Throughput (VHT) operation defined by the 802.11ac standard amendment or High Efficiency (HE) operation defined by the IEEE 802.11ax standard amendment. For example, the IEEE 802.11be standard amendment introduced 320 MHz channels, which are twice as wide as those possible with the IEEE 802.11ax standard amendment. Accordingly, the AP 102 or the STAs 104 may use 320 MHz channels enabling double the throughput and network capacity, as well as providing rate versus range gains at high data rates due to linear bandwidth versus log SNR trade-off. EHT, UHR or other newer wireless communication protocols may support flexible operating bandwidth enhancements, such as broadened operating bandwidths relative to legacy operating bandwidths or more granular operation relative to legacy operation. For example, an EHT system may allow communications spanning operating bandwidths of 20 MHz, 40 MHz, 80 MHz, 160 MHz, 240 MHz, and 320 MHz while an UHR system may enable communications spanning even greater bandwidths, such as 480 MHz, 640 MHz or greater. EHT systems may, for example, support multiple bandwidth modes such as a contiguous 240 MHz bandwidth mode, a contiguous 320 MHz bandwidth mode, a noncontiguous 160+160 MHz bandwidth mode, or a noncontiguous 80+80+80+80 (or "4×80") MHz bandwidth mode.

In some examples in which a wireless communication device (such as the AP 102 or the STA 104) operates in a contiguous 320 MHz bandwidth mode or a 160+160 MHz bandwidth mode, signals for transmission may be generated by two different transmit chains of the wireless communication device each having or associated with a bandwidth of 160 MHz (and each coupled to a different power amplifier). In some other examples, two transmit chains can be used to support a 240 MHz/160+80 MHz bandwidth mode by puncturing 320 MHz/160+160 MHz bandwidth modes with one or more 80 MHz subchannels. For example, signals for transmission may be generated by two different transmit chains of the wireless communication device each having a bandwidth of 160 MHz with one of the transmit chains outputting a signal having an 80 MHz subchannel punctured therein. In some other examples in which the wireless communication device may operate in a contiguous 240 MHz bandwidth mode, or a noncontiguous 160+80 MHz bandwidth mode, the signals for transmission may be generated by three different transmit chains of the wireless communication device, each having a bandwidth of 80 MHz. In some other examples, signals for transmission may be generated by four or more different transmit chains of the wireless communication device, each having a bandwidth of 80 MHz.

In noncontiguous examples, the operating bandwidth may span one or more disparate sub-channel sets. For example, the 320 MHz bandwidth may be contiguous and located in the same 6 GHz band or noncontiguous and located in different bands or regions within a band (such as partly in the 5 GHz band and partly in the 6 GHz band).

In some examples, the AP 102 or the STA 104 may benefit from operability enhancements associated with EHT, UHR and newer generations of the IEEE 802.11 family of wireless communication protocol standards. For example, the AP 102 or the STA 104 attempting to gain access to the wireless medium of the wireless communication network 100 may perform techniques (which may include modifications to existing rules, structure, or signaling implemented for legacy systems) such as clear channel assessment (CCA) operation based on EHT or UHR enhancements such as increased bandwidth, puncturing, or refinements to carrier sensing and signal reporting mechanisms.

Transmitting and receiving devices AP 102 and STA 104 may support the use of various MCSs to transmit and receive data in the wireless communication network 100 so as to optimally take advantage of wireless channel conditions, for example, to increase throughput, reduce latency, or enforce various quality of service (QoS) parameters. For example, existing technology (such as IEEE 802.11ax standard amendment protocols) supports the use of up to 1024-QAM, where a modulated symbol carries 10 bits. To further improve peak data rate, each of the AP 102 or the STA 104 may employ use of 4096-QAM (also referred to as "4k QAM"), which enables a modulated symbol to carry 12 bits. 4k QAM may enable massive peak throughput with a maximum theoretical PHY rate of 10 bps/Hz/subcarrier/spatial stream, which translates to 23 Gbps with 5/6 LDPC code (10 bps/Hz/subcarrier/spatial stream*996*4 subcarriers*8 spatial streams/13.6 us per OFDM symbol). The AP 102 or the STA 104 using 4096-QAM may enable a 20% increase in data rate compared to 1024-QAM given the same coding rate, allowing users to obtain higher transmission efficiency.

Figure 2:
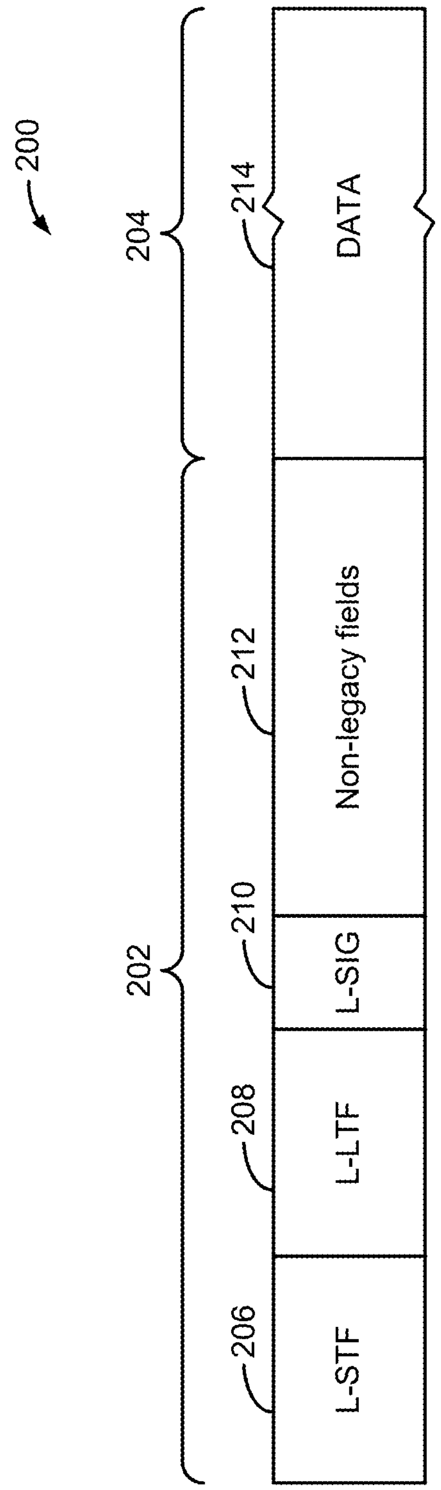
FIG. 2 shows an example protocol data unit (PDU) usable for communications between a wireless access point (AP) and one or more wireless stations (STAs).

FIG. 2 shows an example protocol data unit (PDU) 200 usable for wireless communication between a wireless AP and one or more wireless STAs. For example, the AP and STAs may be examples of the AP 102 and the STAs 104 described with reference to FIG. 1. The PDU 200 can be configured as a PPDU. As shown, the PDU 200 includes a PHY preamble 202 and a PHY payload 204. For example, the preamble 202 may include a legacy portion that itself includes a legacy short training field (L-STF) 206, which may consist of two symbols, a legacy long training field (L-LTF) 208, which may consist of two symbols, and a legacy signal field (L-SIG) 210, which may consist of two symbols. The legacy portion of the preamble 202 may be configured according to the IEEE 802.11a wireless communication protocol standard. The preamble 202 also may include a non-legacy portion including one or more non-legacy fields 212, for example, conforming to one or more of the IEEE 802.11 family of wireless communication protocol standards.

The L-STF 206 generally enables a receiving device (such as an AP 102 or a STA 104) to perform coarse timing and frequency tracking and automatic gain control (AGC). The L-LTF 208 generally enables the receiving device to perform fine timing and frequency tracking and also to perform an initial estimate of the wireless channel. The L-SIG 210 generally enables the receiving device to determine (for example, obtain, select, identify, detect, ascertain, calculate, or compute) a duration of the PDU and to use the determined duration to avoid transmitting on top of the PDU. The legacy portion of the preamble, including the L-STF 206, the L-LTF 208 and the L-SIG 210, may be modulated according to a binary phase shift keying (BPSK) modulation scheme. The payload 204 may be modulated according to a BPSK modulation scheme, a quadrature BPSK (Q-BPSK) modulation scheme, a quadrature amplitude modulation (QAM) modulation scheme, or another appropriate modulation scheme. The payload 204 may include a PSDU including a data field (DATA) 214 that, in turn, may carry higher layer data, for example, in the form of MAC protocol data units (MPDUs) or an aggregated MPDU (A-MPDU).

Figure 3:
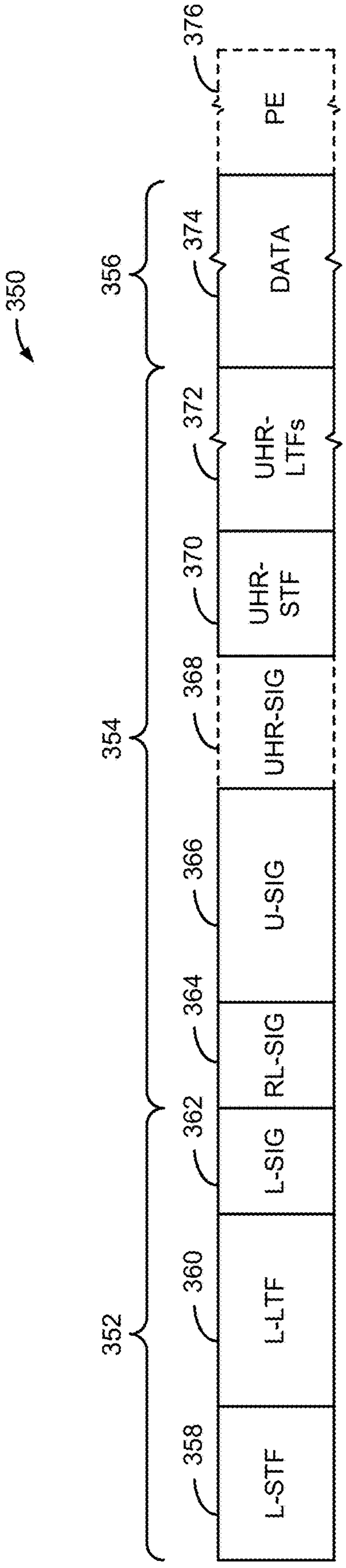
FIG. 3 shows an example physical layer (PHY) protocol data unit (PPDU) usable for communications between a wireless AP and one or more wireless STAs.

FIG. 3 shows an example physical layer (PHY) protocol data unit (PPDU) 350 usable for communications between a wireless AP and one or more wireless STAs. For example, the AP and STAs may be examples of the AP 102 and the STAs 104 described with reference to FIG. 1. As shown, the PPDU 350 includes a PHY preamble, that includes a legacy portion 352 and a non-legacy portion 354, and a payload 356 that includes a data field 374. In some examples, the PPDU 350 may include a packet extension (PE) field 376 appended at the end of the PPDU 350. The legacy portion 352 of the preamble includes an L-STF 358, an L-LTF 360, and an L-SIG 362. The non-legacy portion 354 of the preamble includes a repetition of L-SIG (RL-SIG) 364, a universal signal field 366 (referred to herein as "U-SIG 366"), and, in some examples, a UHR signal field 368 (referred to herein as "UHR-SIG 368"). In some implementations, the UHR signal field 368 may be present in a UHR MU PPDU, but may not be present in a UHR trigger-based (TB) PPDU. The presence of RL-SIG 364 and U-SIG 366 may indicate to UHR- or later version-compliant STAs 104 that the PPDU 350 is a UHR PPDU or a PPDU conforming to any later (post-UHR) version of a new wireless communication protocol conforming to a future IEEE 802.11 wireless communication protocol standard. One or both of U-SIG 366 and UHR-SIG 368 may be structured as, and carry version-dependent information for, other wireless communication protocol versions associated with amendments to the IEEE family of standards beyond UHR. For example, U-SIG 366 may be used by a receiving device (such as an AP 102 or a STA 104) to interpret bits in one or more of UHR-SIG 368 or the data field 374. U-SIG 366 may include one or more universal, version-independent fields and one or more version-dependent fields. Information in the universal fields may include, for example, a version identifier (starting from the IEEE 802.11be amendment and beyond) and channel occupancy and coexistence information (such as a punctured channel indication). The version-dependent fields may include format information fields used for interpreting other fields of U-SIG 366 and UHR-SIG 368 and additional information fields or SU-specific fields that may be useful to intended recipients. In some implementations, the version-dependent fields may include at least a PPDU format field to indicate a general PPDU format for the PPDU 350 (such as a TB, an SU, or an MU PPDU format). Like L-STF 358, L-LTF 360, and L-SIG 362, the information in U-SIG 366 and UHR-SIG 368 may be duplicated and transmitted in each of the component 20 MHz channels in instances involving the use of a bonded channel.

The non-legacy portion 354 further includes an additional short training field 370 (referred to herein as "UHR-STF 370," although it may be structured as, and carry version-dependent information for, other wireless communication protocol versions beyond UHR) and one or more additional long training fields 372 (referred to herein as "UHR-LTFs 372," although they may be structured as, and carry version-dependent information for, other wireless communication protocol versions beyond UHR). UHR-STF 370 may be used for timing and frequency tracking and AGC, and UHR-LTF 372 may be used for more refined channel estimation.

UHR-SIG 368 may be used by an AP 102 to identify and inform one or multiple STAs 104 that the AP 102 has scheduled uplink (UL) or downlink (DL) resources for them. UHR-SIG 368 may be decoded by each compatible STA 104 served by the AP 102. UHR-SIG 368 may generally be used by the receiving device to interpret bits in the data field 374. For example, UHR-SIG 368 may include resource unit (RU) allocation information, spatial stream configuration information, and per-user (for example, STA-specific) signaling information. Each UHR-SIG 368 may include a common field and at least one user-specific field. In the context of OFDMA, the common field can indicate RU distributions to multiple STAs 104, indicate the RU assignments in the frequency domain, indicate which RUs are allocated for MU-MIMO transmissions and which RUs correspond to OFDMA transmissions, and the number of users in allocations, among other examples. The user-specific fields are assigned to particular STAs 104 and carry STA-specific scheduling information such as user-specific MCS values and user-specific RU allocation information. Such information enables the respective STAs 104 to identify and decode corresponding RUs in the associated data field 374.

In some wireless communications systems, a STA 104 or an AP 102 may transmit the PPDU 350 over bandwidths larger than the 20 MHz, 40 MHz, 80 MHZ, 160 MHz, and 320 MHz bandwidths supported by previous generations of IEEE-compliant wireless communication systems. For example, the PPDU 350 may support 480 MHz or 640 MHz bandwidth communications. By increasing the channel bandwidth of the PPDU 350 to 480 MHz or 640 MHz, more data may be transmitted because more or larger RUs are available based on the larger bandwidth, and accordingly, higher peak throughput or increased capacity may be achieved. Parameters for assembling and transmitting the 480 MHz or 640 MHz PPDUs may be defined to account for the larger bandwidths. For example, parameters or designs such as tone plans, resource unit allocation indications, spatial reuse fields, UHR-STFs 370, UHR-LTFs 372, pilot signal locations, phase shifts, spectral masks, or any combination thereof may be optimized or otherwise selected in accordance with the 480 MHz or 640 MHz bandwidths. In some examples, the spatial reuse fields may enable multiple BSSs to operate via the same 480 MHz or 640 MHz bandwidth channels.

In some examples, UHR-capable STAs 104 and APs 102 may support unequal modulation (UEQM) techniques (also referred to as unequal quadrature amplitude modulation (QAM)) with joint encoding across multiple streams for MIMO communications. For example, while different data streams may be transmitted using different spatial streams, or different resource units (RUs), or both, different spatial streams or RUs may be associated with different levels of quality (such as a different signal to noise ratios (SNRs)), and it may be advantageous to use different (unequal) MCSs for different spatial streams or RUs.

To support UEQM, an AP 102 may transmit signaling that indicates unequal MCSs across spatial streams or RUs to multiple STAs 104. For example, the AP 102 may transmit an MCS configuration message, which may be an example of a PHY preamble included in control signaling for PHY layer configuration, to indicate the unequal MCSs. In some examples, an MCS field of the MCS configuration message may include entries for unequal QAM schemes across multiple spatial streams, where the multiple spatial streams may be encoding with the same code rate.

In some wireless communication systems, wireless communication devices may support low density parity check (LDPC) coding for forward error correcting purposes to increase the likelihood of accurate data transmission. In some examples, UHR-capable STAs 104 and APs 102 may be capable of selecting among multiple LDPC codeword lengths, including 648 bits, 1296 bits and 1944 bits (defined in legacy IEEE 802.11 wireless communications protocol standards), as well as even longer (extended) codeword lengths, which may increase as operating bandwidths increase, higher modulation orders are introduced, or more spatial streams are available. Using longer LDPC codewords (for example, for nominal codewords) may achieve lower block error rates in some channels, such as channels associated with additive white Gaussian noise. Longer LDPC codewords also may enable more reliable communications in channels with lower SNRs. To facilitate the use of multiple LDPC codeword lengths, a STA 104 and an AP 102 may each include multiple LDPC encoders and multiple LDPC decoders. In some examples, such a STA 104 or AP 102 may connect, aggregate, or otherwise utilize multiple encoders to implement a larger single encoder capable of encoding a longer codeword, or similarly, utilize multiple decoders to implement a larger single decoder capable of decoding a longer codeword, which may increase performance gains associated with larger block sizes without substantially increasing the hardware cost or complexity. In some examples, to generate an extended LDPC codeword, a STA 104 or an AP 102 may implement one or more lifting operations to extend a shorter codeword, with each lifting operation extending the previously lifted codeword. A "lifting" operation enables LDPC codes to be implemented using parallel encoding or decoding implementations while also reducing the complexity typically associated with large LDPC codewords. In some examples, a STA 104 or an AP 102 may use mixed codeword lengths for a given transmission. For example, the STA 104 or the AP 102 may encode input bits into one or more codewords having a first, longer codeword length (more than 1944 bits) and one or more codewords having a second, shorter codeword length (1944 bits or less). In some such examples, the STA 104 or the AP 102 may perform shortening or puncturing on the codewords having the longer codeword length, or on the codewords having the shorter codeword length, or both.

To support increased range or rate-over-range, a STA 104 and an AP 102 may support extended long range (ELR) PPDU formats. The use of an ELR PPDU format can enable the achievement of a target data rate while maintaining an existing coverage range, reduce an uplink/downlink power imbalance (due to, for example, one or more regulations or hardware differences at the uplink and downlink devices), or extend a coverage range while maintaining a similar, or slightly lower, data rate as compared with other PPDU formats. In some examples, an ELR PPDU may be transmitted over a narrow bandwidth, which may have a lower noise floor and thus higher SNR, thereby extending the coverage range. The reliability of the transmission of an ELR PPDU also may be increased as a result of using various optimized coding rates, coded bit repetition schemes, or duplication schemes, which may provide for improved decodability and fewer retransmissions. In some examples, the U-SIG 366 of an ELR PPDU 350 may include a first indication (for example, a codepoint of a PHY version identifier subfield within a version-independent portion of the U-SIG 366 or a value of an ELR subfield within a version-dependent portion of the U-SIG 366) that the PPDU 350 is associated with an ELR format. The U-SIG 366 of an ELR PPDU 350 may include a second indication (for example, a STA identifier subfield within the version-dependent portion of the U-SIG 366) of an intended receiver of the PPDU. In some examples, an ELR PPDU 350 may include an ELR-signature (ELR-SIG) field that includes an uplink/downlink indicator subfield, a length subfield, a coding indicator subfield, and an MCS subfield.

In some wireless communication systems, wireless communication between an AP 102 and an associated STA 104 can be secured. For example, either an AP 102 or a STA 104 may establish a security key for securing wireless communication between itself and the other device and may encrypt the contents of the data and management frames using the security key. In some examples, the control frame and fields within the MAC header of the data or management frames, or both, also may be secured either via encryption or via an integrity check (for example, by generating a message integrity check (MIC) for one or more relevant fields.

Retransmission protocols, such as hybrid automatic repeat request (HARQ), also may offer performance gains. A HARQ protocol may support various HARQ signaling between transmitting and receiving wireless communication devices (for example, the AP 102 and the STAs 104 described with reference to FIG. 1) as well as signaling between the PHY and MAC layers to improve the retransmission operations in a wireless communication network.

HARQ uses a combination of error detection and error correction. For example, a HARQ transmission may include error checking bits that are added to data to be transmitted using an error-detecting (ED) code, such as a cyclic redundancy check (CRC). The error checking bits may be used by the receiving device to determine if it has properly decoded the received HARQ transmission. In some examples, the original data (information bits) to be transmitted may be encoded with a forward error correction (FEC) code, such as using a low-density parity check (LDPC) coding scheme that systematically encodes the information bits to produce parity bits. The transmitting device may transmit both the original information bits as well as the parity bits in the HARQ transmission to the receiving device. The receiving device may be able to use the parity bits to correct errors in the information bits, thus avoiding a retransmission.

Implementing a HARQ protocol in a wireless communication network may improve reliability of data communicated from a transmitting device to a receiving device. The HARQ protocol may support the establishment of a HARQ session between the two devices. Once a HARQ session is established, if a receiving device cannot properly decode (and cannot correct the errors) a first HARQ transmission received from the transmitting device, the receiving device may transmit a HARQ feedback message to the transmitting device (for example, a negative acknowledgment (NACK)) that indicates at least part of the first HARQ transmission was not properly decoded. Such a HARQ feedback message may be different than the traditional Block ACK feedback message type associated with conventional ARQ. In response to receiving the HARQ feedback message, the transmitting device may transmit a second HARQ transmission to the receiving device to communicate at least part of further assist the receiving device in decoding the first HARQ transmission. For example, the transmitting device may include some or all of the original information bits, some or all of the original parity bits, as well as other, different parity bits in the second HARQ transmission. The combined HARQ transmissions may be processed for decoding and error correction such that the complete signal associated with the HARQ transmissions can be obtained.

In some examples, the receiving device may be enabled to control whether to continue the HARQ process or revert to a non-HARQ retransmission scheme (such as an automatic repeat request (ARQ) protocol). Such switching may reduce feedback overhead and increase the flexibility for retransmissions by allowing devices to dynamically switch between ARQ and HARQ protocols during frame exchanges. Some implementations also may allow multiplexing of communications that employ ARQ with those that employ HARQ.

APs and STAs (for example, the AP 102 and the STAs 104 described with reference to FIG. 1) that include multiple antennas may support various diversity schemes. For example, spatial diversity may be used by one or both of a transmitting device (such as an AP 102 or a STA 104) or a receiving device (such as an AP 102 or a STA 104) to increase the robustness of a transmission. For example, to implement a transmit diversity scheme, a transmitting device may transmit the same data redundantly over two or more antennas.

APs 102 and STAs 104 that include multiple antennas also may support space-time block coding (STBC). With STBC, a transmitting device also transmits multiple copies of a data stream across multiple antennas to exploit the various received versions of the data to increase the likelihood of decoding the correct data. More specifically, the data stream to be transmitted is encoded in blocks, which are distributed among the spaced antennas and across time. Generally, STBC can be used when the number $N_{Tx}$ of transmit antennas exceeds the number $N_{SS}$ of spatial streams. The $N_{SS}$ spatial streams may be mapped to a number $N_{STS}$ of space-time streams, which are mapped to $N_{Tx}$ transmit chains.

APs 102 and STAs 104 that include multiple antennas also may support spatial multiplexing, which may be used to increase the spectral efficiency and the resultant throughput of a transmission. To implement spatial multiplexing, the transmitting device divides the data stream into a number $N_{SS}$ of separate, independent spatial streams. The spatial streams are separately encoded and transmitted in parallel via the multiple $N_{Tx}$ transmit antennas.

APs 102 and STAs 104 that include multiple antennas also may support beamforming. Beamforming generally refers to the steering of the energy of a transmission in the direction of a target receiver. Beamforming may be used both in a single-user (SU) context, for example, to improve a signal-to-noise ratio (SNR), as well as in a multi-user (MU) context, for example, to enable MU-MIMO transmissions (also referred to as spatial division multiple access (SDMA)). In the MU-MIMO context, beamforming may additionally, or alternatively, involve the nulling out of energy in the directions of other receiving devices. To perform SU beamforming or MU-MIMO, a transmitting device, referred to as the beamformer, transmits a signal from each of multiple antennas. The beamformer configures the amplitudes and phase shifts between the signals transmitted from the different antennas such that the signals add constructively along particular directions towards the intended receiver (referred to as the beamformee) or add destructively in other directions towards other devices to mitigate interference in a MU-MIMO context. The manner in which the beamformer configures the amplitudes and phase shifts depends on channel state information (CSI) associated with the wireless channels over which the beamformer intends to communicate with the beamformee.

To obtain the CSI necessary for beamforming, the beamformer may perform a channel sounding procedure with the beamformee. For example, the beamformer may transmit one or more sounding signals (for example, in the form of a null data packet (NDP)) to the beamformee. An NDP is a PPDU without any data field. The beamformee may perform measurements for each of the $N_{Tx} \times N_{Rx}$ sub-channels corresponding to all of the transmit antenna and receive antenna pairs associated with the sounding signal. The beamformee generates a feedback matrix associated with the channel measurements and, typically, compresses the feedback matrix before transmitting the feedback to the beamformer. The beamformer may generate a precoding (or "steering") matrix for the beamformee associated with the feedback and use the steering matrix to precode the data streams to configure the amplitudes and phase shifts for subsequent transmissions to the beamformee. The beamformer may use the steering matrix to determine (for example, identify, detect, ascertain, calculate, or compute) how to transmit a signal on each of its antennas to perform beamforming. For example, the steering matrix may be indicative of a phase shift, or a power level, to use to transmit a respective signal on each of the beamformer's antennas.

When performing beamforming, the transmitting beamforming array gain is logarithmically proportional to the ratio of $N_{Tx}$ to $N_{SS}$. As such, it is generally desirable, within other constraints, to increase the number $N_{Tx}$ of transmit antennas when performing beamforming to increase the gain. It is also possible to more accurately direct transmissions or nulls by increasing the number of transmit antennas. This is especially advantageous in MU transmission contexts in which it is particularly important to reduce inter-user interference.

To increase an AP 102's spatial multiplexing capability, an AP 102 may need to support an increased number of spatial streams (such as up to 16 spatial streams). However, supporting additional spatial streams may result in increased CSI feedback overhead. Implicit CSI acquisition techniques may avoid CSI feedback overhead by taking advantage of the assumption that the UL and DL channels have reciprocal impulse responses (that is, that there is channel reciprocity). For example, the CSI feedback overhead may be reduced using an implicit channel sounding procedure such as an implicit beamforming report (BFR) technique (such as where STAs 104 transmit NDP sounding packets in the UL while the AP 102 measures the channel) because no BFRs are sent. Once the AP 102 receives the NDPs, it may implicitly assess the channels for each of the STAs 104 and use the channel assessments to configure steering matrices. In order to mitigate hardware mismatches that could break the channel reciprocity on the UL and DL (such as the baseband-to-RF and RF-to-baseband chains not being reciprocal), the AP 102 may implement a calibration method to compensate for the mismatch between the UL and the DL channels. For example, the AP 102 may select a reference antenna, transmit a pilot signal from each of its antennas, and estimate baseband-to-RF gain for each of the non-reference antennas relative to the reference antenna.

In some examples, multiple APs 102 may simultaneously transmit signaling or communications to a single STA 104 utilizing a distributed MU-MIMO scheme. Examples of such a distributed MU-MIMO transmission include coordinated beamforming (CoBF) and joint transmission (JT). With CoBF, signals (such as data streams) for a given STA 104 may be transmitted by only a single AP 102. However, the coverage areas of neighboring APs may overlap, and signals transmitted by a given AP 102 may reach the STAs in OBSSs associated with neighboring APs as OBSS signals. CoBF allows multiple neighboring APs to transmit simultaneously while minimizing or avoiding interference, which may result in more opportunities for spatial reuse. More specifically, using CoBF techniques, an AP 102 may beamform signals to in-BSS STAs 104 while forming nulls in the directions of STAs in OBSSs such that any signals received at an OBSS STA are of sufficiently low power to limit the interference at the STA. To accomplish this, an inter-BSS coordination set may be defined between the neighboring APs, which contains identifiers of all APs and STAs participating in CoBF transmissions.

With JT, signals for a given STA 104 may be transmitted by multiple coordinated APs 102. For the multiple APs 102 to concurrently transmit data to a STA 104, the multiple APs 102 may all need a copy of the data to be transmitted to the STA 104. Accordingly, the APs 102 may need to exchange the data among each other for transmission to a STA 104. With JT, the combination of antennas of the multiple APs 102 transmitting to one or more STAs 104 may be considered as one large antenna array (which may be represented as a virtual antenna array) used for beamforming and transmitting signals. In combination with MU-MIMO techniques, the multiple antennas of the multiple APs 102 may be able to transmit data via multiple spatial streams. Accordingly, each STA 104 may receive data via one or more of the multiple spatial streams.

In some implementations, the AP 102 and STAs 104 can support various multi-user communications; that is, concurrent transmissions from one device to each of multiple devices (for example, multiple simultaneous downlink communications from an AP 102 to corresponding STAs 104), or concurrent transmissions from multiple devices to a single device (for example, multiple simultaneous uplink transmissions from corresponding STAs 104 to an AP 102). As an example, in addition to MU-MIMO, the AP 102 and STAs 104 may support OFDMA. OFDMA is in some aspects a multi-user version of OFDM.

In OFDMA schemes, the available frequency spectrum of the wireless channel may be divided into multiple resource units (RUs) each including multiple frequency subcarriers (also referred to as "tones"). Different RUs may be allocated or assigned by an AP 102 to different STAs 104 at particular times. The sizes and distributions of the RUs may be referred to as an RU allocation. In some examples, RUs may be allocated in 2 MHz intervals, and as such, the smallest RU may include 26 tones consisting of 24 data tones and 2 pilot tones. Consequently, in a 20 MHz channel, up to 9 RUs (such as 2 MHZ, 26-tone RUs) may be allocated (because some tones are reserved for other purposes). Similarly, in a 160 MHz channel, up to 74 RUs may be allocated. Other tone RUs also may be allocated, such as 52 tone, 106 tone, 242 tone, 484 tone and 996 tone RUs. Adjacent RUs may be separated by a null subcarrier (such as a DC subcarrier), for example, to reduce interference between adjacent RUs, to reduce receiver DC offset, and to avoid transmit center frequency leakage.

For UL MU transmissions, an AP 102 can transmit a trigger frame to initiate and synchronize an UL OFDMA or UL MU-MIMO transmission from multiple STAs 104 to the AP 102. Such trigger frames may thus enable multiple STAs 104 to send UL traffic to the AP 102 concurrently in time. A trigger frame may address one or more STAs 104 through respective association identifiers (AIDs), and may assign each AID (and thus each STA 104) one or more RUs that can be used to send UL traffic to the AP 102. The AP also may designate one or more random access (RA) RUs that unscheduled STAs 104 may contend for.

In some wireless communications systems, an AP 102 may allocate or assign multiple RUs to a single STA 104 in an OFDMA transmission (hereinafter also referred to as "multi-RU aggregation"). Multi-RU aggregation, which facilitates puncturing and scheduling flexibility, may ultimately reduce latency. As increasing bandwidth is supported by emerging standards (such as the IEEE 802.11be standard amendment supporting 320 MHz and the IEEE 802.11bn standard amendment supporting 480 MHz and 640 MHz), various multiple RU (multi-RU) combinations may exist. Values indicating the various multi-RU combinations may be provided by a suitable standard specification (such as one or more of the IEEE 802.11 family of wireless communication protocol standards including the 802.11be standard amendment and the 802.11bn standard amendment).

As Wi-Fi is not the only technology operating in the 6 GHz band, the use of multiple RUs in conjunction with channel puncturing may enable the use of large bandwidths such that high throughput is possible while avoiding transmitting on frequencies that are locally unauthorized due to incumbent operation. Puncturing may be used in conjunction with multi-RU transmissions to enable wide channels to be established using non-contiguous spectrum blocks. In such examples, the portion of the bandwidth between two RUs allocated to a particular STA 104 may be punctured. Accordingly, spectrum efficiency and flexibility may be increased.

As described previously, STA-specific RU allocation information may be included in a signaling field (such as the EHT-SIG field for an EHT PPDU) of the PPDU's preamble. Preamble puncturing may enable wider bandwidth transmissions for increased throughput and spectral efficiency in the presence of interference from incumbent technologies and other wireless communication devices. Because RUs may be individually allocated in a MU PPDU, use of the MU PPDU format may indicate preamble puncturing for SU transmissions. While puncturing in the IEEE 802.11ax standard amendment was limited to OFDMA transmissions, the IEEE 802.11be standard amendment extended puncturing to SU transmissions. In some examples, the RU allocation information in the common field of EHT-SIG can be used to individually allocate RUs to the single user, effectively avoiding the punctured channels. In some other examples, U-SIG may be used to indicate SU preamble puncturing. For example, the SU preamble puncturing may be indicated by a value of the EHT-SIG compression field in U-SIG.

In some environments, locations, or conditions, a regulatory body may impose a power spectral density (PSD) limit for one or more communication channels or for an entire band (for example, the 6 GHz band). A PSD is a measure of transmit power as a function of a unit bandwidth (such as per 1 MHz). The total transmit power of a transmission is consequently the product of the PSD and the total bandwidth by which the transmission is sent. Unlike the 2.4 GHz and 5 GHz bands, the United States Federal Communications Commission (FCC) has established PSD limits for low power devices when operating in the 6 GHz band. The FCC has defined three power classes for operation in the 6 GHz band: standard power, low power indoor, and very low power. Some APs 102 and STAs 104 that operate in the 6 GHz band may conform to the low power indoor (LPI) power class, which limits the transmit power of APs 102 and STAs 104 to 5 decibel-milliwatts per megahertz (dBm/MHz) and −1 dBm/MHz, respectively. In other words, transmit power in the 6 GHz band is PSD-limited on a per-MHz basis.

Such PSD limits can undesirably reduce transmission ranges, reduce packet detection capabilities, and reduce channel estimation capabilities of APs 102 and STAs 104. In some examples in which transmissions are subject to a PSD limit, the AP 102 or the STAs 104 of a wireless communication network 100 may transmit over a greater transmission bandwidth to allow for an increase in the total transmit power, which may increase an SNR and extend coverage of the wireless communication devices. For example, to overcome or extend the PSD limit and improve SNR for low power devices operating in PSD-limited bands, 802.11be introduced a duplicate (DUP) mode for a transmission, by which data in a payload portion of a PPDU is modulated for transmission over a "base" frequency sub-band, such as a first RU of an OFDMA transmission, and copied over (for example, duplicated) to another frequency sub-band, such as a second RU of the OFDMA transmission. In DUP mode, two copies of the data are to be transmitted, and, for each of the duplicate RUs, using dual carrier modulation (DCM), which also has the effect of copying the data such that two copies of the data are carried by each of the duplicate RUs, so that, for example, four copies of the data are transmitted. While the data rate for transmission of each copy of the user data using the DUP mode may be the same as a data rate for a transmission using a "normal" mode, the transmit power for the transmission using the DUP mode may be essentially multiplied by the number of copies of the data being transmitted, at the expense of requiring an increased bandwidth. As such, using the DUP mode may extend range but reduce spectrum efficiency.

In some other examples in which transmissions are subject to a PSD limit, a distributed tone mapping operation may be used to increase the bandwidth via which a STA 104 transmits an uplink communication to the AP 102. As used herein, the term "distributed transmission" refers to a PPDU transmission on noncontiguous tones (or subcarriers) of a wireless channel. In contrast, the term "contiguous transmission" refers to a PPDU transmission on contiguous tones. As used herein, a logical RU represents a number of tones or subcarriers that are allocated to a given STA 104 for transmission of a PPDU. As used herein, the term "regular RU" (or rRU) refers to any RU or MRU tone plan that is not distributed, such as a configuration supported by 802.11be or earlier versions of the IEEE 802.11 family of wireless communication protocol standards. As used herein, the term "distributed RU" (or dRU) refers to the tones distributed across a set of noncontiguous subcarrier indices to which a logical RU is mapped. The term "distributed tone plan" refers to the set of noncontiguous subcarrier indices associated with a dRU. The channel or portion of a channel within which the distributed tones are interspersed is referred to as a spreading bandwidth, which may be, for example, 40 MHz, 80 MHz or more. The use of dRUs may be limited to uplink communications because benefits to addressing PSD limits may only be present for uplink communications.

Figure 4:
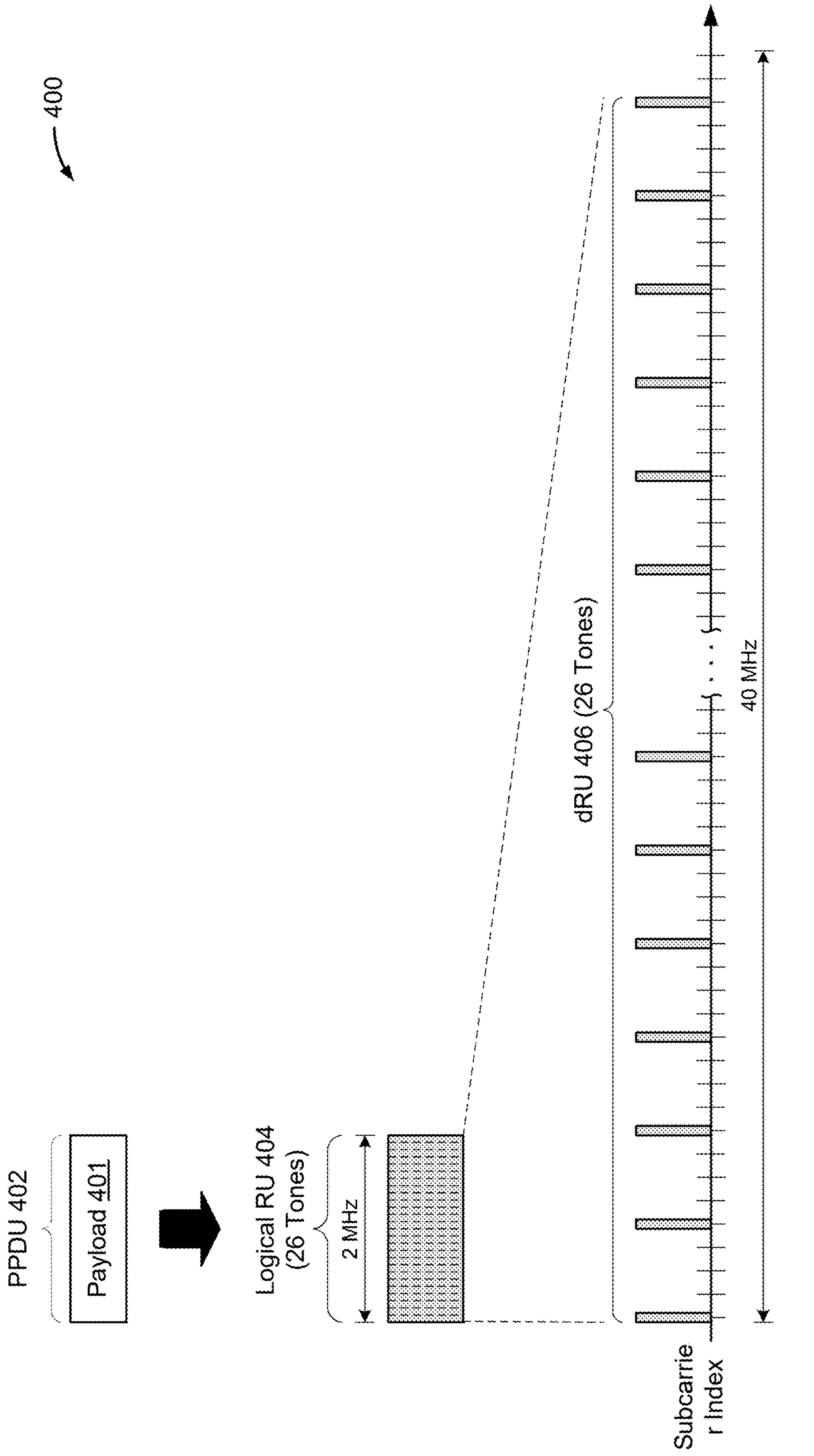
FIG. 4 shows a frequency diagram depicting an example distributed tone mapping.

FIG. 4 shows a frequency diagram 400 depicting an example distributed tone mapping. More specifically, FIG. 4 shows an example mapping of how the tones of a payload 401 of a PPDU 402 are distributed for transmission over a spreading bandwidth of a wireless channel. In the illustrated example, the tones in a logical RU 404 (which may represent an rRU of non-distributed tones in accordance with a legacy tone plan) associated with payload 401 are mapped to a distributed RU (dRU) 406 in accordance with a distributed tone plan.

Aspects of the present disclosure recognize that by distributing the tones across a wider bandwidth, the per-tone transmit power of a logical RU 404 may be increased to provide greater flexibility in medium utilization for PSD-limited wireless channels. For example, when mapped to an rRU such as logical RU 404, the transmit power of the logical RU 404 may be severely limited based on the PSD of the wireless channel. For example, the LPI power class limits the transmit power of APs 102 and STAs 104 to 5 dBm/MHz and −1 dBm/MHz, respectively, in the 6 GHz band. As such, the per-tone transmit power of the logical RU 404 is limited by the number of tones mapped to each 1 MHz subchannel of the wireless channel.

By enabling a STA 104 to map modulation symbols in a distributed manner onto noncontiguous tones interspersed throughout all or a portion of a wireless channel, distributed transmissions may enable an increase in the per-tone transmit power used for each individual distributed tone, and thus the overall transmit power of the PPDU 402, without exceeding the PSD limits of the wireless channel. As shown in the example of FIG. 4, the STA 104 may map logical RU 404 to a set of 26 noncontiguous subcarrier indices spread across a 40 MHz wireless channel (also referred to herein as a "spreading bandwidth"). Compared to the tone mapping described above with respect to the legacy tone plan, the distributed tone mapping depicted in FIG. 4 effectively reduces the number of tones (of the logical RU 404) in each 1 MHz subchannel. For example, each of the 26 tones can be mapped to a different 1 MHz subchannel of the 40 MHz channel. As a result, each AP 102 or STA 104 implementing the distributed tone mapping of FIG. 4 can maximize its per-tone transmit power (which may maximize the overall transmit power of the logical RU 404).

In some examples (not shown in FIG. 4), multiple logical RUs may be mapped to interleaved subcarrier indices of a shared wireless channel. For example, a STA 104 may modulate a portion of the symbols on a number of tones representing multiple logical RUs to noncontiguous subcarrier indices associated with a shared wireless channel in accordance with a distributed tone plan. Furthermore, distributed transmissions by multiple STAs 104 may be multiplexed onto different sets of distributed tones of a shared wireless channel such as to enable an increase in the transmit power of each device without sacrificing spectral efficiency. Such increases in transmit power can be combined with some MCSs to increase the range and throughput of wireless communications on PSD-limited wireless channels. Distributed transmissions also may improve packet detection and channel estimation capabilities.

To support distributed transmissions, new packet designs and signaling may be used to indicate whether a PPDU 402 is transmitted on tones spanning an rRU, such as a logical RU 404 (according to a legacy tone plan), or a dRU 406 (according to a distributed tone plan). For example, the IEEE 802.11be standard amendment or earlier versions of the IEEE 802.11 family of wireless communication protocol standards define a trigger frame format which can be used to solicit the transmission of a TB PPDU from one or more STAs 104. The trigger frame allocates resources to the STAs 104 for the transmission of the TB PPDU and indicates how the TB PPDU is to be configured for transmission. For example, the trigger frame may indicate a logical RU or MRU allocated for transmission in the TB PDDU. In some examples, the trigger frame may be further configured to carry tone distribution information indicating whether the logical RU (or MRU) maps to an rRU or a dRU.

In some implementations, a STA 104 may include a distributed tone mapper that maps the logical RU 404 to the dRU 406 in the frequency domain. The dRU 406 is converted to a time-domain signal (such as by an inverse fast Fourier transform (IFFT)) for transmission over a wireless channel. The AP 102 may receive the time-domain signal and reconstruct the dRU 406 (such as by a fast Fourier transform (FFT)). In some implementations, the AP 102 may include a distributed tone demapper that demaps the dRU 406 to the logical RU 404. In other words, the distributed tone demapper reverses the mapping performed by the distributed tone mapper at the STA 104. The AP 102 can recover the information carried (or modulated) on the logical RU 404 as a result of the demapping.

In the example of FIG. 4, the logical RU 404 is distributed evenly across the spreading bandwidth. While the example shown in FIG. 4 illustrates a spreading bandwidth of 40 MHz, spreading bandwidths also may include 80 MHz, 160 MHZ, or 320 MHz. In some implementations, the logical RU 404 can be mapped to any suitable pattern of noncontiguous subcarrier indices. For example, in various implementations, the distance between any pair of adjacent modulated tones may be less than or greater than the distances depicted in FIG. 4.

Figure 5:
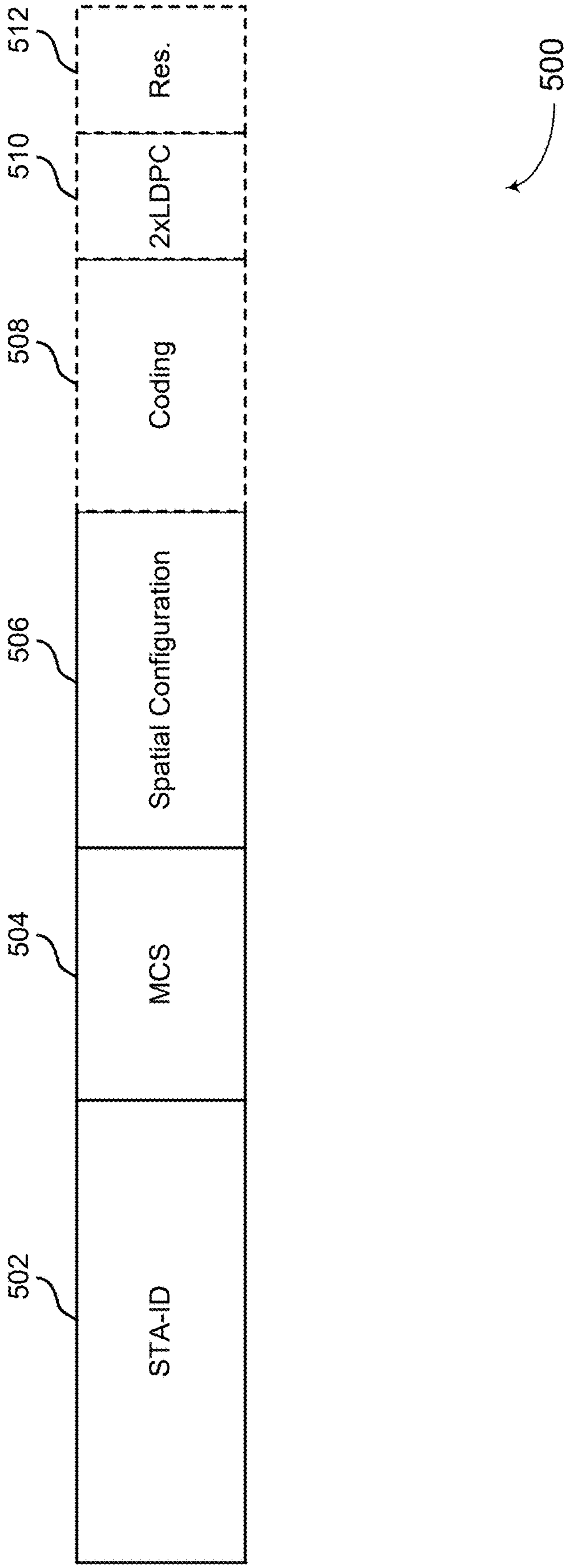
FIGS. 5 and 6 show examples of user field formats that support ultra-high reliability (UHR) signaling design.

FIG. 5 shows an example of a user field format 500 that supports UHR signaling design. The user field format 500 may be an example of an MU-MIMO user field format in a UHR MU PPDU, such as a PPDU 350 described with reference to FIG. 3. The UHR MU PPDU may include multiple user fields assigned to respective users. In some examples, each user field may be configured in accordance with the user field format 500. An AP 102, such as an AP 102 described with reference to FIG. 1, may transmit the UHR MU PPDU to multiple STAs 104, such as STAs 104 described with reference to FIG. 1. A STA 104 receiving the UHR MU PPDU may determine which user field corresponds to the STA 104 and may determine one or more communication parameters (for example, for communicating with the AP 102) based on the information indicated in the corresponding user field.

The user field format 500 may support PHY features for UHR. For example, the user field format 500 may support a quantity of MCS values (such as greater than 16 MCS values) for UHR communications. Additionally, or alternatively, the user field format 500 may support spatial domain unequal modulation (UEQM) for multiple spatial streams with transmit beamforming and LDPC coding. Additionally, or alternatively, the user field format 500 may support additional coding schemes for UHR, such as 2×LDPC.

The user field format 500 may define a format for a user info field including multiple subfields indicative of information for communication. For example, the user info field may include a STA-ID subfield 502, an MCS subfield 504, a spatial configuration subfield 506, a coding subfield 508, a 2×LDPC subfield 510, a reserved subfield 512, or some combination thereof. The subfields of the user info field may indicate communication information for a specific user (for example, a specific STA 104) corresponding to the user info field.

The STA-ID subfield 502 may indicate the specific user corresponding to the user info field. For example, the STA-ID subfield 502 may indicate an identifier (ID) of a STA 104. In some implementations, the STA-ID subfield 502 may indicate a full STA-ID. In some other implementations, the STA-ID subfield 502 may indicate at least a portion of the STA-ID, such as a set of most significant bits of the STA-ID. The STA-ID subfield 502 may include 11 bits (for example, bits 0-10 of the user info field).

The MCS subfield 504 may indicate the MCS index for communication to the STA 104 indicated by the STA-ID subfield 502. The STA 104 may determine an MCS to use based on the MCS index (for example, and a lookup table of MCS indexes). The MCS subfield 504 may include 5 bits (for example, bits 11-15 of the user info field). The 5-bit MCS subfield 504 may support MCS signaling of up to 32 different MCS indexes or values using the 32 bit values possible with 5 bits. For example, the MCS subfield 504 may support MCS values MCS0-MCS15, which may correspond to EHT MCS values EHT-MCS0-EHT-MCS14. Additionally, the MCS subfield 504 may support additional MCS values MCS16-MCS19, which may be examples of UHR-specific MCS values. In some implementations, the MCS subfield 504 may support 12 unused values set to "validate." Such unused values may alternatively be used to support additional MCS values (for example, MCS20-MCS31). In some other implementations, these 12 values for the MCS subfield 504 may support probability constellation shaping. For example, a value of the MCS subfield 504 may indicate a constellation shaping combination. The constellation shaping combination may include a shaper rate, a QAM, an FEC code rate, or a combination of these parameters for constellation shaping. The 5-bit MCS subfield 504 may support one or more MCS values, one or more constellation shaping combinations, or both. For example, the 5-bit MCS subfield 504 may support signaling one of 20 possible MCS values or one of 12 possible constellation shaping combinations to a STA 104 for communication.

The spatial configuration subfield 506 may indicate a spatial configuration for communications to the STA 104 corresponding to the user info field. In some implementations, the spatial configuration subfield 506 may include 6 bits (for example, bits 16-21 of the user info field) supporting signaling of up to 64 spatial configurations. In some other implementations, the spatial configuration subfield 506 may include 4 bits (for example, bits 16-19 of the user info field) supporting signaling of up to 16 spatial configurations or 5 bits (for example, bits 16-20 of the user info field) supporting signaling of up to 32 spatial configurations. In some examples, the 4-bit spatial configuration may use the 4-bit spatial configuration subfield as defined in the IEEE 802.11ax specification. In some examples, the 5-bit spatial configuration may use the 5 least-significant bits of a 6-bit spatial configuration subfield as defined in the IEEE 802.11be specification. A spatial configuration may include information indicative of a quantity of spatial streams, $N_{SS}$, and a respective starting stream index of each user for MU-MIMO communications. For a specific value of the quantity of MU-MIMO users in the assigned RU or MRU, $N_{user}$, each spatial configuration subfield may be used as follows: A STA with a STA-ID that matches, or otherwise corresponds to, the 11-bit ID signaled in the user field for an MU-MIMO allocation may derive the quantity of spatial streams allocated to the STA ($N_{SS}$) using the row corresponding to the signaled value in the spatial configuration subfield and the column corresponding to the position of the user field in the user specific field. The starting stream index for the user may be computed by summing the $N_{SS}$ values in the columns prior to the column indicated by the position of the user's (for example, the specific STA's) user field.

The coding subfield 508 may indicate a type of coding for the STA 104 to use for communications (such as with the AP 102). The coding subfield 508 may support 2×LDPC signaling. In some implementations, the coding subfield 508 may include at least 2 bits to supporting more than two coding scheme options. For example, a 2-bit coding subfield 508 may support a binary convolutional coding (BCC) scheme, a 2× low-density parity-check (LDPC) coding scheme, and another LDPC coding scheme, which may provide additional flexibility regarding the LDPC coding schemes compared to a 1-bit coding subfield (which may indicate either BCC or LDPC coding).

The 2×LDPC coding scheme may support additional nominal codeword sizes as compared to the "other" LDPC coding scheme. In some implementations, the 2×LDPC coding scheme may support a nominal codeword size of 3888, while the other LDPC coding scheme may fail to support a nominal codeword size of 3888. Instead, the other LDPC coding scheme may support a nominal codeword size of 648, 1296, or 1944. In some cases, other nominal codeword sizes may be supported by the other LDPC coding scheme, the 2×LDPC coding scheme, or both. The 2×LDPC coding scheme may indicate that the nominal codeword size of 3888 is used for a current transmission. In some other implementations, the 2×LDPC coding scheme may support the STA 104 selecting a nominal codeword size in accordance with a first nominal codeword size selection procedure (such as using a first nominal codeword size selection table or set of rules) that supports selecting a nominal codeword size of 3888. In contrast, the other LDPC coding scheme may support the STA 104 selecting a nominal codeword size in accordance with a second nominal codeword size selection procedure (such as using a second nominal codeword size selection table or set of rules) that fails to support selecting a nominal codeword size of 3888. For example, the other LDPC coding scheme may indicate for the STA 104 to use an 11n/11ac/11ax/11be codeword size selection table, which may support selection of a nominal codeword size of 648, 1296, or 1944. In some cases, other nominal codeword sizes may be selected in accordance with the other LDPC coding scheme, the 2×LDPC coding scheme, or both.

As a first example, the 2-bit coding subfield 508 may support a first value, {00}, indicating BCC; a second value, {01}, indicating the other LDPC coding; a third value, {10}, indicating "Reserved" or "Validate" or otherwise supporting an additional coding scheme option; and a fourth value, {11}, indicating the 2×LDPC coding. In such an example, the second bit in the bit field may indicate whether a type of LDPC coding is configured or not. As a second example, the 2-bit coding subfield 508 may support a first value, {00}, indicating BCC; a second value, {01}, indicating "Reserved" or "Validate" or otherwise supporting an additional coding scheme option; a third value, {10}, indicating the other LDPC coding; and a fourth value, {11}, indicating the 2×LDPC coding. In such an example, the first bit in the bit field may indicate whether a type of LDPC coding is configured or not. Other field value arrangements may be supported by the 2-bit coding subfield 508. As a third example, a first value, {00}, may indicate "Reserved" or "Validate"; a second value, {01}, may indicate BCC; a third value, {10}, may indicate the other LDPC coding; and a fourth value, {11}, may indicate the 2×LDPC coding. As a fourth example, a first value, {00}, may indicate BCC; a second value, {01}, may indicate the other LDPC coding; a third value, {10}, may indicate the 2×LDPC coding; and a fourth value, {11}, may indicate "Reserved" or "Validate."

In some implementations, if a threshold RU size (such as a minimum RU size) for MU-MIMO is greater than a threshold value (such as 242 for 11bn), the MU-MIMO user field format for UHR MU PPDU signaling may use a 1-bit subfield to indicate coding information (instead of the 2-bit coding subfield 508). For example, the 1-bit subfield may be a 2×LDPC subfield 510 indicating either the 2×LDPC coding scheme or the other LDPC coding scheme in accordance with the threshold RU size failing to support BCC. That is, if the minimum RU size for MU-MIMO in 11bn is greater than 242, the signaling may support LDPC coding but not BCC, and the AP 102 may indicate which LDPC coding scheme to use via one bit (such as the 1-bit 2×LDPC subfield 510). In some implementations, the user info field may include a reserved subfield 512 to maintain a same size of the user info field. For example, the reserved subfield 512 may include one or two bits to maintain a common user info field size of 22 bits or 23 bits depending on the sizes of the spatial configuration subfield 506, the coding subfield 508, the 2×LDPC subfield 510, or a combination thereof included in the user info field.

The coding subfield 508 or the 2×LDPC subfield 510 may indicate a coding scheme to a specific STA 104 indicated by the corresponding STA-ID subfield 502 in the user info field. In some other implementations, the AP 102 may indicate common coding scheme information to multiple users (such as multiple STAs 104) via common fields.

In a first example UHR signaling design, the user field format 500 for MU-MIMO may span 24 bits and may include an 11-bit STA-ID subfield 502, a 5-bit MCS subfield 504, a 6-bit spatial configuration subfield 506, and a 2-bit coding subfield 508. In a second example UHR signaling design, the user field format 500 for MU-MIMO may span 24 bits and may include an 11-bit STA-ID subfield 502, a 5-bit MCS subfield 504, a 6-bit spatial configuration subfield 506, a 1-bit coding subfield 508 that indicates BCC or LDPC, and a 1-bit 2×LDPC subfield 510. In a third example UHR signaling design, the user field format 500 for MU-MIMO may span 23 bits and may include an 11-bit STA-ID subfield 502, a 5-bit MCS subfield 504, a 6-bit spatial configuration subfield 506, and a 1-bit 2×LDPC subfield 510. In a fourth example UHR signaling design, the user field format 500 for MU-MIMO may span 22 bits and may include an 11-bit STA-ID subfield 502, a 5-bit MCS subfield 504, a 4-bit spatial configuration subfield 506, and a 2-bit coding subfield 508. In a fifth example UHR signaling design, the user field format 500 for MU-MIMO may span 22 bits and may include an 11-bit STA-ID subfield 502, a 5-bit MCS subfield 504, a 4-bit spatial configuration subfield 506, a 1-bit coding subfield 508 that indicates BCC or LDPC, and a 1-bit 2×LDPC subfield 510. In a sixth example UHR signaling design, the user field format 500 for MU-MIMO may span 23 bits and may include an 11-bit STA-ID subfield 502, a 5-bit MCS subfield 504, a 4-bit spatial configuration subfield 506, a 2-bit coding subfield 508, and a 1-bit reserved subfield 512. In a seventh example UHR signaling design, the user field format 500 for MU-MIMO may span 23 bits and may include an 11-bit STA-ID subfield 502, a 5-bit MCS subfield 504, a 4-bit spatial configuration subfield 506, a 1-bit coding subfield 508 that indicates BCC or LDPC, a 1-bit 2×LDPC subfield 510, and a 1-bit reserved subfield 512. In an eighth example UHR signaling design, the user field format 500 for MU-MIMO may span 22 bits and may include an 11-bit STA-ID subfield 502, a 5-bit MCS subfield 504, a 4-bit spatial configuration subfield 506, a 1-bit 2×LDPC subfield 510, and a 1-bit reserved subfield 512. In a ninth example UHR signaling design, the user field format 500 for MU-MIMO may span 23 bits and may include an 11-bit STA-ID subfield 502, a 5-bit MCS subfield 504, a 4-bit spatial configuration subfield 506, a 1-bit 2×LDPC subfield 510, and a 2-bit reserved subfield 512. In a tenth example UHR signaling design, the user field format 500 for MU-MIMO may span 23 bits and may include an 11-bit STA-ID subfield 502, a 5-bit MCS subfield 504, a 5-bit spatial configuration subfield 506, and a 2-bit coding subfield 508. In an eleventh example UHR signaling design, the user field format 500 for MU-MIMO may span 23 bits and may include an 11-bit STA-ID subfield 502, a 5-bit MCS subfield 504, a 5-bit spatial configuration subfield 506, a 1-bit coding subfield 508 that indicates BCC or LDPC, and a 1-bit 2×LDPC subfield 510. In a twelfth example UHR signaling design, the user field format 500 for MU-MIMO may span 22 bits and may include an 11-bit STA-ID subfield 502, a 5-bit MCS subfield 504, a 5-bit spatial configuration subfield 506, and a 1-bit 2×LDPC subfield 510. In a thirteenth example UHR signaling design, the user field format 500 for MU-MIMO may span 23 bits and may include an 11-bit STA-ID subfield 502, a 5-bit MCS subfield 504, a 5-bit spatial configuration subfield 506, a 1-bit 2×LDPC subfield 510, and a 1-bit reserved subfield 512. Other example UHR signaling designs may be supported in accordance with the user field formats 500.

Figure 6:
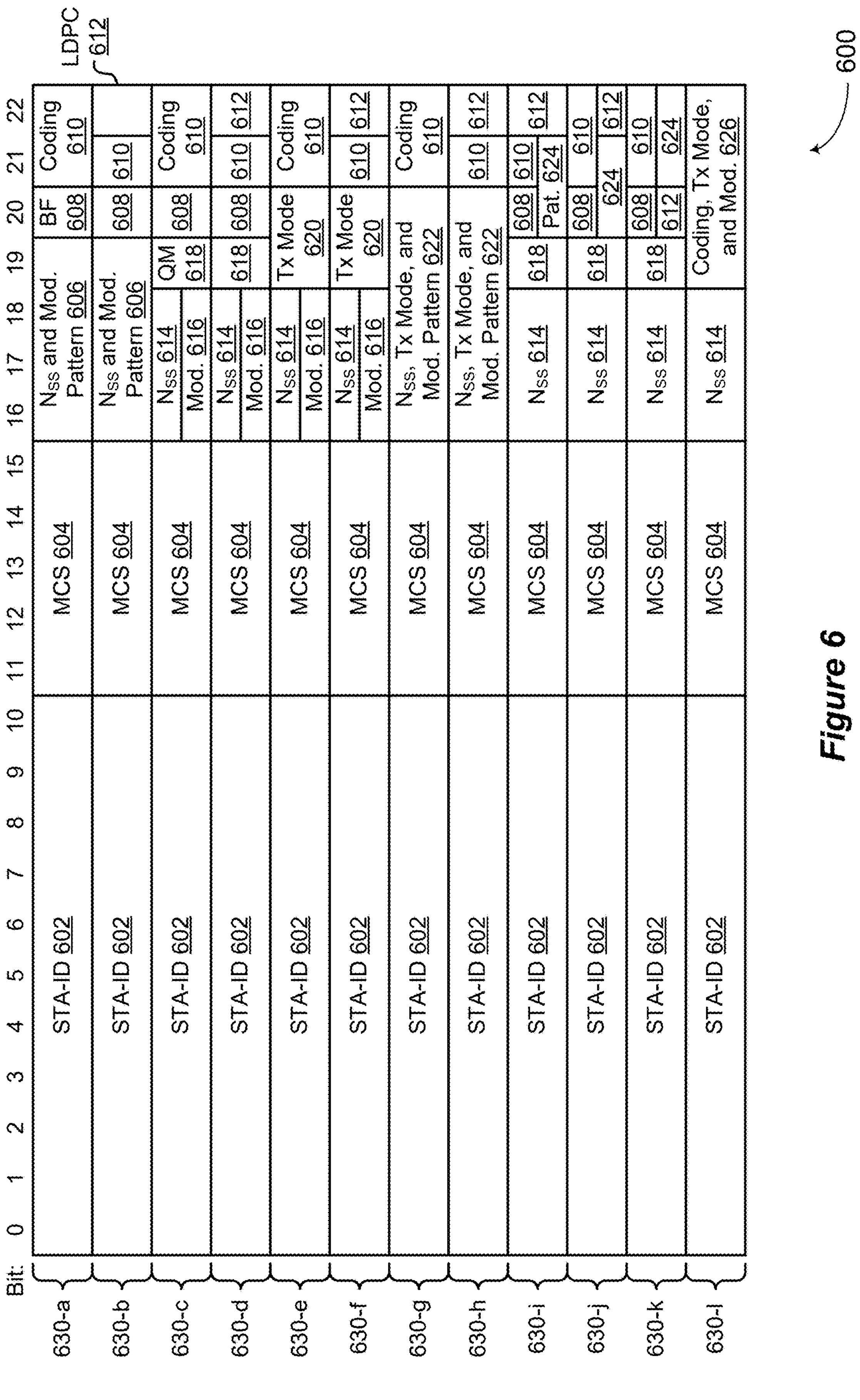

FIG. 6 shows an example of user field formats 600 that support UHR signaling design. The user field formats 600 may be examples of non-MU-MIMO user field formats in UHR MU PPDUs, such as a PPDU 350 described with reference to FIG. 3. In some cases, a user field format 600 may be an example of a user field format 500 described with reference to FIG. 5. The UHR MU PPDU may include one or more user fields assigned to respective users. In some examples, each user field may be configured in accordance with a user field format 600. An AP 102, such as an AP 102 described with reference to FIG. 1, may transmit the UHR MU PPDU to one or more STAs 104, such as STAs 104 described with reference to FIG. 1. A STA 104 receiving the UHR MU PPDU may determine a user field corresponding to the STA 104 and may determine one or more communication parameters (for example, for communicating with the AP 102) based on the information indicated in the corresponding user field.

The user field formats 600 may define formats for a user info field including multiple subfields indicative of information for communication. For example, the user info field may include a STA-ID subfield 602, an MCS subfield 604, an $N_{SS}$ and modulation pattern subfield 606, a beamforming subfield 608, a coding subfield 610, a 2×LDPC subfield 612, an $N_{SS}$ subfield 614, a modulation pattern subfield 616, an unequal modulation (UEQM) subfield 618, a transmission mode subfield 620, an $N_{SS}$, transmission mode, and modulation pattern subfield 622, a UEQM pattern subfield 624, a coding, transmission mode, and modulation pattern subfield 626, or some combination thereof. The subfields of the user info field may indicate communication information for a specific user (for example, a specific STA 104) corresponding to the user info field. In some examples, the user info field may span 23 bits (for example, bits 0-22 of a user info field).

The STA-ID subfield 602 may indicate the specific user corresponding to the user info field. For example, the STA-ID subfield 602 may indicate an ID of a STA 104. The STA-ID subfield 602 may include 11 bits (for example, bits 0-10 of the user info field).

The MCS subfield 604 may indicate the MCS index for communication to the STA 104 indicated by the STA-ID subfield 602. The STA 104 may determine an MCS to use based on the MCS index. Additionally, or alternatively, the STA 104 may determine a probability constellation shaping based on a constellation shaping combination indicated by the MCS subfield 604. The MCS subfield 604 may include 5 bits (for example, bits 11-15 of the user info field).

In some implementations, to support UEQM signaling, a user field format 600 may use four bits to jointly indicate a quantity of spatial streams, $N_{SS}$, and a modulation pattern. For example, the user info field may include an $N_{SS}$ and modulation pattern subfield 606 including 4 bits (for example, bits 16-19 of the user info field). In some examples, the $N_{SS}$ and modulation pattern subfield 606 may support different quantities of spatial streams with equal modulation (EQM) and different quantities of spatial streams with different UEQM patterns. For example, the 4-bit $N_{SS}$ and modulation pattern subfield 606 may support 8 values indicating EQM with 1-8 spatial streams and 8 values indicating different combinations of $N_{SS}$ and UEQM patterns (such as 2 spatial streams with either a first or second UEQM pattern, 3 spatial streams with either a first, a second, or a third UEQM pattern, or 4 spatial streams with either a first, a second, or a third UEQM pattern). In some other examples, the 4-bit $N_{SS}$ and modulation pattern subfield 606 may include a most-significant bit indicating either EQM or UEQM. That is, the most-significant bit may operate as an EQM/UEQM flag, in which a first bit value (such as $\{0\}$) may indicate EQM and a second bit value (such as $\{1\}$) may indicate UEQM. Based on the most-significant bit, the remaining three bits may either indicate $N_{SS}$ values for EQM or combinations of $N_{SS}$ and UEQM patterns for UEQM.

For example, in a first example UHR signaling design, a user info field 630-*a* for non-MU-MIMO may include a 4-bit $N_{SS}$ and modulation pattern subfield 606 (for example, bits 16-19 of the user info field), a 1-bit beamforming subfield 608 (for example, bit 20) indicating either beamformed or non-beamformed transmissions for communication, and a 2-bit coding subfield 610 (for example, bits 21 and 22) similar to the 2-bit coding subfield 508 described with reference to FIG. 5. In a second example UHR signaling design, a user info field 630-*b* for non-MU-MIMO may include a 4-bit $N_{SS}$ and modulation pattern subfield 606 (for example, bits 16-19 of the user info field), a 1-bit beamforming subfield 608 (for example, bit 20), a 1-bit coding subfield 610 (for example, bit 21), and a 1-bit 2×LDPC subfield 612 (for example, bit 22) similar to the 1-bit 2×LDPC subfield 510 described with reference to FIG. 5.

In some other implementations, a user field format 600 may use two subfields, a 1-bit EQM/UEQM flag and a 3-bit field indicating either $N_{SS}$ or a combination of $N_{SS}$ and UEQM patterns based on the 1-bit EQM/UEQM flag. For example, the user info field may include a UEQM subfield 618 operating as an EQM/UEQM flag and a 3-bit subfield operating as either an $N_{SS}$ subfield 614 if the UEQM subfield 618 indicates EQM or a modulation pattern subfield 616 if the UEQM subfield 618 indicates UEQM. The $N_{SS}$ subfield 614 may support 1-8 spatial streams for EQM, and the modulation pattern subfield 616 may support eight options for UEQM. For example, the eight options for UEQM may include two UEQM patterns (such as (QAM/QAM-1) or (QAM/QAM-2)) for two spatial streams; three UEQM patterns (such as (QAM/QAM/QAM-1), (QAM/QAM/QAM-2), or (QAM/QAM-1/QAM-2)) for three spatial streams; or three UEQM patterns (such as (QAM/QAM/QAM/QAM-1), (QAM/QAM/QAM/QAM-2), or (QAM/QAM/QAM-1/QAM-2)) for four spatial streams. In some other examples, other UEQM configurations may be supported.

For example, in a third example UHR signaling design, a user info field 630-*c* for non-MU-MIMO may include a 3-bit subfield (for example, bits 16-18) interpretable as either an $N_{SS}$ subfield 614 or a modulation pattern subfield 616 based on a value of a 1-bit UEQM subfield 618 (for example, bit 19) indicating either EQM or UEQM, respectively. The user info field 630-*c* may further include a 1-bit beamforming subfield 608 (for example, bit 20) and a 2-bit coding subfield 610 (for example, bits 21 and 22). In a fourth example UHR signaling design, a user info field 630-*d* for non-MU-MIMO may include a 3-bit subfield (for example, bits 16-18) interpretable as either an $N_{SS}$ subfield 614 or a modulation pattern subfield 616 based on a value of a 1-bit UEQM subfield 618 (for example, bit 19) indicating either EQM or UEQM, respectively. The user info field 630-*d* may further include a 1-bit beamforming subfield 608 (for example, bit 20), a 1-bit coding subfield 610 (for example, bit 21), and a 1-bit 2×LDPC subfield 612 (for example, bit 22).

In some implementations, to support UEQM signaling, a user field format 600 may use five total bits to jointly indicate the quantity of spatial streams, $N_{SS}$, a transmission mode, and a modulation pattern. In some examples, the user field format 600 may include two subfields, including a 2-bit transmission mode subfield 620 and a 3-bit field indicating either $N_{SS}$ for EQM or a modulation pattern for UEQM. The transmission mode subfield 620 may indicate a combination of beamforming information and equal or unequal modulation information. For example, a first value of the transmission mode subfield 620 may indicate non-beamformed transmission and EQM, a second value of the transmission mode subfield 620 may indicate beamformed transmission and EQM, a third value of the transmission mode subfield 620 may indicate beamformed transmission and UEQM (for example, based on UEQM corresponding to beamformed transmission), and a fourth value of the transmission mode subfield 620 may be a "Validate" or "Reserved" value and potentially indicate beamformed transmission and UEQM so that more UEQM modulation information may be indicated. If the transmission mode subfield 620 indicates EQM, the 3-bit subfield may indicate $N_{SS}$ information. Alternatively, if the transmission mode subfield 620 indicates UEQM, the 3-bit subfield may indicate UEQM modulation information, $N_{SS}$ information, or both. A STA 104 receiving the user info field may determine how to interpret the 3-bit subfield based on the value of the 2-bit transmission mode subfield 620.

For example, in a fifth example UHR signaling design, a user info field 630-*e* for non-MU-MIMO may include a 3-bit subfield (for example, bits 16-18) interpretable as either an $N_{SS}$ subfield 614 or a modulation pattern subfield 616 based on a value of a 2-bit transmission mode subfield 620 (for example, bits 19 and 20) jointly indicating either non-beamformed or beamformed transmission and either EQM or UEQM, respectively. The user info field 630-*e* may further include a 2-bit coding subfield 610 (for example, bits 21 and 22). In a sixth example UHR signaling design, a user info field 630-*f* for non-MU-MIMO may include a 3-bit subfield (for example, bits 16-18) interpretable as either an $N_{SS}$ subfield 614 or a modulation pattern subfield 616 based on a value of a 2-bit transmission mode subfield 620 (for example, bits 19 and 20) jointly indicating either non-beamformed or beamformed transmission and either EQM or UEQM, respectively. The user info field 630-*f* may further include a 1-bit coding subfield 610 (for example, bit 21) and a 1-bit 2×LDPC subfield 612 (for example, bit 22).

In some other examples, the five bits jointly indicating the quantity of spatial streams, $N_{SS}$, the transmission mode, and the modulation pattern may be included in a single 5-bit subfield. For example, the user field format 600 may include a 5-bit $N_{SS}$, transmission mode, and modulation pattern subfield 622. The $N_{SS}$, transmission mode, and modulation pattern subfield 622 may support a first set of values (for example, eight values for 1-8 spatial streams) indicating non-beamformed and EQM transmission, a second set of values (for example, eight values for 1-8 spatial streams) indicating beamformed and EQM transmission, a third set of values (for example, eight values) indicating beamformed and UEQM transmission (for example, for eight UEQM patterns, such as two patterns for two spatial streams, three patterns for three spatial streams, and three patterns for four spatial streams), a fourth set of values (for example, eight values) operating as reserved or "Validate" values, or any combination thereof.

For example, in a seventh example UHR signaling design, a user info field 630-*g* for non-MU-MIMO may include a 5-bit $N_{SS}$, transmission mode, and modulation pattern subfield 622 (for example, bits 16-20) and a 2-bit coding subfield 610 (for example, bits 21 and 22). In an eighth example UHR signaling design, a user info field 630-*h* for non-MU-MIMO may include a 5-bit $N_{SS}$, transmission mode, and modulation pattern subfield 622 (for example, bits 16-20), a 1-bit coding subfield 610 (for example, bit 21), and a 1-bit 2×LDPC subfield 612 (for example, bit 22).

In some implementations, to support UEQM signaling, a user field format 600 may use at least three bits to jointly indicate either beamformed or non-beamformed transmissions, either BCC or LDCP coding, and either EQM or a UEQM pattern. In some examples, the AP 102 transmitting the user info field and the STA 104 receiving the user info field may leverage a correlation between UEQM, beamforming, and coding. For example, a device using UEQM may also use beamformed transmissions with LDPC coding. If the user info field indicates UEQM, the user info field may refrain from indicating beamforming and coding information, as such information may be implicit based on the indication of UEQM. Instead, the bits used to indicate beamforming and coding information for EQM may be repurposed to indicate a UEQM pattern for UEQM. Such a configuration may provide additional flexibility regarding the supported UEQM patterns, extending UEQM to support quantities of spatial streams, $N_{SS}$, greater than 4 (such as 5-8 spatial streams).

For example, in a ninth example UHR signaling design, a user info field 630-*i* for non-MU-MIMO may include a 3-bit $N_{SS}$ subfield 614 (for example, bits 16-18), a 1-bit UEQM subfield 618 (for example, bit 19), and a 1-bit 2×LDPC subfield 612 (for example, bit 22). Two bits may be interpretable either as a 1-bit beamforming subfield 608 (for example, bit 20) and a 1-bit coding subfield 610 that indicates BCC or LDPC (for example, bit 21) if the UEQM subfield 618 indicates EQM or as a 2-bit UEQM pattern subfield 624 (for example, bits 20 and 21) if the UEQM subfield 618 indicates UEQM. For example, for UEQM, if the $N_{SS}$ subfield 614 indicates two spatial streams, the 2-bit UEQM pattern subfield 624 may support a first value indicating a first UEQM pattern, such as (QAM/QAM-1), and a second value indicating a second UEQM pattern, such as (QAM/QAM-2), for the two spatial streams; if the $N_{SS}$ subfield 614 indicates three spatial streams, the 2-bit UEQM pattern subfield 624 may support a first value indicating a first UEQM pattern, such as (QAM/QAM/QAM-1), a second value indicating a second UEQM pattern, such as (QAM/QAM/QAM-2), and a third value indicating a third UEQM pattern, such as (QAM/QAM-1/QAM-2) for the three spatial streams; and if the $N_{SS}$ subfield 614 indicates four spatial streams, the 2-bit UEQM pattern subfield 624 may support a first value indicating a first UEQM pattern, such as (QAM/QAM/QAM/QAM-1), a second value indicating a second UEQM pattern, such as (QAM/QAM/QAM/QAM-2), and a third value indicating a third UEQM pattern, such as (QAM/QAM/QAM-1/QAM-2) for the four spatial streams. Other values of the 2-bit UEQM pattern subfield 624 may be reserved or support other UEQM patterns. In a tenth example UHR signaling design, a user info field 630-*j* for non-MU-MIMO may include a 3-bit $N_{SS}$ subfield 614 (for example, bits 16-18) and a 1-bit UEQM subfield 618 (for example, bit 19). Three bits may be interpretable either as a 1-bit beamforming subfield 608 (for example, bit 20) and a 2-bit coding subfield 610 (for example, bits 21 and 22) if the UEQM subfield 618 indicates EQM or as a 2-bit UEQM pattern subfield 624 (for example, bits 20 and 21) and a 1-bit 2×LDPC subfield 612 (for example, bit 22) if the UEQM subfield 618 indicates UEQM.

In some implementations, to support UEQM signaling, a user field format 600 may use four total bits to jointly indicate a coding scheme, a transmission mode, and a modulation pattern. In some examples, the user field format 600 may include three subfields, including a 1-bit EQM/UEQM flag and 1-bit and 2-bit subfields interpretable based on the value of the EQM/UEQM flag. For example, if the EQM/UEQM flag indicates EQM, the 1-bit subfield may indicate beamforming information and the 2-bit subfield may indicate a coding scheme. Alternatively, if the EQM/UEQM flag indicates UEQM, the 1-bit subfield may indicate an LDPC coding scheme and the 2-bit subfield may indicate a UEQM pattern field.

For example, in an eleventh example UHR signaling design, a user info field 630-*k* for non-MU-MIMO may include a 3-bit $N_{SS}$ subfield 614 (for example, bits 16-18) and a 1-bit UEQM subfield 618 (for example, bit 19). One bit (for example, bit 20) may be interpretable either as a 1-bit beamforming subfield 608 if the UEQM subfield 618 indicates EQM or as a 1-bit 2×LDPC subfield 612 if the UEQM subfield 618 indicates UEQM. Additionally, two bits (for example, bits 21 and 22) may be interpretable either as a 2-bit coding subfield 610 if the UEQM subfield 618 indicates EQM or as a 2-bit UEQM pattern subfield 624 if the UEQM subfield 618 indicates UEQM.

In some other examples, the user field format 600 may include one four bit field indicating a combination of a coding scheme, a transmission mode, and a modulation pattern. For example, the user field format 600 may include a coding, transmission mode, and modulation pattern subfield 626 that supports a first set of values indicating three coding schemes (for example, BCC, 2×LDPC, or other LDPC) for non-beamformed EQM transmission, a second set of values indicating three coding schemes for beamformed EQM transmission, a third set of values indicating up to three UEQM patterns (for example, based on the quantity of spatial streams) for beamformed UEQM transmission with other LDPC coding, a fourth set of values indicating up to three UEQM patterns (for example, based on the quantity of spatial streams) for beamformed UEQM transmission with 2×LDPC coding, or some combination thereof.

For example, in a twelfth example UHR signaling design, a user info field 630-1 for non-MU-MIMO may include a 3-bit $N_{SS}$ subfield 614 (for example, bits 16-18) and a 4-bit coding, transmission mode, and modulation pattern subfield 626 (for example, bits 19-22).

In some implementations, a non-MU-MIMO user field format for a non-OFDMA transmission, such as a UHR MU PPDU, may use (or reuse) a quantity of bits from one or more other fields. For example, the user field format may use M additional bits compared to the 22-bit non-MU-MIMO user field format in 802.11be to support additional MCS indexes or other information. In some examples, M may be 0, 1, or 2 bits. To support a UHR-signal (SIG) for a single user transmission within a specific time period (for example, two symbols), the UHR-SIG may reallocate the M bits from a UHR-SIG common field to the UHR-SIG user info field. In some examples, the UHR-SIG may drop one or more fields or disregard bits from the UHR-SIG common field to support the user info field.

Figure 7:
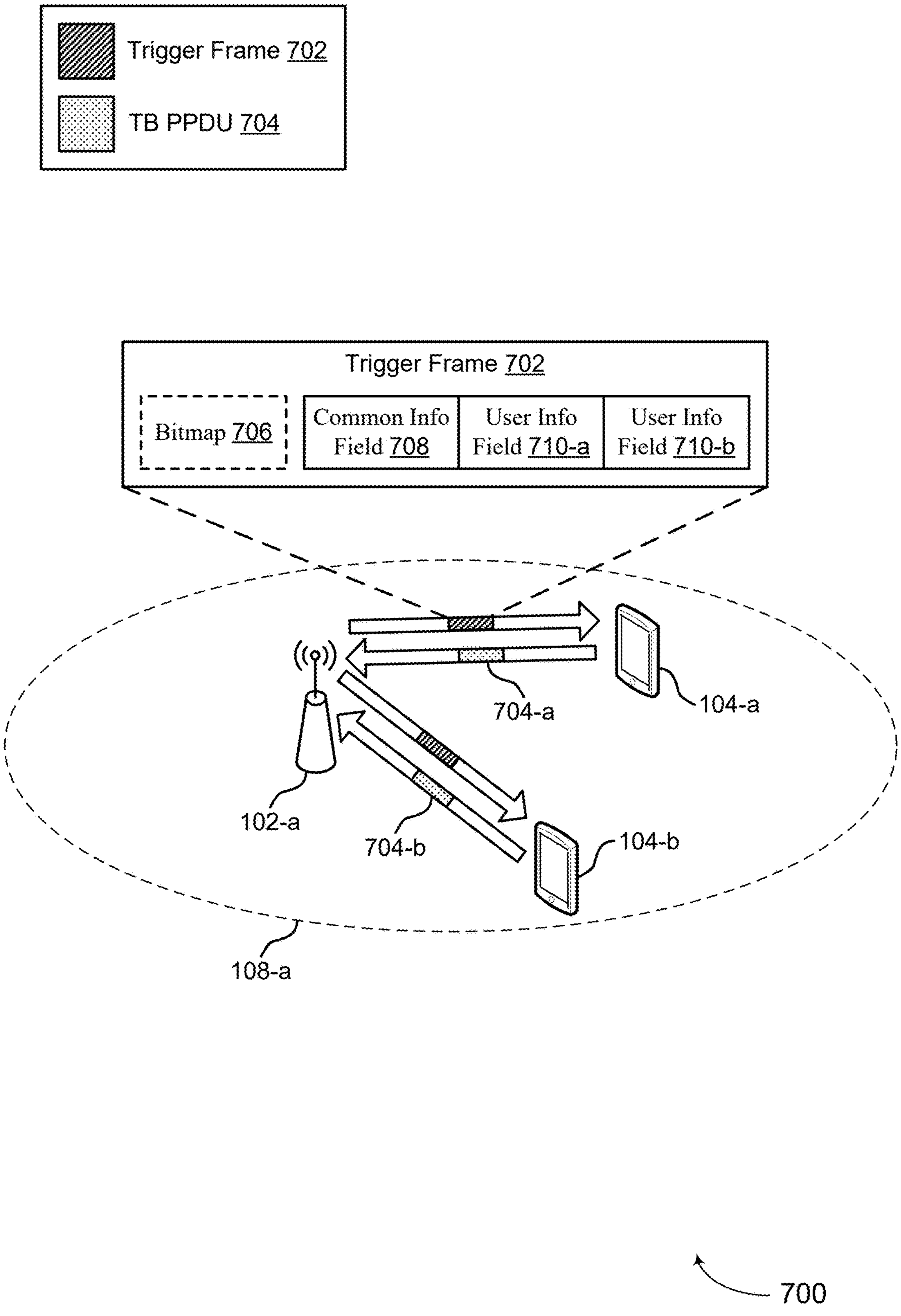
FIG. 7 shows an example of a wireless communications system that supports UHR signaling design.

FIG. 7 shows an example of a wireless communications system 700 that supports UHR signaling design. The wireless communications system 700 may be an example of a wireless communication network 100. The wireless communications system 700 may include an AP 102-*a*, which may be an example of an AP 102 described with reference to FIG. 1, and a set of STAs, which may be an example of STAs 104 described with reference to FIG. 1. The AP 102-*a* may serve a coverage area 108-*a*, which may be an example of a coverage area 108 described with reference to FIG. 1. The AP 102-*a* may transmit a trigger frame 702 to one or more STAs 104 to coordinate uplink transmissions between the STAs 104. For example, the trigger frame 702 may indicate distributed transmission information to the STAs 104 to support dRU signaling.

A trigger frame 702 may include a common info field 708 and one or more user info fields, such as a first user info field 710-*a* corresponding to a first STA 104-*a* and a second user info field 710-*b* corresponding to a second STA 104-*b*. The common info field 708 may be an example of a UHR variant common info field. A user info field may be an example of a special user info field or a UHR variant user info field.

The trigger frame 702 may indicate dRU information to each STA 104 configured for distributed transmission. For example, the trigger frame 702 may indicate, to a STA 104, a dRU indication, dRU spreading information (for example, a distribution bandwidth, such as 20 megahertz (MHz), 40 MHz, 80 MHz, or another bandwidth), a global cyclic shift delay (CSD) index, a quantity of spatial streams (for example, $N_{SS}$, such as one spatial stream or two spatial streams), or any combination thereof. In some examples, the trigger frame 702 may include dRU signaling in a common info field 708 of the trigger frame 702, a user info field of the trigger frame 702, or both. The STAs 104 receiving the trigger frame 702 and configured for dRU operation may transmit, in response, trigger-based (TB) PPDUs 704 to the AP 102-*a*. For example, the first STA 104-*a* may transmit a first TB PPDU 704-*a* to the AP 102-*a* via first distributed resources allocated for the first STA 104-*a*, and the second STA 104-*b* may transmit a second TB PPDU 704-*b* to the AP 102-*a* via second distributed resources allocated for the second STA 104-*b* in accordance with the trigger frame 702. The STAs 104 and the AP 102-*a* may communicate signaling (for example, uplink signaling) via assigned dRUs using assigned global CSD indexes. For example, a STA 104 may use a global CSD indicated by a respective assigned global CSD index for dRU UHR-STF transmission via a distribution bandwidth.

In some implementations, the trigger frame 702 may include a bitmap 706 indicating dRU information for one or more STAs 104. In some examples, the bitmap 706 may be an example of a 4-bit bitmap, in which each bit may correspond to an 80 MHz distributed bandwidth. For example, if the UHR TB PPDU is a 320 MHz PPDU, each bit in the 4-bit bitmap may indicate dRU information of a distinct 80 MHz frequency subblock within the 320 MHz PPDU bandwidth. Each bit may indicate whether or not an 80 MHz frequency subblock includes (or supports) distributed transmission. Alternatively, the bitmap 706 may be an example of an 8-bit bitmap (for example, each bit may correspond to a 40 MHz distributed bandwidth) or a 16-bit bitmap (for example, each bit may correspond to a 20 MHz distributed bandwidth) to support improved granularity of dRU indication. The bitmap 706 may be included in the common info field 708 or a special user info field for dRU indication.

The trigger frame 702 may indicate a distribution bandwidth size (for example, 20 MHz, 40 MHz, or 80 MHz) using two bits. In some examples, the trigger frame 702 may repurpose two bits from a spatial stream (SS) allocation subfield of a UHR variant user info field to indicate the distribution bandwidth if dRU is configured for the STA with its STA ID indicated in the AID12 subfield of the UHR variant user info field. For example, the first user info field 710-*a* may indicate a first distribution bandwidth to the STA 104-*a*, and the second user info field 710-*b* may indicate a second distribution bandwidth to the STA 104-*b*. In some examples, a non-punctured 80 MHz frequency subblock may use an 80 MHz distribution bandwidth, while a punctured 80 MHz frequency subblock may use a 20 MHz distribution bandwidth, a 40 MHz distribution bandwidth, or both. In some examples, in a punctured 80 MHz frequency subblock, a 40 MHz subband may use a 40 MHz distribution bandwidth and the AP 102-*a* may refrain from indicating a per-user distribution bandwidth. In some other examples, in the punctured 80 MHz frequency subblock, a 40 MHz subband may use a 20 MHz distribution bandwidth or a 40 MHz distribution bandwidth, and the AP 102-*a* may use one bit (for example, from the SS allocation subfield) to indicate either the 20 MHz distribution bandwidth or the 40 MHz distribution bandwidth for dRU.

Additionally, or alternatively, the trigger frame 702 may indicate a quantity of spatial streams (for example, one or two spatial streams) using one bit. For example, dRU may support up to two spatial streams. In some examples, the trigger frame 702 may repurpose one bit from the SS allocation subfield of a UHR variant user info field to indicate the quantity of spatial streams. The SS allocation subfield may be an example of a 6-bit subfield. In some examples, other bits of the SS allocation subfield may be reserved.

Additionally, or alternatively, the AP 102-*a* may indicate global CSD indexes to the STAs 104 using the trigger frame 702. The global CSD indicated by a global CSD index for a STA 104 may be used by the STA 104 in a UHR-STF field for a distributed transmission. In some examples, the wireless communications system 700 may support a threshold quantity of different global CSD values. For example, the system may support up to eight different global CSD values. If the AP 102-*a* assigns a quantity of users (for example, STAs 104) for dRU operations in a same distributed subband that is less than or equal to the threshold quantity of different global CSD values, the AP 102-*a* may assign a different global CSD value to each user. For example, if eight or fewer STAs 104 are configured for dRU operations in a distributed subband, the AP 102-*a* may assign each of the STAs 104 a different global CSD value for improved diversity.

In some implementations, the AP 102-*a* may explicitly indicate a global CSD value to a STA 104 using a bit field (for example, a 3-bit field in a user info field). For example, the first user info field 710-*a* may include a 3-bit subfield indicating a global CSD index assigned to the corresponding first STA 104-*a*, and the second user info field 710-*b* may include a 3-bit subfield indicating a different global CSD index assigned to the corresponding second STA 104-*b*.

In some other implementations, the AP 102-*a* may implicitly indicate a global CSD value to a STA 104 using a location of a corresponding user info field. For example, the order of the user info fields in the trigger frame 702 may indicate global CSD information to the STAs 104 receiving the trigger frame 702. That is, the order of non-special user info fields in the trigger frame 702 may implicitly indicate a global CSD index or value. For example, a user info field that is not a special user info field may be the $i^{th}$ non-special user info field in the trigger frame 702. A STA 104 receiving the trigger frame 702 may determine a global CSD index for the STA 104 according to Equation (1). In Equation (1), i is the index of the non-special user info field according to the order in the trigger frame 702, and X is the threshold quantity of global CSD values (for example, 8).

$$\text{Global } CSD \text{ Index} = \text{mod}(i, X) \tag{1}$$

The AP 102-*a* may arrange the user info fields in the trigger frame 702 to indicate the global CSD values to the corresponding STAs 104. For example, to indicate a first global CSD index to the first STA 104-*a* and a second global CSD index to the second STA 104-*b*, the AP 102-*a* may arrange the first user info field 710-*a* addressed to the first STA 104-*a* before the second user info field 710-*b* addressed to the second STA 104-*b* in the trigger frame 702. Alternatively, to indicate the second global CSD index to the first STA 104-*a* and the first global CSD index to the second STA 104-*b*, the AP 102-*a* may arrange the user info field 710-*b* addressed to the second STA 104-*b* before the user info field 710-*a* addressed to the first STA 104-*a* in the trigger frame 702. The STAs 104 may receive the trigger frame 702 and may determine the global CSD values assigned to each STA 104 based on the order of the user info fields. In some examples, the AP 102-*a* may use consecutive user info fields (for example, consecutive non-special user info fields) for STAs 104 assigned in a same distribution subband to reduce global CSD collision within the distribution subband. In some other examples, the AP 102-*a* may arrange the user info fields such that STAs 104 assigned in a same distribution subband correspond to different global CSD indexes according to Equation (1).

By arranging the user info fields based on dRU allocation, the AP 102-*a* may minimize- or otherwise reduce-global CSD collision between STAs 104. For example, the AP 102-*a* may optimize the selection of global CSD indexes for users in each distribution bandwidth to reduce global CSD collision. Additionally, or alternatively, the AP 102-*a* may reduce signaling overhead by implicitly indicating the global CSD indexes, rather than using signaling bits to explicitly indicate the global CSD indexes.

In some implementations, the AP 102-*a* may order the user info fields to improve AGC performance (with a relatively smaller power gap range) of STAs 104 assigned in the same distribution subband. For example, ordering the user info fields to avoid global CSD collision within a distribution subband (for example, by assigning different global CSD values to each STA 104 assigned in the distribution subband) may improve AGC performance. However, in some implementations, different combinations of global CSD indexes within a distribution subband may result in different AGC performance metrics. In some such implementations, the AP 102-*a* may further optimize or improve the AGC performance by selecting a specific combination of global CSD indexes for the distribution subband and ordering the user info fields in accordance with the selected combination. For example, selecting global CSD values of 0 and −400 nanoseconds (ns) for two STAs 104 assigned in a same distribution bandwidth may correspond to relatively better AGC performance than global CSD values of −600 ns and −650 ns for the two STAs 104.

In some examples, the trigger frame 702 may implicitly indicate a global CSD index using both the user info field location and distribution subband information. For a specific distribution subband, the AP 102-*a* may assign global CSD indexes to STAs 104 starting from index 0 and incrementing towards a threshold index (for example, index 8). If there are more than the threshold quantity of STAs (for example, more than 8 STAs) assigned for distributed transmission in the same distribution subband, the AP 102-*a* may assign each global CSD index once before restarting with index 0 and again incrementing towards the threshold index. Such a procedure may improve global CSD index diversity within the distribution bandwidth if the quantity of STAs exceeds the quantity of supported global CSD indexes. Additionally, such an assignment may improve AGC performance (with a relatively smaller power gap range) for the distribution subband. In some examples, the AP 102-*a* may use this assignment procedure for each distribution subband. A STA 104 receiving the trigger frame 702 may read a non-special user info field and determine the assigned RU based on the RU allocation, PS160 subfield, the dRU indication and the distribution bandwidth signaling. The AP 102-*a* generating the trigger frame 702 may, for each distribution subband, order the non-special user info fields that are assigned a dRU in the respective distribution subband with an index i, starting from 0 and incrementing in value. The global CSD index for the STA 104 indicated by the $i^{th}$ non-special user info field that is assigned a dRU in the distribution subband may be determined based on Equation (1).

In some other examples, the trigger frame 702 may indicate a global CSD index using both the user info field location and one or more signaling bits. Such a trigger frame 702 may improve flexibility of assigning global CSD indexes for improved AGC performance. In some implementations, the AP 102-*a* may use reserved bits (for example, two bits) from the SS allocation subfield as signaling bits for the global CSD index. For example, the AP 102-*a* may jointly use a global CSD information subfield in a UHR variant user info field (for example, from the SS allocation subfield) with the non-special user info field location to indicate the global CSD index. To indicate a global CSD value from eight possible global CSD values, the AP 102-*a* may use three bits of information. In a first example, the non-special user info field location may indicate one bit of information (for example, according to mod (i, 2)) and a global CSD information subfield may include two bits of information. In a second example, the non-special user info field location may indicate two bits of information (for example, according to mod (i, 4)) and the global CSD information subfield may include one bit of information. Other configurations may be supported to indicate (for example, implicitly, explicitly, or a combination thereof) different global CSD values (for example, if the system supports fewer or more global CSD values than 8).

Figure 8:
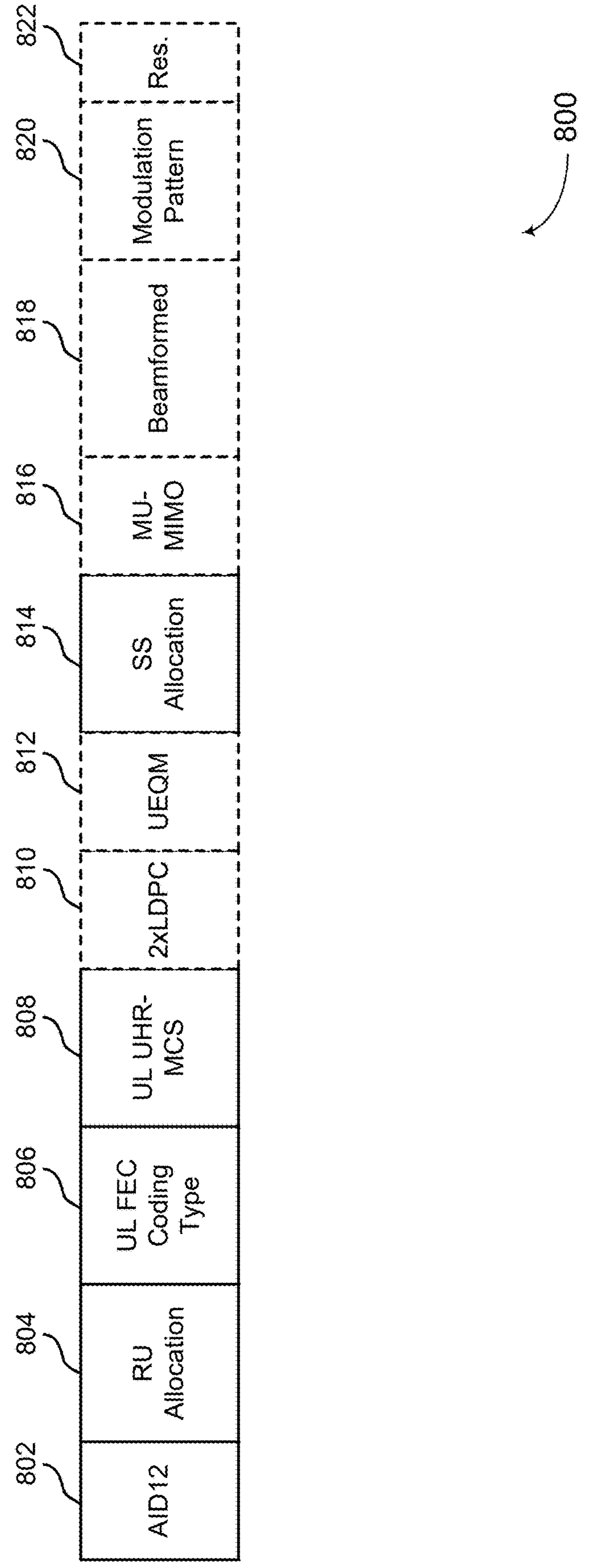
FIG. 8 shows an example of a UHR variant user info field format that supports UHR signaling design.

FIG. 8 shows an example of a UHR variant user info field format 800 that supports UHR signaling design. A trigger frame, such as a trigger frame 702 as described with reference to FIG. 7, may include a UHR variant user info field in accordance with the UHR variant user info field format 800. The UHR variant user info field format 800 may support signaling of UHR-specific information, for example, using additional bits to indicate MCS values, coding schemes, or some combination of these or other information similar to the user info field formats described with reference to FIGS. 5 and 6.

The UHR variant user info field format 800 may include an AID12 subfield 802 including twelve bits (for example, the twelve least-significant bits) indicating the AID of a STA 104. The UHR variant user info field may be directed to the STA 104 indicated by the AID12 subfield 802.

The UHR variant user info field format 800 may further include an RU allocation subfield 804, indicating an assigned RU. In some examples, the RU allocation subfield 804 may indicate a regular RU (rRU) for non-distributed transmission or a dRU for dRU operation, similar to the trigger frame 702 described with reference to FIG. 7.

The UHR variant user info field format 800 may include an UL FEC coding type subfield 806. In some examples, the UL FEC coding type subfield 806 may be an example of a 2-bit subfield to support 2×LDPC signaling. For example, the 2-bit UL FEC coding type subfield 806 may indicate BCC, 2×LDPC coding, or other LDPC coding for UHR. Alternatively, in some implementations, the UL FEC coding type subfield 806 may be an example of a 1-bit subfield indicating BCC or LDPC coding. In some such implementations, the UHR variant user info field format 800 may include a 1-bit 2×LDPC subfield 810 indicating either 2×LDPC coding or another LDPC coding, for example, if the UL FEC coding type subfield 806 indicates LDPC coding.

The UHR variant user info field format 800 may include an UL UHR-MCS subfield 808. In some examples, the UL UHR-MCS subfield 808 may be an example of a 5-bit subfield to support more than 16 MCS values. For example, the 5-bit UL UHR-MCS subfield 808 may support up to 32 MCS values for UHR. In some implementations, the UHR variant user info field format 800 may maintain a same size as an EHT variant user info field format by repurposing a 1-bit reserved subfield (for example, bit 25) and shrinking a size of an SS allocation subfield 814 to account for an increase in size of the UL FEC coding type subfield 806, the UL UHR-MCS subfield 808, or both. For example, the SS allocation subfield 814 may include 5 bits based on reducing 1 bit in a starting spatial stream subfield of the SS allocation subfield 814. Additionally, or alternatively, a structure of the SS allocation subfield 814 may depend on whether the UHR variant user info field format 800 is for dRU or regular resource units (rRU). For example, for rRU, the SS allocation subfield 814 may include three bits to indicate a starting spatial stream and two bits to indicate a quantity of spatial streams. For dRU, the SS allocation subfield 814 may include two bits to indicate a distribution bandwidth, one bit to indicate a quantity of spatial streams, and two reserved bits.

If precoded TB PPDUs are supported for non-MU-MIMO TB transmission, but not MU-MIMO TB transmission, the UHR variant user info field may support spatial domain UEQM for non-MU-MIMO. In some implementations, the UHR variant user info field format 800 may include a 1-bit MU-MIMO flag 816. For example, the MU-MIMO flag 816 may indicate either MU-MIMO or non-MU-MIMO. In some examples, the UHR variant user info field format 800 may increase the size of the variant user info field, as compared to an EHT variant user info field format, (such as by one octet) to include the MU-MIMO flag 816. In some such examples, the UHR variant user info field format 800 may include one or more reserved bits 822, for example, to fill out the rest of the added octet.

In some such implementations, the SS allocation subfield 814 structure may depend on the value indicated by the MU-MIMO flag 816 (for example, in addition to whether the user info field is for dRU or rRU). If the MU-MIMO flag 816 indicates MU-MIMO for rRU communication, the SS allocation subfield 814 may be formatted as described above. If the MU-MIMO flag 816 indicates non-MU-MIMO for rRU communications, the SS allocation subfield 814 may include one bit indicating beamforming and four bits jointly indicating a quantity of spatial streams and a modulation pattern. In some examples, the four bit subfield may indicate options for up to four spatial streams. Alternatively, if the MU-MIMO flag 816 indicates non-MU-MIMO for dRU communications, the SS allocation subfield 814 may include one bit indicating beamforming, two bits indicating a modulation pattern, and two bits indicating a quantity of spatial streams. In some examples, the two bit spatial stream subfield may indicate one, two, three, or four spatial streams and the two bit modulation pattern subfield may be interpreted based on the value indicated by the two bit spatial stream subfield. For example, for two spatial streams, the modulation pattern subfield may support EQM and UEQM patterns, such as (QAM/QAM-1) for UEQM, (QAM/QAM-2) for UEQM, or a combination thereof (for example, with a reserved bit). For three spatial streams, the modulation pattern subfield may support EQM and UEQM patterns, such as (QAM/QAM/QAM-1) for UEQM, (QAM/QAM/QAM-2) for UEQM, (QAM/QAM-1/QAM-2) for UEQM, or a combination thereof. For four spatial streams, the modulation pattern subfield may support EQM and UEQM patterns, such as (QAM/QAM/QAM/QAM-1) for UEQM, (QAM/QAM/QAM/QAM-2) for UEQM, (QAM/QAM/QAM-1/QAM-2) for UEQM, or a combination thereof.

If precoded TB PPDUs are supported for non-MU-MIMO TB transmission and MU-MIMO TB transmission, the UHR variant user info field may support spatial domain UEQM. In some implementations, the UHR variant user info field format 800 may include the 1-bit MU-MIMO flag 816 and a 1-bit beamformed flag 818. For example, the beamformed flag 818 may indicate either beamformed transmissions or non-beamformed transmissions. In some examples, the UHR variant user info field format 800 may increase the size of the variant user info field, as compared to an EHT variant user info field format, (such as by one octet) to include the MU-MIMO flag 816 and the beamformed flag 818. In some such examples, the UHR variant user info field format 800 may include one or more reserved bits 822, for example, to fill out the rest of the added octet.

In some such implementations, the SS allocation subfield 814 structure may depend on the value indicated by the MU-MIMO flag 816 (for example, in addition to whether the user info field is for dRU or rRU). If the MU-MIMO flag 816 indicates MU-MIMO for rRU communication, the SS allocation subfield 814 may be formatted as described above. If the MU-MIMO flag 816 indicates non-MU-MIMO for rRU communications, the SS allocation subfield 814 may include one reserved bit and four bits jointly indicating a quantity of spatial streams and a modulation pattern, or the SS allocation subfield 814 may include one reserved bit, two bits indicating a modulation pattern, and two bits indicating a quantity of spatial streams.

In some implementations, the UHR variant user info field format 800 may include the 1-bit beamformed flag 818 and a 2-bit modulation pattern subfield 820. The modulation pattern subfield 820 may support configuring up to four different modulation patterns including EQM and UEQM patterns for a specific quantity of spatial streams, as indicated in the quantity of spatial streams subfield. In some examples, the UHR variant user info field format 800 may increase the size of the variant user info field, as compared to an EHT variant user info field format, (such as by one octet) to include the beamformed flag 818 and the modulation pattern subfield 820. In some such examples, the UHR variant user info field format 800 may include one or more reserved bits 822, for example, to fill out the rest of the added octet.

In some implementations, the UHR variant user info field format 800 may include a 1-bit UEQM flag 812. The UEQM flag 812 may indicate either EQM or UEQM. Other subfields of the UHR variant user info field format 800 may depend on the values of the UEQM flag 812. For example, if the UEQM flag 812 indicates EQM, the UHR variant user info field may include an UL FEC coding type subfield 806 and a beamformed flag 818. If the UEQM flag 812 indicates UEQM, the bits of the UL FEC coding type subfield 806 and the beamformed flag 818 may instead jointly indicate a UEQM pattern. In some examples, the UHR variant user info field format 800 may increase the size of the variant user info field, as compared to an EHT variant user info field format, (such as by one octet) to include such subfields. In some such examples, the UHR variant user info field format 800 may include one or more reserved bits 822, for example, to fill out the rest of the added octet.

Figure 9:
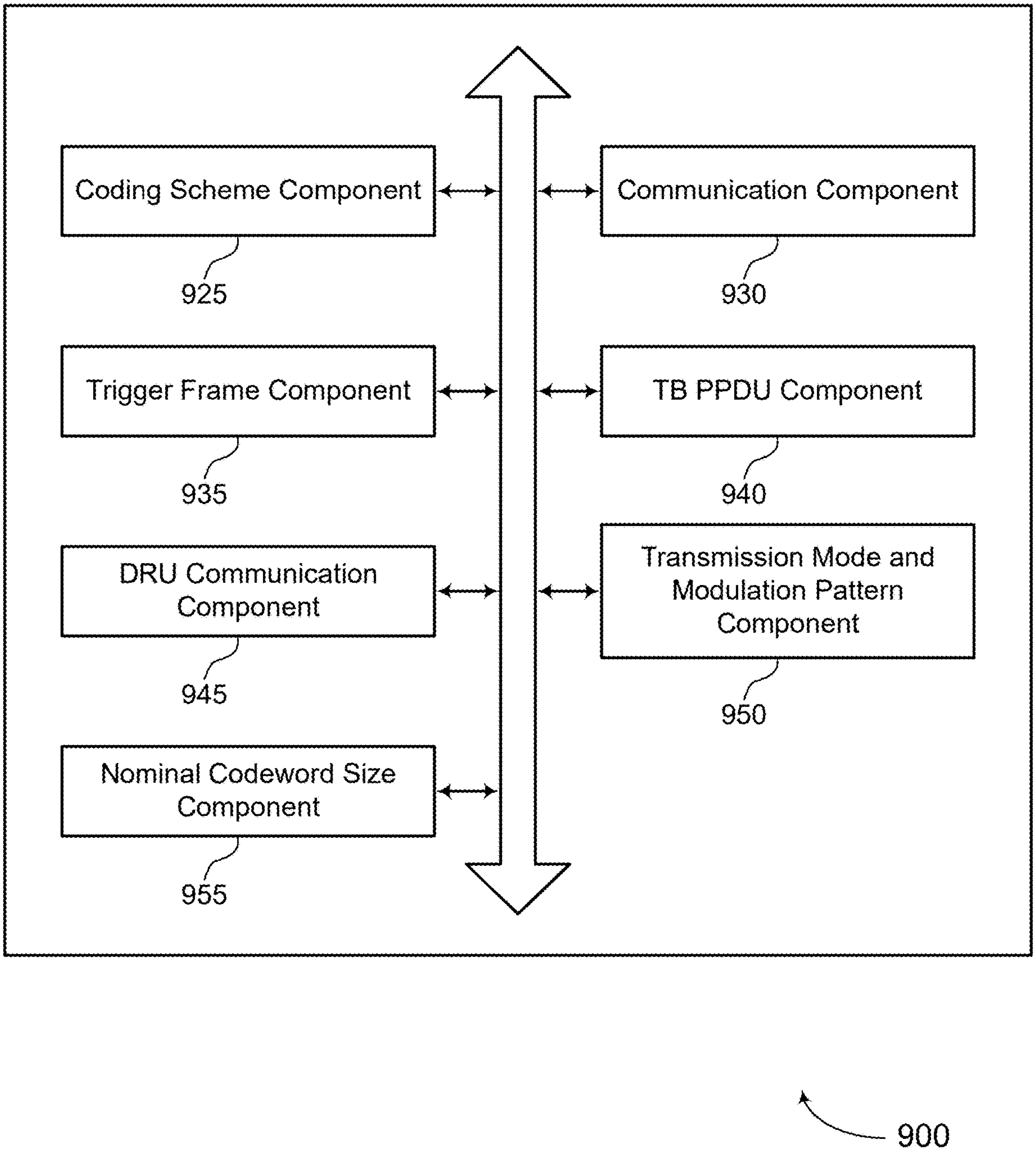
FIG. 9 shows a block diagram of an example wireless communication device that supports UHR signaling design.

FIG. 9 shows a block diagram of an example wireless communication device 900 that supports UHR signaling design. In some examples, the wireless communication device 900 is configured to perform the processes 1100 and 1200 described with reference to FIGS. 11 and 12, respectively. The wireless communication device 900 may include one or more chips, SoCs, chipsets, packages, components, or devices that individually or collectively constitute or include a processing system. The processing system may interface with other components of the wireless communication device 900, and may generally process information (such as inputs or signals) received from such other components and output information (such as outputs or signals) to such other components. In some aspects, an example chip may include a processing system, a first interface to output or transmit information and a second interface to receive or obtain information. For example, the first interface may refer to an interface between the processing system of the chip and a transmission component, such that the wireless communication device 900 may transmit the information output from the chip. In such an example, the second interface may refer to an interface between the processing system of the chip and a reception component, such that the wireless communication device 900 may receive information that is then passed to the processing system. In some such examples, the first interface also may obtain information, such as from the transmission component, and the second interface also may output information, such as to the reception component.

The processing system of the wireless communication device 900 includes processor (or "processing") circuitry in the form of one or multiple processors, microprocessors, processing units (such as central processing units (CPUs), graphics processing units (GPUs), neural processing units (NPUs) (also referred to as neural network processors or deep learning processors (DLPs)), or digital signal processors (DSPs)), processing blocks, application-specific integrated circuits (ASIC), programmable logic devices (PLDs) (such as field programmable gate arrays (FPGAs)), or other discrete gate or transistor logic or circuitry (all of which may be generally referred to herein individually as "processors" or collectively as "the processor" or "the processor circuitry"). One or more of the processors may be individually or collectively configurable or configured to perform various functions or operations described herein. The processing system may further include memory circuitry in the form of one or more memory devices, memory blocks, memory elements or other discrete gate or transistor logic or circuitry, each of which may include tangible storage media such as random-access memory (RAM) or read-only memory (ROM), or combinations thereof (all of which may be generally referred to herein individually as "memories" or collectively as "the memory" or "the memory circuitry"). One or more of the memories may be coupled with one or more of the processors and may individually or collectively store processor-executable code that, when executed by one or more of the processors, may configure one or more of the processors to perform various functions or operations described herein. Additionally, or alternatively, in some examples, one or more of the processors may be preconfigured to perform various functions or operations described herein without requiring configuration by software. The processing system may further include or be coupled with one or more modems (such as a Wi-Fi (for example, IEEE compliant) modem or a cellular (for example, 3GPP 4G LTE, 5G or 6G compliant) modem). In some implementations, one or more processors of the processing system include or implement one or more of the modems. The processing system may further include or be coupled with multiple radios (collectively "the radio"), multiple RF chains or multiple transceivers, each of which may in turn be coupled with one or more of multiple antennas. In some implementations, one or more processors of the processing system include or implement one or more of the radios, RF chains or transceivers.

In some examples, the wireless communication device 900 can be configurable or configured for use in a STA, such as the STA 104 described with reference to FIG. 1. In some other examples, the wireless communication device 900 can be a STA that includes such a processing system and other components including multiple antennas. The wireless communication device 900 is capable of transmitting and receiving wireless communications in the form of, for example, wireless packets. For example, the wireless communication device 900 can be configurable or configured to transmit and receive packets in the form of physical layer PPDUs and MPDUs conforming to one or more of the IEEE 802.11 family of wireless communication protocol standards. In some other examples, the wireless communication device 900 can be configurable or configured to transmit and receive signals and communications conforming to one or more 3GPP specifications including those for 5G NR or 6G. In some examples, the wireless communication device 900 also includes or can be coupled with one or more application processors which may be further coupled with one or more other memories. In some examples, the wireless communication device 900 further includes a user interface (UI) (such as a touchscreen or keypad) and a display, which may be integrated with the UI to form a touchscreen display that is coupled with the processing system. In some examples, the wireless communication device 900 may further include one or more sensors such as, for example, one or more inertial sensors, accelerometers, temperature sensors, pressure sensors, or altitude sensors, that are coupled with the processing system.

The wireless communication device 900 may include a coding scheme component 925, a communication component 930, a trigger frame component 935, a TB PPDU component 940, a dRU communication component 945, a transmission mode and modulation pattern component 950, a nominal codeword size component 955, or any combination thereof. Portions of one or more of the coding scheme component 925, the communication component 930, the trigger frame component 935, the TB PPDU component 940, the dRU communication component 945, the transmission mode and modulation pattern component 950, and the nominal codeword size component 955 may be implemented at least in part in hardware or firmware. For example, one or more of the coding scheme component 925, the communication component 930, the trigger frame component 935, the TB PPDU component 940, the dRU communication component 945, the transmission mode and modulation pattern component 950, and the nominal codeword size component 955 may be implemented at least in part by at least a processor or a modem. In some examples, portions of one or more of the coding scheme component 925, the communication component 930, the trigger frame component 935, the TB PPDU component 940, the dRU communication component 945, the transmission mode and modulation pattern component 950, and the nominal codeword size component 955 may be implemented at least in part by a processor and software in the form of processor-executable code stored in memory.

The wireless communication device 900 may be an example of a first wireless communication device, such as a STA. The wireless communication device 900 may support wireless communication in accordance with examples as disclosed herein. The coding scheme component 925 is configurable or configured to receive, via a subfield of a user info field associated with the first wireless communication device, information indicative of a coding scheme for communication between the first wireless communication device and a second wireless communication device, the subfield including at least two bits supporting at least three coding scheme options. The communication component 930 is configurable or configured to communicate with the second wireless communication device in accordance with the coding scheme.

In some examples, the at least three coding scheme options include a BCC scheme, a 2×LDPC coding scheme, and another LDPC coding scheme.

In some examples, the nominal codeword size component 955 is configurable or configured to select a nominal codeword size for the communicating in accordance with the coding scheme, where the 2×LDPC coding scheme indicates a first nominal codeword size and the other LDPC coding scheme indicates a second nominal codeword size different than the first nominal codeword size. In some examples, the first nominal codeword size for the 2×LDPC coding scheme is 3888. In some such examples, the second nominal codeword size for the other LDPC coding scheme is 648, 1296, or 1944.

In some other examples, the nominal codeword size component 955 is configurable or configured to select a nominal codeword size for the communicating in accordance with the coding scheme, where the 2×LDPC coding scheme indicates a first nominal codeword size selection procedure and the other LDPC coding scheme indicates a second nominal codeword size selection procedure different than the first nominal codeword size selection procedure. In some examples, the first nominal codeword size selection procedure supports selection of the nominal codeword size of 3888. In some such examples, the second nominal codeword size selection procedure supports selection of the nominal codeword size of 648, 1296, or 1944.

In some examples, the transmission mode and modulation pattern component 950 is configurable or configured to receive, via one or more subfields of the user info field, further information indicative of one or both of a transmission mode and a modulation pattern, the one or more subfields including at least the subfield, where the communicating is further in accordance with the one or both of the transmission mode and the modulation pattern. In some examples, the subfield includes at least four bits and supports at least twelve combination options of the coding scheme, the transmission mode, and the modulation pattern. In some other examples, the one or more subfields include a first subfield associated with a flag indicative of an EQM scheme or a UEQM scheme, a second subfield associated with the coding scheme, and a third subfield associated with a beamforming scheme or a UEQM pattern.

In some examples, the transmission mode and modulation pattern component 950 is configurable or configured to receive, via one or more subfields of the user info field, further information indicative of one or more of a quantity of spatial streams, a transmission mode, and a modulation pattern, the one or more subfields being distinct from the subfield, where the transmission mode indicates beamformed transmission, non-beamformed transmission, EQM, UEQM, or any combination thereof, and where the communicating is further in accordance with the one or more of the quantity of spatial streams, the transmission mode, and the modulation pattern. In some examples, the one or more subfields includes a single subfield, the single subfield including at least five bits indicative of the further information. In some other examples, the one or more subfields includes a first subfield and a second subfield, the first subfield including at least two bits indicative of the transmission mode, and the second subfield including at least three bits indicative of the quantity of spatial streams, the modulation pattern, or both.

Additionally, or alternatively, the wireless communication device 900 may support wireless communication in accordance with examples as disclosed herein. The trigger frame component 935 is configurable or configured to receive a trigger frame including a set of multiple user info fields associated with a set of multiple respective wireless communication devices including at least the first wireless communication device, an order of the set of multiple user info fields in the trigger frame indicative of respective global CSD indexes for the set of multiple respective wireless communication devices in accordance with the set of multiple respective wireless communication devices being associated with one or more dRUs. The TB PPDU component 940 is configurable or configured to transmit a TB PPDU in accordance with the trigger frame. The dRU communication component 945 is configurable or configured to transmit a signal via at least one dRU of the one or more dRUs in accordance with a first global CSD index, of the respective global CSD indexes, associated with the first wireless communication device in accordance with the order of the set of multiple user info fields.

In some examples, a first user info field, of the set of multiple user info fields, associated with the first wireless communication device is arranged within the set of multiple user info fields in accordance with the first global CSD index. In some examples, a positional index of the first user info field within non-special user info fields of the set of multiple user info fields is indicative of the first global CSD index of a set of multiple global CSD indexes. In some examples, the first global CSD index corresponds to the positional index of the first user info field within the non-special user info fields modulo a quantity of the set of multiple global CSD indexes.

Figure 10:
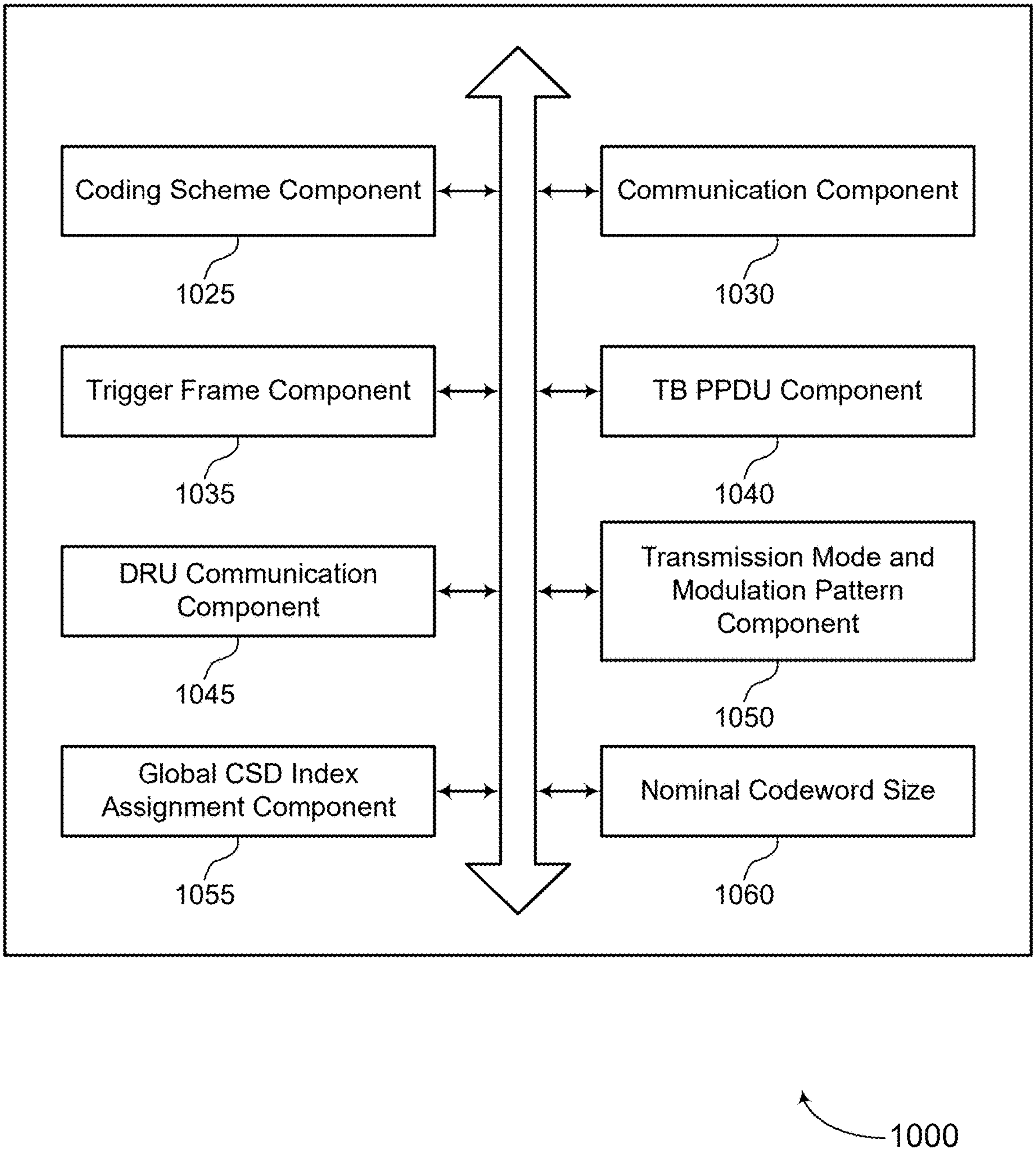
FIG. 10 shows a block diagram of an example wireless communication device that supports UHR signaling design.

FIG. 10 shows a block diagram of an example wireless communication device 1000 that supports UHR signaling design. In some examples, the wireless communication device 1000 is configured to perform the processes 1300 and 1400 described with reference to FIGS. 13 and 14, respectively. The wireless communication device 1000 may include one or more chips, SoCs, chipsets, packages, components or devices that individually or collectively constitute or include a processing system. The processing system may interface with other components of the wireless communication device 1000, and may generally process information (such as inputs or signals) received from such other components and output information (such as outputs or signals) to such other components. In some aspects, an example chip may include a processing system, a first interface to output or transmit information and a second interface to receive or obtain information. For example, the first interface may refer to an interface between the processing system of the chip and a transmission component, such that the wireless communication device 1000 may transmit the information output from the chip. In such an example, the second interface may refer to an interface between the processing system of the chip and a reception component, such that the wireless communication device 1000 may receive information that is then passed to the processing system. In some such examples, the first interface also may obtain information, such as from the transmission component, and the second interface also may output information, such as to the reception component.

The processing system of the wireless communication device 1000 includes processor (or "processing") circuitry in the form of one or multiple processors, microprocessors, processing units (such as CPUs, GPUs, NPUs (also referred to as neural network processors or DLPs), or DSPs), processing blocks, ASIC, PLDs (such as FPGAs), or other discrete gate or transistor logic or circuitry (all of which may be generally referred to herein individually as "processors" or collectively as "the processor" or "the processor circuitry"). One or more of the processors may be individually or collectively configurable or configured to perform various functions or operations described herein. The processing system may further include memory circuitry in the form of one or more memory devices, memory blocks, memory elements or other discrete gate or transistor logic or circuitry, each of which may include tangible storage media such as RAM or ROM, or combinations thereof (all of which may be generally referred to herein individually as "memories" or collectively as "the memory" or "the memory circuitry"). One or more of the memories may be coupled with one or more of the processors and may individually or collectively store processor-executable code that, when executed by one or more of the processors, may configure one or more of the processors to perform various functions or operations described herein. Additionally, or alternatively, in some examples, one or more of the processors may be preconfigured to perform various functions or operations described herein without requiring configuration by software. The processing system may further include or be coupled with one or more modems (such as a Wi-Fi (for example, IEEE compliant) modem or a cellular (for example, 3GPP 4G LTE, 5G or 6G compliant) modem). In some implementations, one or more processors of the processing system include or implement one or more of the modems. The processing system may further include or be coupled with multiple radios (collectively "the radio"), multiple RF chains or multiple transceivers, each of which may in turn be coupled with one or more of multiple antennas. In some implementations, one or more processors of the processing system include or implement one or more of the radios, RF chains or transceivers.

In some examples, the wireless communication device 1000 can be configurable or configured for use in an AP, such as the AP 102 described with reference to FIG. 1. In some other examples, the wireless communication device 1000 can be an AP that includes such a processing system and other components including multiple antennas. The wireless communication device 1000 is capable of transmitting and receiving wireless communications in the form of, for example, wireless packets. For example, the wireless communication device 1000 can be configurable or configured to transmit and receive packets in the form of physical layer PPDUs and MPDUs conforming to one or more of the IEEE 802.11 family of wireless communication protocol standards. In some other examples, the wireless communication device 1000 can be configurable or configured to transmit and receive signals and communications conforming to one or more 3GPP specifications including those for 5G NR or 6G. In some examples, the wireless communication device 1000 also includes or can be coupled with one or more application processors which may be further coupled with one or more other memories. In some examples, the wireless communication device 1000 further includes at least one external network interface coupled with the processing system that enables communication with a core network or backhaul network that enables the wireless communication device 1000 to gain access to external networks including the Internet.

The wireless communication device 1000 may include a coding scheme component 1025, a communication component 1030, a trigger frame component 1035, a TB PPDU component 1040, a dRU communication component 1045, a transmission mode and modulation pattern component 1050, a global CSD index assignment component 1055, a nominal codeword size 1060, or any combination thereof. Portions of one or more of the coding scheme component 1025, the communication component 1030, the trigger frame component 1035, the TB PPDU component 1040, the dRU communication component 1045, the transmission mode and modulation pattern component 1050, the global CSD index assignment component 1055, and the nominal codeword size 1060 may be implemented at least in part in hardware or firmware. For example, one or more of the coding scheme component 1025, the communication component 1030, the trigger frame component 1035, the TB PPDU component 1040, the dRU communication component 1045, the transmission mode and modulation pattern component 1050, the global CSD index assignment component 1055, and the nominal codeword size 1060 may be implemented at least in part by at least a processor or a modem. In some examples, portions of one or more of the coding scheme component 1025, the communication component 1030, the trigger frame component 1035, the TB PPDU component 1040, the dRU communication component 1045, the transmission mode and modulation pattern component 1050, the global CSD index assignment component 1055, and the nominal codeword size 1060 may be implemented at least in part by a processor and software in the form of processor-executable code stored in memory.

The wireless communication device 1000 may be an example of a first wireless communication devices, such as an AP. The wireless communication device 1000 may support wireless communication in accordance with examples as disclosed herein. The coding scheme component 1025 is configurable or configured to transmit, via a subfield of a user info field associated with a second wireless communication device, information indicative of a coding scheme for communication between the first wireless communication device and the second wireless communication device, the subfield including at least two bits supporting at least three coding scheme options. The communication component 1030 is configurable or configured to communicate with the second wireless communication device in accordance with the coding scheme.

In some examples, the at least three coding scheme options include a BCC scheme, a 2×LDPC coding scheme, and another LDPC coding scheme.

In some examples, the nominal codeword size 1060 is configurable or configured to select a nominal codeword size for the communicating in accordance with the coding scheme, where the 2×LDPC coding scheme indicates a first nominal codeword size and the other LDPC coding scheme indicates a second nominal codeword size different than the first nominal codeword size. In some examples, the first nominal codeword size for the 2×LDPC coding scheme is 3888. In some such examples, the second nominal codeword size for the other LDPC coding scheme is 648, 1296, or 1944.

In some other examples, the nominal codeword size 1060 is configurable or configured to select a nominal codeword size for the communicating in accordance with the coding scheme, where the 2×LDPC coding scheme indicates a first nominal codeword size selection procedure and the other LDPC coding scheme indicates a second nominal codeword size selection procedure different than the first nominal codeword size selection procedure. In some examples, the first nominal codeword size selection procedure supports selection of the nominal codeword size of 3888. In some such examples, the second nominal codeword size selection procedure supports selection of the nominal codeword size of 648, 1296, or 1944.

In some examples, the coding scheme component 1025 is configurable or configured to transmit, via a second subfield of a second user info field associated with a third wireless communication device, second information indicative of a second coding scheme for communication between the first wireless communication device and the third wireless communication device, the second subfield including one bit supporting two coding scheme options in accordance with an RU size for the communication between the first wireless communication device and the third wireless communication device satisfying a threshold RU size.

In some examples, the transmission mode and modulation pattern component 1050 is configurable or configured to transmit, via one or more subfields of the user info field, further information indicative of one or both of a transmission mode and a modulation pattern, the one or more subfields including at least the subfield, where the communicating is further in accordance with the one or both of the transmission mode and the modulation pattern. In some examples, the subfield includes at least four bits and supports at least twelve combination options of the coding scheme, the transmission mode, and the modulation pattern. In some other examples, the one or more subfields include a first subfield associated with a flag indicative of an EQM scheme or a UEQM scheme, a second subfield associated with the coding scheme, and a third subfield associated with a beamforming scheme or a UEQM pattern.

In some examples, the transmission mode and modulation pattern component 1050 is configurable or configured to transmit, via one or more subfields of the user info field, further information indicative of one or more of a quantity of spatial streams, a transmission mode, and a modulation pattern, the one or more subfields being distinct from the subfield, where the transmission mode indicates beamformed transmission, non-beamformed transmission, EQM, UEQM, or any combination thereof, and where the communicating is further in accordance with the one or more of the quantity of spatial streams, the transmission mode, and the modulation pattern. In some examples, the one or more subfields includes a single subfield, the single subfield including at least five bits indicative of the further information. In some other examples, the one or more subfields includes a first subfield and a second subfield, the first subfield including at least two bits indicative of the transmission mode, and the second subfield including at least three bits indicative of the quantity of spatial streams, the modulation pattern, or both.

Additionally, or alternatively, the wireless communication device 1000 may support wireless communication in accordance with examples as disclosed herein. The trigger frame component 1035 is configurable or configured to transmit a trigger frame including a set of multiple user info fields associated with a set of multiple respective wireless communication devices, an order of the set of multiple user info fields in the trigger frame indicative of respective global CSD indexes for the set of multiple respective wireless communication devices in accordance with the set of multiple respective wireless communication devices being associated with one or more dRUs. The TB PPDU component 1040 is configurable or configured to receive a set of multiple TB PPDUs corresponding to the set of multiple respective wireless communication devices in accordance with the trigger frame. The dRU communication component 1045 is configurable or configured to receive one or more signals from the set of multiple respective wireless communication devices via the one or more dRUs in accordance with the respective global CSD indexes.

In some examples, the global CSD index assignment component 1055 is configurable or configured to assign a first global CSD index to a second wireless communication device of the set of multiple respective wireless communication devices, where a first user info field, of the set of multiple user info fields, associated with the second wireless communication device is arranged in accordance with the first global CSD index.

In some examples, a positional index of the first user info field within non-special user info fields of the set of multiple user info fields is indicative of the first global CSD index of a set of multiple global CSD indexes. In some examples, the first global CSD index corresponds to the positional index of the first user info field within the non-special user info fields modulo a quantity of the set of multiple global CSD indexes.

In some examples, the global CSD index assignment component 1055 is configurable or configured to assign the respective global CSD indexes to the set of multiple respective wireless communication devices in accordance with wireless communication devices associated with same distributed subbands.

Figure 11:
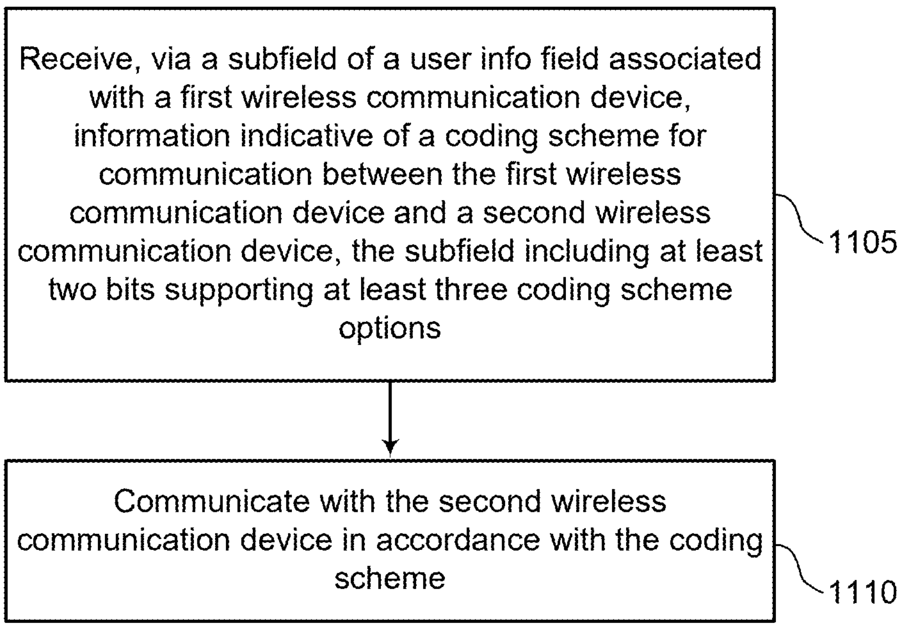
FIGS. 11-14 show flowcharts illustrating example processes performable by or at a first wireless communication device that supports UHR signaling design.

FIG. 11 shows a flowchart illustrating an example process 1100 performable by or at a first wireless communication device that supports UHR signaling design. The operations of the process 1100 may be implemented by a first wireless communication device or its components. For example, the process 1100 may be performed by a wireless communication device, such as the wireless communication device 900 described with reference to FIG. 9, operating as or within a wireless STA. In some examples, the process 1100 may be performed by a wireless STA, such as one of the STAs 104 described with reference to FIG. 1.

In some examples, in 1105, the first wireless communication device may receive, via a subfield of a user info field associated with the first wireless communication device, information indicative of a coding scheme for communication between the first wireless communication device and a second wireless communication device. The subfield may include at least two bits supporting at least three coding scheme options. The operations of 1105 may be performed in accordance with examples as disclosed herein. In some implementations, aspects of the operations of 1105 may be performed by a coding scheme component 925 as described with reference to FIG. 9.

In some examples, in 1110, the first wireless communication device may communicate with the second wireless communication device in accordance with the coding scheme. The operations of 1110 may be performed in accordance with examples as disclosed herein. In some implementations, aspects of the operations of 1110 may be performed by a communication component 930 as described with reference to FIG. 9.

Figure 12:
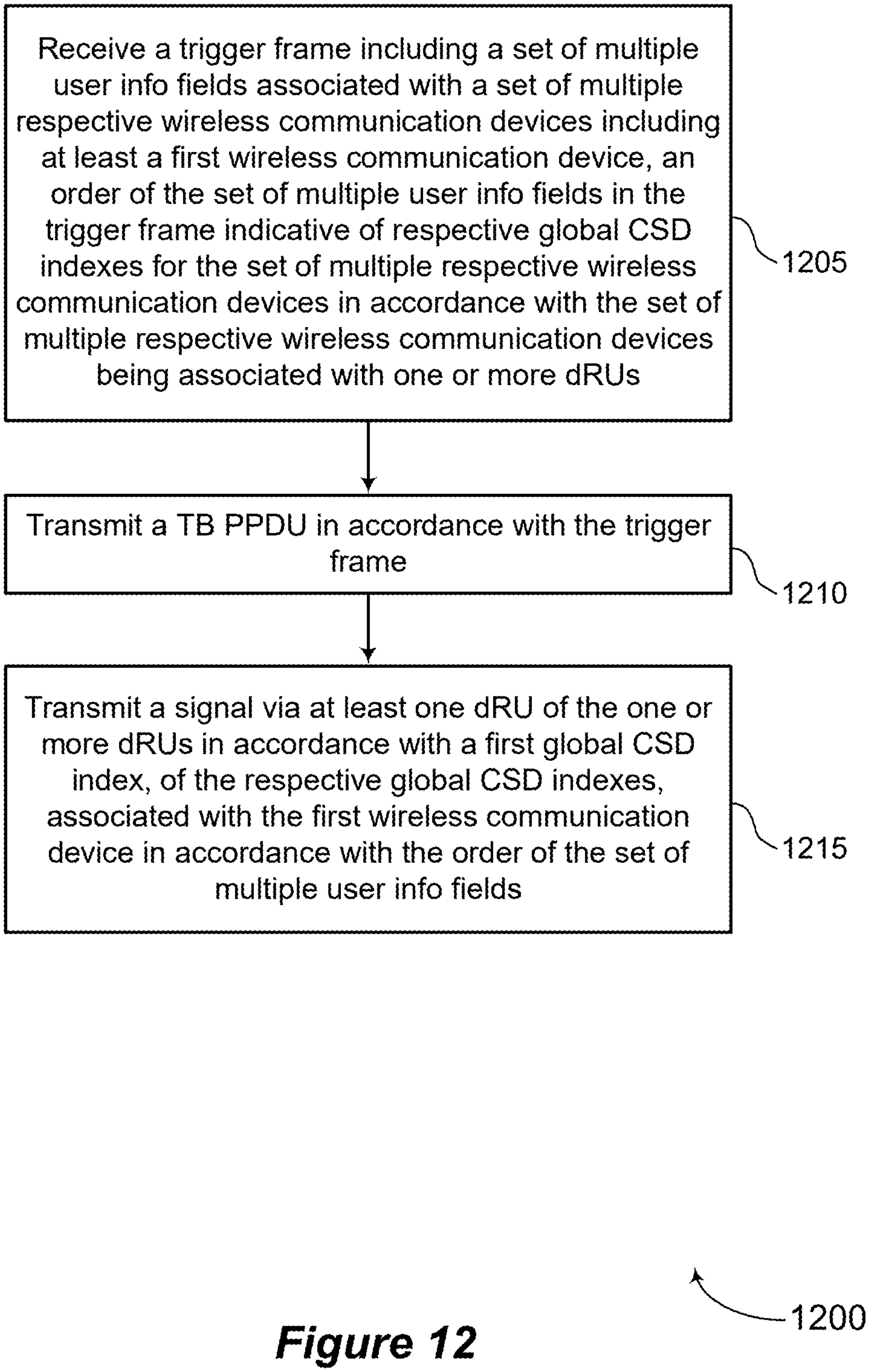

FIG. 12 shows a flowchart illustrating an example process 1200 performable by or at a first wireless communication device that supports UHR signaling design. The operations of the process 1200 may be implemented by a first wireless communication device or its components. For example, the process 1200 may be performed by a wireless communication device, such as the wireless communication device 900 described with reference to FIG. 9, operating as or within a wireless STA. In some examples, the process 1200 may be performed by a wireless STA, such as one of the STAs 104 described with reference to FIG. 1.

In some examples, in 1205, the first wireless communication device may receive a trigger frame including a set of multiple user info fields associated with a set of multiple respective wireless communication devices including at least the first wireless communication device. An order of the set of multiple user info fields in the trigger frame may be indicative of respective global CSD indexes for the set of multiple respective wireless communication devices in accordance with the set of multiple respective wireless communication devices being associated with one or more dRUs. The operations of 1205 may be performed in accordance with examples as disclosed herein. In some implementations, aspects of the operations of 1205 may be performed by a trigger frame component 935 as described with reference to FIG. 9.

In some examples, in 1210, the first wireless communication device may transmit a TB PPDU in accordance with the trigger frame. The operations of 1210 may be performed in accordance with examples as disclosed herein. In some implementations, aspects of the operations of 1210 may be performed by a TB PPDU component 940 as described with reference to FIG. 9.

In some examples, in 1215, the first wireless communication device may transmit a signal via at least one dRU of the one or more dRUs in accordance with a first global CSD index, of the respective global CSD indexes, associated with the first wireless communication device in accordance with the order of the set of multiple user info fields. The operations of 1215 may be performed in accordance with examples as disclosed herein. In some implementations, aspects of the operations of 1215 may be performed by a dRU communication component 945 as described with reference to FIG. 9.

Figure 13:
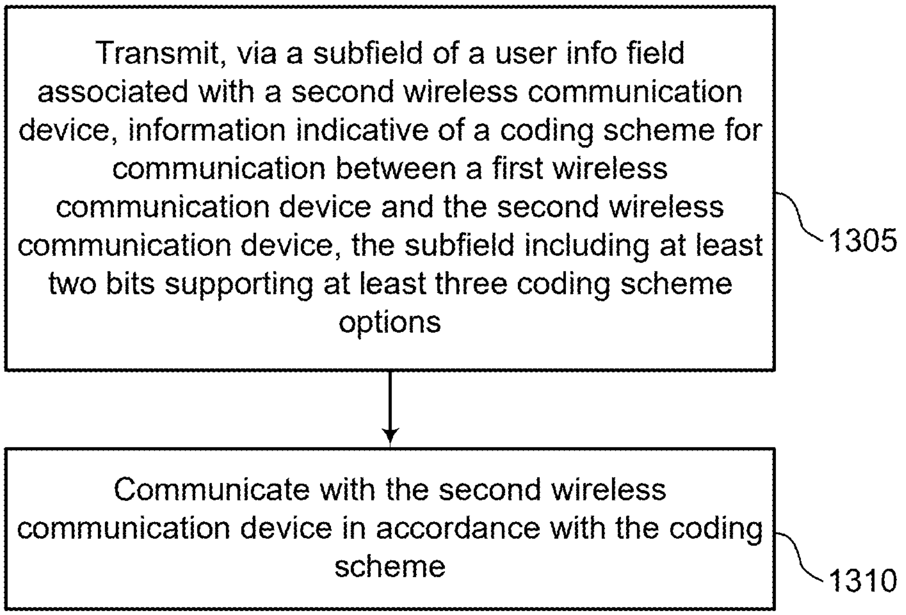

FIG. 13 shows a flowchart illustrating an example process 1300 performable by or at a first wireless communication device that supports UHR signaling design. The operations of the process 1300 may be implemented by a first wireless communication device or its components. For example, the process 1300 may be performed by a wireless communication device, such as the wireless communication device 1000 described with reference to FIG. 10, operating as or within a wireless AP. In some examples, the process 1300 may be performed by a wireless AP, such as one of the APs 102 described with reference to FIG. 1.

In some examples, in 1305, the first wireless communication device may transmit, via a subfield of a user info field associated with a second wireless communication device, information indicative of a coding scheme for communication between the first wireless communication device and the second wireless communication device. The subfield may include at least two bits supporting at least three coding scheme options. The operations of 1305 may be performed in accordance with examples as disclosed herein. In some implementations, aspects of the operations of 1305 may be performed by a coding scheme component 1025 as described with reference to FIG. 10.

In some examples, in 1310, the first wireless communication device may communicate with the second wireless communication device in accordance with the coding scheme. The operations of 1310 may be performed in accordance with examples as disclosed herein. In some implementations, aspects of the operations of 1310 may be performed by a communication component 1030 as described with reference to FIG. 10.

Figure 14:
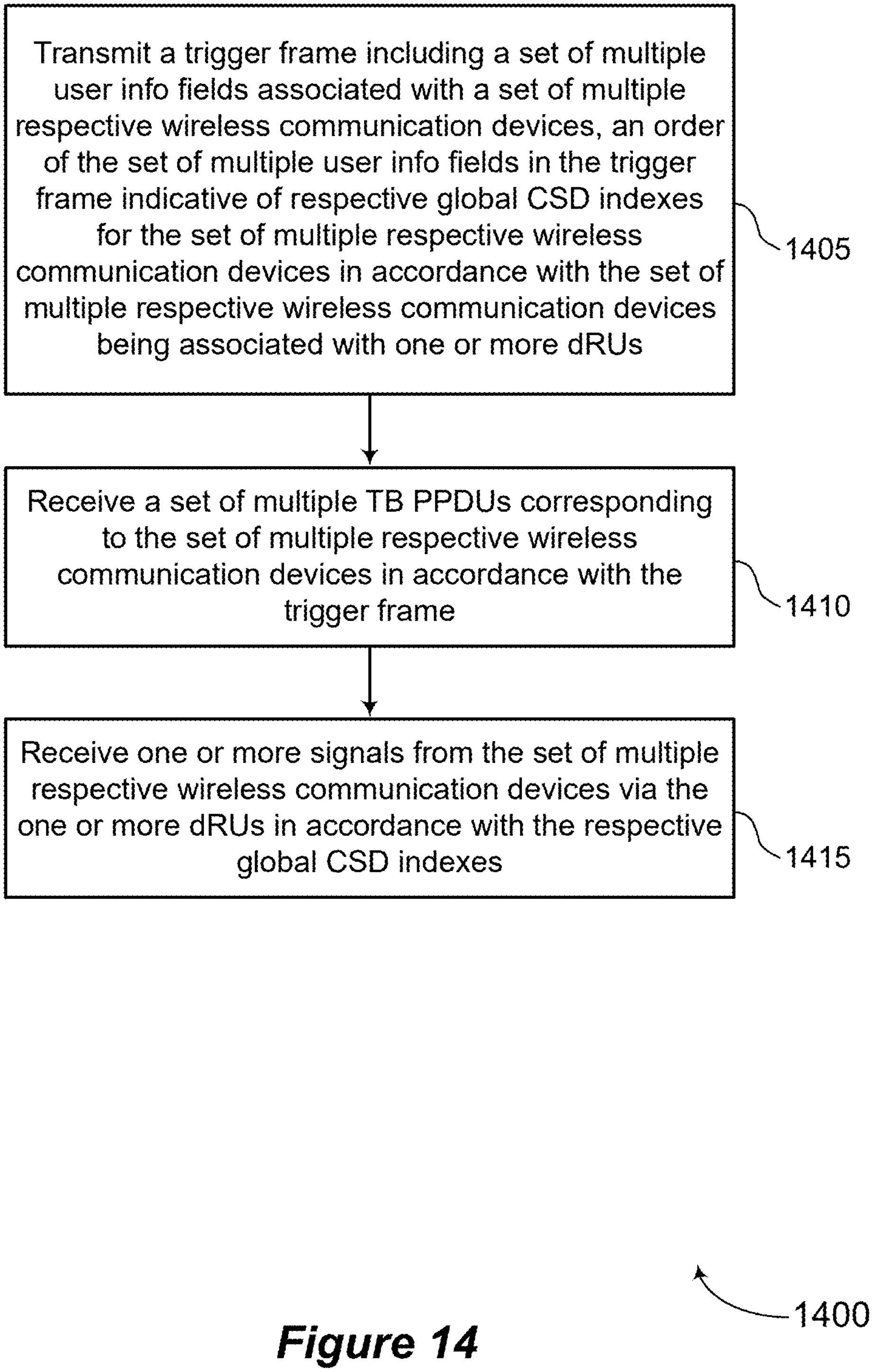

FIG. 14 shows a flowchart illustrating an example process 1400 performable by or at a first wireless communication device that supports UHR signaling design. The operations of the process 1400 may be implemented by a first wireless communication device or its components. For example, the process 1400 may be performed by a wireless communication device, such as the wireless communication device 1000 described with reference to FIG. 10, operating as or within a wireless AP. In some examples, the process 1400 may be performed by a wireless AP, such as one of the APs 102 described with reference to FIG. 1.

In some examples, in 1405, the first wireless communication device may transmit a trigger frame including a set of multiple user info fields associated with a set of multiple respective wireless communication devices. An order of the set of multiple user info fields in the trigger frame may be indicative of respective global CSD indexes for the set of multiple respective wireless communication devices in accordance with the set of multiple respective wireless communication devices being associated with one or more dRUs. The operations of 1405 may be performed in accordance with examples as disclosed herein. In some implementations, aspects of the operations of 1405 may be performed by a trigger frame component 1035 as described with reference to FIG. 10.

In some examples, in 1410, the first wireless communication device may receive a set of multiple TB PPDUs corresponding to the set of multiple respective wireless communication devices in accordance with the trigger frame. The operations of 1410 may be performed in accordance with examples as disclosed herein. In some implementations, aspects of the operations of 1410 may be performed by a TB PPDU component 1040 as described with reference to FIG. 10.

In some examples, in 1415, the first wireless communication device may receive one or more signals from the set of multiple respective wireless communication devices via the one or more dRUs in accordance with the respective global CSD indexes. The operations of 1415 may be performed in accordance with examples as disclosed herein. In some implementations, aspects of the operations of 1415 may be performed by a dRU communication component 1045 as described with reference to FIG. 10.

Figure 15:
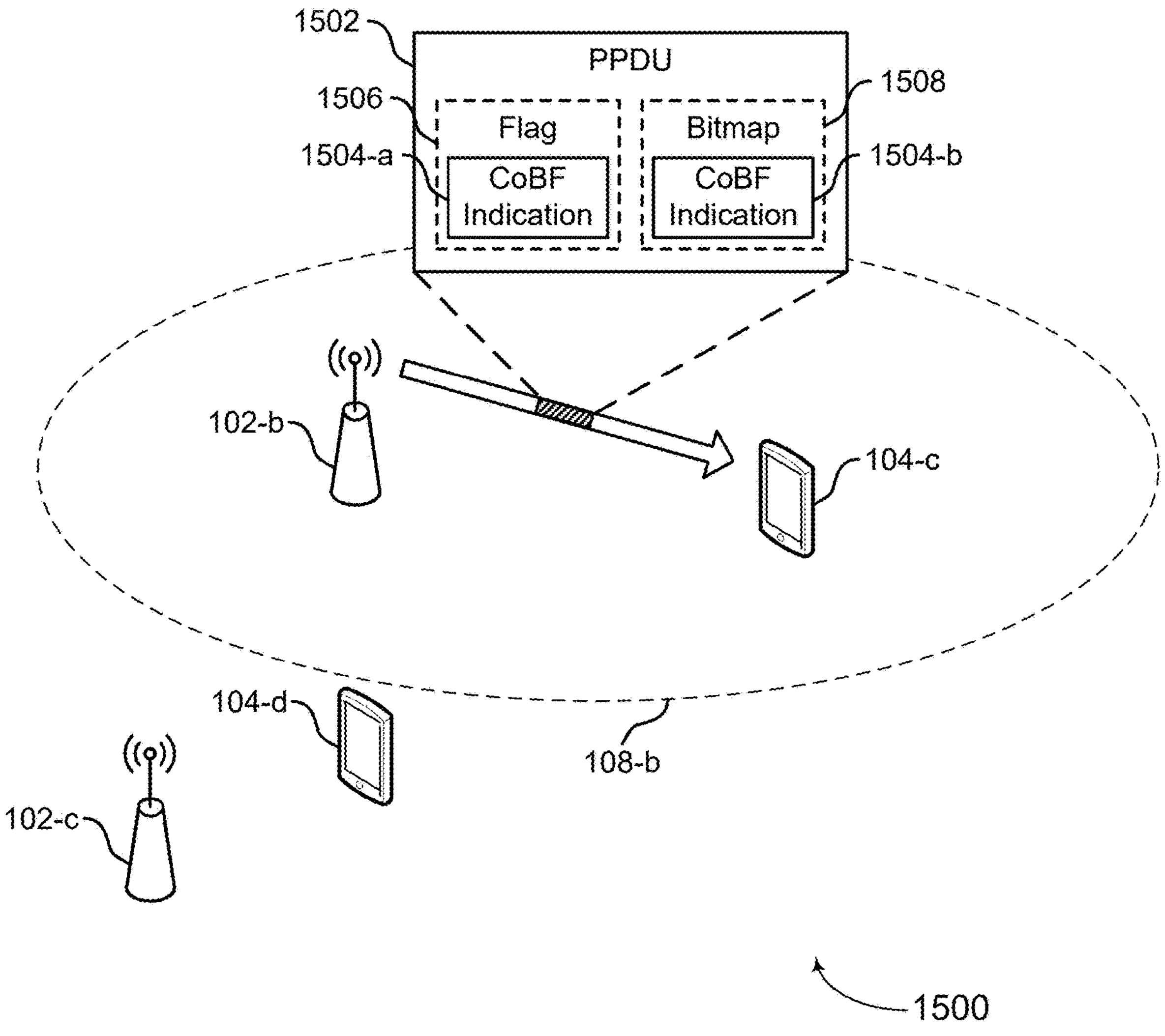
FIG. 15 shows an example of a wireless communications system that supports UHR signaling design.

FIG. 15 shows an example of a wireless communications system 1500 that supports UHR signaling design. The wireless communications system 1500 may be an example of a wireless communication network 100 or a wireless communications system 700 as described with reference to FIGS. 1 and 7. The wireless communications system 700 may include an AP 102-*b*, which may be an example of an AP 102 described with reference to FIG. 1, and a STA 104-*c*, which may be an example of a STA 104 described with reference to FIG. 1. The AP 102-*b* may serve a coverage area 108-*b*, which may be an example of a coverage area 108 described with reference to FIG. 1. The AP 102-*b* may transmit a PPDU 1502 to the STA 104-*c*. The PPDU 1502 may indicate coordinated beamforming (CoBF) information for the STA 104-*c*.

The PPDU 1502 may include a CoBF indication that indicates whether or not the PPDU 1502 (or another PPDU or set of PPDUs) participates in CoBF transmission. For CoBF transmission, signals (such as data streams) for a STA 104-*c* may be transmitted by a single AP 102, such as the AP 102-*b*. However, the coverage areas of neighboring APs, such as a neighboring AP 102-*c*, may overlap, and signals transmitted by the AP 102-*b* may reach STAs in OBSSs associated with neighboring APs as OBSS signals. CoBF supports neighboring APs transmitting concurrently while minimizing or avoiding interference, which may result in more opportunities for spatial reuse. More specifically, using CoBF techniques, the AP 102-*b* may beamform signals to in-BSS STAs 104, such as the STA 104-*c*, while forming nulls in the directions of STAs in OBSSs, such as a STA 104-*d*, such that any signals received at an OBSS STA are of sufficiently low power to limit the interference at the STA (for example, the STA 104-*d*). To accomplish this, an inter-BSS coordination set may be defined between the neighboring APs (such as between the AP 102-*b* and the AP 102-*c*), which may include identifiers of all APs and STAs participating in CoBF transmissions. In some implementations, the OBSS STA 104-*d* may be within the coverage area 108-*b* but served by a different (neighboring) AP 102-*c*, or the OBSS STA 104-*d* may be outside the coverage area 108-*b* and served by the different (neighboring) AP 102-*c*.

To support CoBF signaling, the AP 102-*b* may generate the PPDU 1502 to include the CoBF indication. In some examples, the PPDU 1502 may include a 1-bit CoBF indication. For example, the PPDU 1502 may include a flag 1506 (such as a 1-bit field or subfield) including the CoBF indication 1504-*a*. The flag 1506 may indicate whether the entire or partial PPDU bandwidth of the PPDU 1502 participates in CoBF transmission. For example, a first bit value (such as {1}) may indicate that the PPDU bandwidth participates in CoBF transmission, and a second bit value (such as {0}) may indicate that the PPDU bandwidth does not participate in CoBF transmission (for example, instead participates in uncoordinated beamforming transmission).

In some other examples, the PPDU 1502 may include a bitmap 1508 including the CoBF indication 1504-*b*. The bitmap 1508 may include a set of multiple bits that provide relatively finer frequency granularity for the CoBF indication 1504-*b*. For example, different bits in the bitmap 1508 may indicate whether different frequency portions or subbands participate in CoBF transmission. In some implementations, the bitmap 1508 may be an example of a 2-bit bitmap. Each bit of the 2-bit bitmap may correspond to a respective half of the PPDU bandwidth (for example, a respective 160 MHz subband or some other bandwidth portion). In some other implementations, the bitmap 1508 may be an example of a 4-bit bitmap. Each bit of the 4-bit bitmap may correspond to a respective quarter of the PPDU bandwidth (for example, a respective 80 MHz subband or some other bandwidth portion). Other bitmap sizes may be used to support other frequency granularities for CoBF indication. Each bit in the bitmap 1508 may indicate whether a corresponding frequency subband of the PPDU 1502 participates in CoBF transmission (for example, with a {1} bit value) or not (for example, with a {0} bit value).

In some implementations, different types of transmissions may use different CoBF indication formats. In some examples, a non-OFDMA transmission may include a 1-bit CoBF indication, such as a flag 1506. Additionally, or alternatively, an OFDMA transmission may include a multi-bit CoBF indication, such as a bitmap 1508.

In some implementations, the CoBF indication may be located in a U-SIG field or in a common field in a UHR-SIG of a UHR MU PPDU. In some examples, the one or more bits used for CoBF signaling for UHR may be repurposed from EHT. For example, the one or more bits used for CoBF indication may have been used as Disregard bits in a U-SIG or a common field in an EHT-SIG or may have been used as any other bits or fields (for example, now removed) from the U-SIG or the common field in the EHT-SIG.

The AP 102-*b* may generate the PPDU 1502 and may determine the CoBF indication. The AP 102-*b* may transmit the PPDU 1502 including the CoBF indication and may communicate using CoBF techniques via one or more frequency bands (for example, subbands or frequency resources) in accordance with the CoBF indication. The STA 104-*c* may receive the PPDU 1502 and may determine in which frequency bands (for example, subbands or frequency resources) to use CoBF techniques based on the CoBF indication in the PPDU 1502. The STA 104-*c* may communicate using CoBF techniques via one or more frequency bands (for example, subbands or frequency resources) in accordance with the CoBF indication. The CoBF techniques may use beamforming to minimize, or otherwise reduce, interference from the communications between the AP 102-*b* and the STA 104-*c* to neighboring APs, such as the AP 102-*c*, to OBSS STAs, such as the STA 104-*d*, or both, improving signaling reliability and coordination between devices.

Implementation examples are described in the following numbered clauses:

Aspect 1: A method for wireless communication at a first wireless communication device, comprising: receiving, via a subfield of a user info field associated with the first wireless communication device, information indicative of a coding scheme for communication between the first wireless communication device and a second wireless communication device, the subfield comprising at least two bits supporting at least three coding scheme options; and communicating with the second wireless communication device in accordance with the coding scheme.

Aspect 2: The method of aspect 1, wherein the at least three coding scheme options comprise a BCC scheme, a 2×LDPC coding scheme, and another LDPC coding scheme.

Aspect 3: The method of aspect 2, further comprising: selecting a nominal codeword size for the communicating in accordance with the coding scheme, wherein the 2×LDPC coding scheme indicates a first nominal codeword size and the other LDPC coding scheme indicates a second nominal codeword size different than the first nominal codeword size.

Aspect 4: The method of aspect 3, wherein the first nominal codeword size for the 2×LDPC coding scheme is 3888; and the second nominal codeword size for the other LDPC coding scheme is 648, 1296, or 1944.

Aspect 5: The method of aspect 2, further comprising: selecting a nominal codeword size for the communicating in accordance with the coding scheme, wherein the 2×LDPC coding scheme indicates a first nominal codeword size selection procedure and the other LDPC coding scheme indicates a second nominal codeword size selection procedure different than the first nominal codeword size selection procedure.

Aspect 6: The method of aspect 5, wherein the first nominal codeword size selection procedure supports selection of the nominal codeword size of 3888; and the second nominal codeword size selection procedure supports selection of the nominal codeword size of 648, 1296, or 1944.

Aspect 7: The method of any of aspects 1-6, further comprising: receiving, via one or more subfields of the user info field, further information indicative of one or both of a transmission mode and a modulation pattern, the one or more subfields comprising at least the subfield, wherein the communicating is further in accordance with the one or both of the transmission mode and the modulation pattern.

Aspect 8: The method of aspect 7, wherein the subfield comprises at least four bits and supports at least twelve combination options of the coding scheme, the transmission mode, and the modulation pattern.

Aspect 9: The method of aspect 7, wherein the one or more subfields comprises: a first subfield associated with a flag indicative of an EQM scheme or a UEQM scheme, a second subfield associated with the coding scheme, and a third subfield associated with a beamforming scheme or a UEQM pattern.

Aspect 10: The method of any of aspects 1-9, further comprising: receiving, via one or more subfields of the user info field, further information indicative of one or more of a quantity of spatial streams, a transmission mode, and a modulation pattern, the one or more subfields being distinct from the subfield, wherein the transmission mode indicates beamformed transmission, non-beamformed transmission, EQM, UEQM, or any combination thereof, and wherein the communicating is further in accordance with the one or more of the quantity of spatial streams, the transmission mode, and the modulation pattern.

Aspect 11: The method of aspect 10, wherein the one or more subfields comprises a single subfield, the single subfield comprising at least five bits indicative of the further information.

Aspect 12: The method of aspect 10, wherein the one or more subfields comprises a first subfield and a second subfield, the first subfield comprising at least two bits indicative of the transmission mode, and the second subfield comprising at least three bits indicative of the quantity of spatial streams, the modulation pattern, or both.

Aspect 13: A method for wireless communication at a first wireless communication device, comprising: receiving a trigger frame comprising a plurality of user info fields associated with a plurality of respective wireless communication devices comprising at least the first wireless communication device, an order of the plurality of user info fields in the trigger frame indicative of respective global CSD indexes for the plurality of respective wireless communication devices in accordance with the plurality of respective wireless communication devices being associated with one or more dRUs; transmitting a TB PPDU in accordance with the trigger frame; and transmitting a signal via at least one dRU of the one or more dRUs in accordance with a first global CSD index, of the respective global CSD indexes, associated with the first wireless communication device in accordance with the order of the plurality of user info fields.

Aspect 14: The method of aspect 13, wherein a combination of the order of the plurality of user info fields in the trigger frame and one or both of distribution bandwidth information or a value of a global CSD information subfield is indicative of the respective global CSD indexes for the plurality of respective wireless communication devices.

Aspect 15: The method of either of aspects 13 or 14, wherein a first user info field, of the plurality of user info fields, associated with the first wireless communication device is arranged within the plurality of user info fields in accordance with the first global CSD index.

Aspect 16: The method of aspect 15, wherein a positional index of the first user info field within non-special user info fields of the plurality of user info fields is indicative of the first global CSD index of a plurality of global CSD indexes.

Aspect 17: The method of aspect 16, wherein the first global CSD index corresponds to the positional index of the first user info field within the non-special user info fields modulo a quantity of the plurality of global CSD indexes.

Aspect 18: A method for wireless communication at a first wireless communication device, comprising: transmitting, via a subfield of a user info field associated with a second wireless communication device, information indicative of a coding scheme for communication between the first wireless communication device and the second wireless communication device, the subfield comprising at least two bits supporting at least three coding scheme options; and communicating with the second wireless communication device in accordance with the coding scheme.

Aspect 19: The method of aspect 18, wherein the at least three coding scheme options comprise a BCC scheme, a 2×LDPC coding scheme, and another LDPC coding scheme.

Aspect 20: The method of aspect 19, further comprising: selecting a nominal codeword size for the communicating in accordance with the coding scheme, wherein the 2×LDPC coding scheme indicates a first nominal codeword size and the other LDPC coding scheme indicates a second nominal codeword size different than the first nominal codeword size.

Aspect 21: The method of aspect 20, wherein the first nominal codeword size for the 2×LDPC coding scheme is 3888; and the second nominal codeword size for the other LDPC coding scheme is 648, 1296, or 1944.

Aspect 22: The method of aspect 19, further comprising: selecting a nominal codeword size for the communicating in accordance with the coding scheme, wherein the 2×LDPC coding scheme indicates a first nominal codeword size selection procedure and the other LDPC coding scheme indicates a second nominal codeword size selection procedure different than the first nominal codeword size selection procedure.

Aspect 23: The method of aspect 22, wherein the first nominal codeword size selection procedure supports selection of the nominal codeword size of 3888; and the second nominal codeword size selection procedure supports selection of the nominal codeword size of 648, 1296, or 1944.

Aspect 24: The method of any of aspects 18-23, further comprising: transmitting, via a second subfield of a second user info field associated with a third wireless communication device, second information indicative of a second coding scheme for communication between the first wireless communication device and the third wireless communication device, the second subfield comprising one bit supporting two coding scheme options in accordance with an RU size for the communication between the first wireless communication device and the third wireless communication device satisfying a threshold RU size.

Aspect 25: The method of any of aspects 18-24, further comprising: transmitting, via one or more subfields of the user info field, further information indicative of one or both of a transmission mode and a modulation pattern, the one or more subfields comprising at least the subfield, wherein the communicating is further in accordance with the one or both of the transmission mode and the modulation pattern.

Aspect 26: The method of aspect 25, wherein the subfield comprises at least four bits and supports at least twelve combination options of the coding scheme, the transmission mode, and the modulation pattern.

Aspect 27: The method of aspect 25, wherein the one or more subfields comprises: a first subfield associated with a flag indicative of an EQM scheme or an UEQM scheme, a second subfield associated with the coding scheme, and a third subfield associated with a beamforming scheme or a UEQM pattern.

Aspect 28: The method of any of aspects 18-27, further comprising: transmitting, via one or more subfields of the user info field, further information indicative of one or more of a quantity of spatial streams, a transmission mode, and a modulation pattern, the one or more subfields being distinct from the subfield, wherein the transmission mode indicates beamformed transmission, non-beamformed transmission, EQM, UEQM, or any combination thereof, and wherein the communicating is further in accordance with the one or more of the quantity of spatial streams, the transmission mode, and the modulation pattern.

Aspect 29: The method of aspect 28, wherein the one or more subfields comprises a single subfield, the single subfield comprising at least five bits indicative of the further information.

Aspect 30: The method of aspect 28, wherein the one or more subfields comprises a first subfield and a second subfield, the first subfield comprising at least two bits indicative of the transmission mode, and the second subfield comprising at least three bits indicative of the quantity of spatial streams, the modulation pattern, or both.

Aspect 31: A method for wireless communication at a first wireless communication device, comprising: transmitting a trigger frame comprising a plurality of user info fields associated with a plurality of respective wireless communication devices, an order of the plurality of user info fields in the trigger frame indicative of respective global CSD indexes for the plurality of respective wireless communication devices in accordance with the plurality of respective wireless communication devices being associated with one or more dRUs; receiving a plurality of TB PPDUs corresponding to the plurality of respective wireless communication devices in accordance with the trigger frame; and receiving one or more signals from the plurality of respective wireless communication devices via the one or more dRUs in accordance with the respective global CSD indexes.

Aspect 32: The method of aspect 31, wherein a combination of the order of the plurality of user info fields in the trigger frame and one or both of distribution bandwidth information or a value of a global CSD information subfield is indicative of the respective global CSD indexes for the plurality of respective wireless communication devices.

Aspect 33: The method of either of aspects 31 or 32, further comprising: assigning a first global CSD index to a second wireless communication device of the plurality of respective wireless communication devices, wherein a first user info field, of the plurality of user info fields, associated with the second wireless communication device is arranged in accordance with the first global CSD index.

Aspect 34: The method of aspect 33, wherein a positional index of the first user info field within non-special user info fields of the plurality of user info fields is indicative of the first global CSD index of a plurality of global CSD indexes.

Aspect 35: The method of aspect 34, wherein the first global CSD index corresponds to the positional index of the first user info field within the non-special user info fields modulo a quantity of the plurality of global CSD indexes.

Aspect 36: The method of any of aspects 31-35, further comprising: assigning the respective global CSD indexes to the plurality of respective wireless communication devices in accordance with wireless communication devices associated with same distributed subbands.

Aspect 37: A first wireless communication device, comprising a processing system that includes processor circuitry and memory circuitry that stores code, the processing system configured to cause the first wireless communication device to perform a method of any of aspects 1-12.

Aspect 38: A first wireless communication device for wireless communication, comprising at least one means for performing a method of any of aspects 1-12.

Aspect 39: A non-transitory computer-readable medium storing code for wireless communication, the code comprising instructions executable by one or more processors to perform a method of any of aspects 1-12.

Aspect 40: A first wireless communication device, comprising a processing system that includes processor circuitry and memory circuitry that stores code, the processing system configured to cause the first wireless communication device to perform a method of any of aspects 13-17.

Aspect 41: A first wireless communication device for wireless communication, comprising at least one means for performing a method of any of aspects 13-17.

Aspect 42: A non-transitory computer-readable medium storing code for wireless communication, the code comprising instructions executable by one or more processors to perform a method of any of aspects 13-17.

Aspect 43: A first wireless communication device, comprising a processing system that includes processor circuitry and memory circuitry that stores code, the processing system configured to cause the first wireless communication device to perform a method of any of aspects 18-30.

Aspect 44: A first wireless communication device for wireless communication, comprising at least one means for performing a method of any of aspects 18-30.

Aspect 45: A non-transitory computer-readable medium storing code for wireless communication, the code comprising instructions executable by one or more processors to perform a method of any of aspects 18-30.

Aspect 46: A first wireless communication device, comprising a processing system that includes processor circuitry and memory circuitry that stores code, the processing system configured to cause the first wireless communication device to perform a method of any of aspects 31-36.

Aspect 47: A first wireless communication device for wireless communication, comprising at least one means for performing a method of any of aspects 31-36.

Aspect 48: A non-transitory computer-readable medium storing code for wireless communication, the code comprising instructions executable by one or more processors to perform a method of any of aspects 31-36.

As used herein, the term "determine" or "determining" encompasses a wide variety of actions and, therefore, "determining" can include calculating, computing, processing, deriving, estimating, investigating, looking up (such as via looking up in a table, a database, or another data structure), inferring, ascertaining, or measuring, among other possibilities. Also, "determining" can include receiving (such as receiving information), accessing (such as accessing data stored in memory) or transmitting (such as transmitting information), among other possibilities. Additionally, "determining" can include resolving, selecting, obtaining, choosing, establishing and other such similar actions.

As used herein, a phrase referring to "at least one of" or "one or more of" a list of items refers to any combination of those items, including single members. As an example, "at least one of: a, b, or c" is intended to cover: a, b, c, a-b, a-c, b-c, and a-b-c. As used herein, "or" is intended to be interpreted in the inclusive sense, unless otherwise explicitly indicated. For example, “a or b” may include a only, b only, or a combination of a and b. Furthermore, as used herein, a phrase referring to “a” or “an” element refers to one or more of such elements acting individually or collectively to perform the recited function(s). Additionally, a “set” refers to one or more items, and a “subset” refers to less than a whole set, but non-empty.

As used herein, “based on” is intended to be interpreted in the inclusive sense, unless otherwise explicitly indicated. For example, “based on” may be used interchangeably with “based at least in part on,” “associated with,” “in association with,” or “in accordance with” unless otherwise explicitly indicated. Specifically, unless a phrase refers to “based on only ‘a,’” or the equivalent in context, whatever it is that is “based on ‘a,’” or “based at least in part on ‘a,’” may be based on “a” alone or based on a combination of “a” and one or more other factors, conditions, or information.

The various illustrative components, logic, logical blocks, modules, circuits, operations, and algorithm processes described in connection with the examples disclosed herein may be implemented as electronic hardware, firmware, software, or combinations of hardware, firmware, or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the examples described in this disclosure may be readily apparent to persons having ordinary skill in the art, and the generic principles defined herein may be applied to other examples without departing from the spirit or scope of this disclosure. Thus, the claims are not intended to be limited to the examples shown herein, but are to be accorded the widest scope consistent with this disclosure, the principles and the novel features disclosed herein.

Additionally, various features that are described in this specification in the context of separate examples also can be implemented in combination in a single implementation. Conversely, various features that are described in the context of a single implementation also can be implemented in multiple examples separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the examples described above should not be understood as requiring such separation in all examples, and it should be understood that the described program components and systems can generally be integrated together in a single software product or packaged into multiple software products.

What is claimed is:

1. A first wireless communication device, comprising:

a processing system that includes processor circuitry and memory circuitry that stores code, the processing system configured to cause the first wireless communication device to:

receive, via a plurality of subfields of a user information field associated with communication between the first wireless communication device and a second wireless communication device, wherein the plurality of subfields include:

a first subfield indicative of a coding scheme, a second subfield indicative of one of an equal modulation (EQM) scheme or an unequal modulation (UEQM) scheme, and a third subfield indicative of one of a beamforming scheme in accordance with the second subfield indicating an EQM scheme or an UEQM pattern in accordance with the second subfield indicating the UEQM scheme; and communicate with the second wireless communication device in accordance with the plurality of subfields.

2. The first wireless communication device of claim 1, wherein the first subfield indicates a binary convolutional coding (BCC) scheme, a 2× low-density parity-check (LDPC) coding scheme, or another LDPC coding scheme.

3. The first wireless communication device of claim 2, wherein the processing system is further configured to cause the first wireless communication device to select a nominal codeword size for the communicating in accordance with the coding scheme, wherein the 2×LDPC coding scheme indicates a first nominal codeword size and the other LDPC coding scheme indicates a second nominal codeword size different than the first nominal codeword size.

4. The first wireless communication device of claim 3, wherein:

the first nominal codeword size for the 2×LDPC coding scheme is 3888; and the second nominal codeword size for the other LDPC coding scheme is 648, 1296, or 1944.

5. The first wireless communication device of claim 2, wherein the processing system is further configured to cause the first wireless communication device to select a nominal codeword size for the communicating in accordance with the coding scheme, wherein the 2×LDPC coding scheme indicates a first nominal codeword size selection procedure and the other LDPC coding scheme indicates a second nominal codeword size selection procedure different than the first nominal codeword size selection procedure.

6. The first wireless communication device of claim 5, wherein:

the first nominal codeword size selection procedure supports selection of the nominal codeword size of 3888; and the second nominal codeword size selection procedure supports selection of the nominal codeword size of 648, 1296, or 1944.

7. The first wireless communication device of claim 1, wherein the plurality of subfields include at least four bits and supports at least twelve combination options of the coding scheme, the one of the EQM scheme or the UEQM scheme, and the one of the beamforming scheme or the UEQM pattern.

8. The first wireless communication device of claim 1, wherein the plurality of subfields further include information indicative of a quantity of spatial streams for the communicating.

9. A first wireless communication device, comprising:

a processing system that includes processor circuitry and memory circuitry that stores code, the processing system configured to cause the first wireless communication device to:

transmit, via a plurality of subfields of a user information field associated with communication between the first wireless communication device and a second wireless communication device, wherein the plurality of subfields include:

a first subfield indicative of a coding scheme, a second subfield indicative of one of an equal modulation (EQM) scheme or an unequal modulation (UEQM) scheme, and a third subfield indicative of one of a beamforming scheme in accordance with the second subfield indicating an EQM scheme or an UEQM pattern in accordance with the second subfield indicating the UEQM scheme; and communicate with the second wireless communication device in accordance with the plurality of subfields.

10. The first wireless communication device of claim 9, wherein the first subfield indicates a binary convolutional coding (BCC) scheme, a 2× low-density parity-check (LDPC) coding scheme, or another LDPC coding scheme.

11. The first wireless communication device of claim 10, wherein the processing system is further configured to cause the first wireless communication device to select a nominal codeword size for the communicating in accordance with the coding scheme, wherein the 2×LDPC coding scheme indicates a first nominal codeword size and the other LDPC coding scheme indicates a second nominal codeword size different than the first nominal codeword size.

12. The first wireless communication device of claim 10, wherein the processing system is further configured to cause the first wireless communication device to select a nominal codeword size for the communicating in accordance with the coding scheme, wherein the 2×LDPC coding scheme indicates a first nominal codeword size selection procedure and the other LDPC coding scheme indicates a second nominal codeword size selection procedure different than the first nominal codeword size selection procedure.

13. The first wireless communication device of claim 9, wherein the processing system is further configured to cause the first wireless communication device to transmit, via a second subfield of a second user information field associated with a third wireless communication device, second information indicative of a second coding scheme for communication between the first wireless communication device and the third wireless communication device, the second subfield comprising one bit supporting two coding scheme options in accordance with a resource unit (RU) size for the communication between the first wireless communication device and the third wireless communication device satisfying a threshold RU size.

14. The first wireless communication device of claim 9, wherein the plurality of subfields further include information indicative of a quantity of spatial streams for the communicating.

* * * * *